United States Patent
Komai et al.

(10) Patent No.: US 10,638,067 B2
(45) Date of Patent: Apr. 28, 2020

(54) SOLID STATE IMAGE SENSOR AND IMAGE-CAPTURING DEVICE

(71) Applicant: NIKON CORPORATION, Tokyo (JP)

(72) Inventors: Atsushi Komai, Tokorozawa (JP); Yoshiyuki Watanabe, Kawasaki (JP); Osamu Saruwatari, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 198 days.

(21) Appl. No.: 15/033,328

(22) PCT Filed: Nov. 18, 2014

(86) PCT No.: PCT/JP2014/080533
§ 371 (c)(1),
(2) Date: Sep. 2, 2016

(87) PCT Pub. No.: WO2015/072575
PCT Pub. Date: May 21, 2015

(65) Prior Publication Data
US 2016/0373668 A1 Dec. 22, 2016

(30) Foreign Application Priority Data

Nov. 18, 2013 (JP) .................. 2013-238067
Nov. 19, 2013 (JP) .................. 2013-238439
(Continued)

(51) Int. Cl.
*H04N 3/14* (2006.01)
*H04N 5/335* (2011.01)
(Continued)

(52) U.S. Cl.
CPC ..... *H04N 5/3559* (2013.01); *H01L 27/14603* (2013.01); *H01L 27/14612* (2013.01);
(Continued)

(58) Field of Classification Search
None
See application file for complete search history.

(56) References Cited

U.S. PATENT DOCUMENTS

2006/0274176 A1 12/2006 Guidash
2008/0067325 A1* 3/2008 Tani .............. H04N 5/374
250/208.1
(Continued)

FOREIGN PATENT DOCUMENTS

JP 2008-104150 A 5/2008
JP 2008-546313 A 12/2008
(Continued)

OTHER PUBLICATIONS

Feb. 3, 2015 Search Report issued in International Application No. PCT/JP2014/080533.
(Continued)

*Primary Examiner* — Stephen P Coleman
(74) *Attorney, Agent, or Firm* — Oliff PLC

(57) ABSTRACT

A solid-state image sensor includes: a plurality of pixels, each including a photoelectric conversion unit and a charge accumulating unit that accumulates an electric charge from the photoelectric conversion unit; and a connection unit that includes a plurality of linking units each of which electrically connects the charge accumulating units of two adjacent pixels among the plurality of pixels.

27 Claims, 50 Drawing Sheets

(30) Foreign Application Priority Data

Nov. 19, 2013 (JP) ................................ 2013-238442
Jul. 3, 2014 (JP) ................................ 2014-137755

(51) Int. Cl.
| | |
|---|---|
| *H04N 5/355* | (2011.01) |
| *H04N 5/347* | (2011.01) |
| *H04N 5/3745* | (2011.01) |
| *H01L 27/146* | (2006.01) |
| *H04N 5/232* | (2006.01) |
| *H04N 5/378* | (2011.01) |

(52) U.S. Cl.
CPC .. *H01L 27/14636* (2013.01); *H01L 27/14641* (2013.01); *H01L 27/14643* (2013.01); *H04N 5/347* (2013.01); *H04N 5/355* (2013.01); *H04N 5/3745* (2013.01); *H04N 5/23245* (2013.01); *H04N 5/378* (2013.01)

(56) References Cited

U.S. PATENT DOCUMENTS

| | | |
|---|---|---|
| 2010/0182465 A1 | 7/2010 | Okita |
| 2010/0225795 A1 | 9/2010 | Suzuki et al. |
| 2012/0025280 A1 | 2/2012 | Narui |
| 2012/0312964 A1 | 12/2012 | Yamashita et al. |
| 2013/0021510 A1 | 1/2013 | Sambonsugi |
| 2013/0050554 A1 | 2/2013 | Mabuchi |
| 2013/0194468 A1 | 8/2013 | Okita |
| 2013/0248939 A1 | 9/2013 | Sakai et al. |
| 2014/0192242 A1 | 7/2014 | Totsuka |
| 2015/0070547 A1 | 3/2015 | Dai et al. |

FOREIGN PATENT DOCUMENTS

| | | |
|---|---|---|
| JP | 2009-033316 A | 2/2009 |
| JP | 2010-193437 A | 9/2010 |
| JP | 2010-212769 A | 9/2010 |
| JP | 2011-066506 A | 3/2011 |
| JP | 2012-015923 A | 1/2012 |
| JP | 2012-257028 A | 12/2012 |
| JP | 2013-042479 A | 2/2013 |
| JP | 2013-157883 A | 8/2013 |
| JP | 2013-197989 A | 9/2013 |
| JP | 2014-135548 A | 7/2014 |
| JP | 2017/004985 A | 1/2017 |
| JP | 2017-004985 A | 1/2017 |
| KR | 10-2010-0100694 A | 9/2010 |
| WO | 2015/068315 A1 | 5/2015 |

OTHER PUBLICATIONS

Aug. 14, 2017 Office Action issued in Korean Application No. 10-2016-7013976.
Dec. 12, 2017 Office Action issued in Japanese Patent Application No. 2013-238067.
Mar. 13, 2018 Office Action issued in Japanese Patent Application No. 2014-137755.
Jun. 22, 2017 Office Action issued in European Patent Application No. 14861956.2.
Jun. 20, 2018 Office Action issued in Chinese Patent Application No. 201480073346.2.
Nov. 13, 2018 Office Action issued in Korean Application No. 10-2018-7026629.
Jul. 16, 2019 Office Action issued in Japanese Patent Application No. 2018-139722.
Sep. 30, 2019 Office Action issued in U.S. Appl. No. 16/562,995.
Oct. 16, 2019 Office Action issued in Korean Patent Application No. 2019-7024743.
Nov. 26, 2019 Office Action issued in Japanese Patent Application No. 2018-188940.
Feb. 20, 2020 Extended Search Report issued in European Patent Application No. 19205570.5.

* cited by examiner

SOLID STATE IMAGE SENSOR AND IMAGE-CAPTURING DEVICE

TECHNICAL FIELD

The present invention relates to a solid-state image sensor and an image-capturing device.

BACKGROUND ART

PTL 1 cited below discloses a solid-state image sensor comprising a plurality of pixels, with at least two pixels each comprising (a) a photo detector, (b) a charge/voltage conversion region forming a floating capacitance area, (c) an input unit for an amplifier and a linking switch via which the charge/voltage conversion capacitances are selectively connected.

CITATION LIST

Patent Literature

PTL 1: Japanese Translation of PCT International Application Publication No. JP-T-2008-546313

SUMMARY OF INVENTION

Technical Problem

At the solid-state image sensor in the related art cited above, the number of saturation electrons in the combined charge/voltage conversion capacitances as a whole can be increased by turning on the linking switch and thus connecting the charge/voltage conversion capacitances. This means that the dynamic range of the solid-state image sensor can be expanded.

In addition, when the charge/voltage conversion region is separated from another charge/voltage conversion region by turning off the linking switch at the solid-state image sensor in the related art, the capacitance of the charge/voltage conversion region (charge/voltage conversion capacitance) is reduced and thus the charge/voltage conversion coefficient increases, resulting in a higher SN ratio for high-sensitivity read.

However, the SN ratio cannot be greatly raised for high-sensitivity read even by turning off the linking switch at the solid-state image sensor in the related art.

An object of the present invention, having been conceived in order to address the issue discussed above, is to provide a solid-state image sensor assuring a greater dynamic range and a better SN ratio for high-sensitivity read and an image-capturing device that includes the solid-state image sensor.

Solution to Problem

According to the 1st aspect of the present invention, a solid-state image sensor comprises: a plurality of pixels, each including a photoelectric conversion unit and a charge accumulating unit that accumulates an electric charge from the photoelectric conversion unit; and a connection unit that includes a plurality of linking units each of which electrically connects the charge accumulating units of two adjacent pixels among the plurality of pixels.

According to the 2nd aspect of the present invention, in the solid-state image sensor according to the 1st aspect, it is preferred that the connection unit includes a plurality of switches and a connection region; and the plurality of switches are each disposed between the charge accumulating unit and the connection region.

According to the 3rd aspect of the present invention, in the solid-state image sensor according to the 2nd aspect, it is preferred that the plurality of switches includes at least two switches allocated to each linking unit.

According to the 4th aspect of the present invention, in the solid-state image sensor according to the 2nd or the 3rd aspect, it is preferred that the solid-state image sensor further comprises: a control unit that assumes a first operation mode for controlling the plurality of switches so that a switch in on state among the plurality of switches does not enter a state of electrical connection to the charge accumulating unit of one pixel of the two adjacent pixels, and a second operation mode for controlling the plurality of switches so that a predetermined number of at least one switch in the on state, among the plurality of switches, achieves a state of electrical connection to the charge accumulating unit of the one pixel.

According to the 5th aspect of the present invention, in the solid-state image sensor according to the 2nd or the 3rd aspect, it is preferred that the charge accumulating units of three or more pixels among the plurality of pixels are connected in a string via at least two sets of switches among the plurality of switches.

According to the 6th aspect of the present invention, in the solid-state image sensor according to the 5th aspect, it is preferred that the solid-state image sensor further comprises: a control unit that assumes a first operation mode for controlling the plurality of switches so that a switch in on state among the plurality of switches does not enter a state of electrical connection to the charge accumulating unit of one pixel of the three or more pixels, and a second operation mode for controlling the plurality of switches so that a predetermined number of at least one switch in the on state, among the plurality of switches, achieves a state of electrical connection to the charge accumulating unit of the one pixel.

According to the 7th aspect of the present invention, in the solid-state image sensor according to any one of the 2nd through 6th aspects, it is preferred that the plurality of pixels each include a plurality of the photoelectric conversion units and a plurality of transfer switches that each transfer an electric charge from one of the plurality of photoelectric conversion units to the connection region.

According to the 8th aspect of the present invention, in the solid-state image sensor according to the 7th aspect, it is preferred that the transfer switches are each constituted with a transistor; in each pixel among the plurality of pixels, one diffusion area, formed between one photoelectric conversion unit among the plurality of photoelectric conversion units and another photoelectric conversion unit among the plurality of photoelectric conversion units, is used both as a diffusion area to function as a source or a drain of one transfer switch among the plurality of transfer switches and as a diffusion area to function as a source or a drain of another switch among the plurality of transfer switches; in each pixel among the plurality of pixels, a gate electrode of the one transfer switch is disposed on a side of the one diffusion area where the one photoelectric conversion unit is located; and in each pixel among the plurality of pixels, a gate electrode of the other transfer switch is disposed on a side of the one diffusion area where the other photoelectric conversion unit is located.

According to the 9th aspect of the present invention, in the solid-state image sensor according to the 7th or the 8th aspect, it is preferred that two photoelectric conversion units and two transfer switches are disposed as the plurality of photoelectric conversion units and the plurality of transfer switches.

According to the 10th aspect of the present invention, in the solid-state image sensor according to the 9th aspect, it is preferred that the plurality of switches includes two switches allocated to each linking unit; and the two switches are one switch and another switch having an offset therebetween along a predetermined direction, with an extent thereof being greater than a pitch at which the plurality of photoelectric conversion units, are disposed along the predetermined direction and is less than twice the pitch.

According to the 11th aspect of the present invention, in the solid-state image sensor according to any one of the 2nd through 10th aspects, it is preferred that the plurality of switches includes two switches allocated to each linking unit; and a capacitance formed between the connection region located between the two switches and a reference electric potential in the off state takes a value within a range of ±20% relative to a value of a capacitance formed between the charge accumulating unit and the reference electric potential when the two switches are in the off state.

According to the 12th aspect of the present invention, in the solid-state image sensor according to any one of the 2nd through 11th aspects, it is preferred that the plurality of switches includes two switches allocated to each linking unit; and at least one of following conditions is satisfied: that a width of at least part of a wiring forming the connection region between the two switches in the off state is greater than the width of another wiring in the pixel, that a MOS capacitance is connected to the connection region and that a diffusion capacitance that is not part of the plurality of switches, is connected to the connection region.

According to the 13th aspect of the present invention, in the solid-state image sensor according to the 1st aspect, it is preferred that the connection unit includes a plurality of switches and a connection region; and the plurality of switches includes first switches via each of which the charge accumulating unit and the connection region are electrically connected with each other and disconnected from each other and a second switches via each of which the connection region and another connection region are electrically connected with each other and disconnected from each other.

According to the 14th aspect of the present invention, in the solid-state image sensor according to the 13th aspect, it is preferred that the second switches connect a plurality of connection regions in a string.

According to the 15th aspect of the present invention, in the solid-state image sensor according to the 13th or the 14th aspect, it is preferred that the solid-state image sensor further comprises: a control unit that assumes a first operation mode for controlling the plurality of switches so that p (p is an integer equal to or greater than 1) first switches in on state, among the plurality of first switches, q (q is an integer greater than p) second switches in the on state, among the plurality of second switches, achieve a state of electrical connection to the charge accumulating unit of one pixel among the plurality of pixels.

According to the 16th aspect of the present invention, in the solid-state image sensor according to the 15th aspect, it is preferred that p is 1.

According to the 17th aspect of the present invention, in the solid-state image sensor according to any one of the 13th through 16th aspects, it is preferred that the control unit assumes a second operation mode for controlling the first switch in one pixel among the plurality of pixels, so that the first switch, via which the charge accumulating unit in the one pixel and the connection region corresponding to the charge accumulating unit are electrically connected with each other and disconnected from each other, is turned off.

According to the 18th aspect of the present invention, in the solid-state image sensor according to any one of the 13th through 17th aspects, it is preferred that the plurality of pixels each include a plurality of photoelectric conversion units and a plurality of transfer switches that each transfer an electric charge from one of the plurality of photoelectric conversion units to the connection region.

According to the 19th aspect of the present invention, in the solid-state image sensor according to the 1st aspect, it is preferred that the connection unit includes a plurality of switches and connection regions; the pixels each include a reset switch that resets a voltage at the connection region to a reference voltage; and the reset switch is connected with one switch among the plurality of switches via the connection region.

According to the 20th aspect of the present invention, in the solid-state image sensor according to the 19th aspect, it is preferred that the plurality of switches includes first switches via each of which the charge accumulating unit and a connection region are electrically connected with each other and disconnected from each other and a second switches via each of which the connection region and another connection region are electrically connected with each other and disconnected from each other; and the one switch is the first switch.

According to the 21st aspect of the present invention, in the solid-state image sensor according to the 20th aspect, it is preferred that the plurality of pixels each include a plurality of photoelectric conversion units and a plurality of transfer switches that each transfer an electric charge from one of the plurality of photoelectric conversion units to the connection region.

According to the 22nd aspect of the present invention, in the solid-state image sensor according to the 20th or the 21st aspect, it is preferred that the solid-state image sensor further comprises: a control unit that assumes a first operation mode for controlling the first switch, via which the charge accumulating unit of one pixel of the two pixels and the connection region corresponding to the charge accumulating unit are electrically connected with each other and disconnected from each other, and the reset switch, which resets the voltage at the connection region corresponding to the charge accumulating unit in the one pixel to the reference voltage, so that the first switch is temporarily turned on only when an electric potential at the charge accumulating unit in the one pixel is reset and that the reset switch is turned on at least in case of the electric potential being reset.

According to the 23rd aspect of the present invention, in the solid-state image sensor according to the 22nd aspect, it is preferred that the control unit assumes a second operation mode for controlling the first switch, the second switch and the reset switch so that the first switch, via which the charge accumulating unit in the one pixel and the corresponding connection region are electrically connected with each other and disconnected from each other is turned on, the second switch is turned off and the reset switch that resets the voltage at the connection region corresponding to the charge accumulating unit in the one pixel to the reference voltage is turned on only when the electric potential at the charge accumulating unit in the one pixel is reset.

According to the 24th aspect of the present invention, in the solid-state image sensor according to the 22nd or the 23rd aspect, it is preferred that the control unit assumes a third operation mode for controlling the first switch via which the charge accumulating unit in the one pixel and the corresponding connection region are electrically connected with each other and disconnected from each other, the second switch, and the reset switch that resets the voltage at the connection region corresponding to the charge accumulating unit in the one pixel to the reference voltage, so that the first switch is turned on, the second switch is turned on and the reset switch is turned on only when the electric potential that the charge accumulating unit in the one pixel is reset.

According to the 25th aspect of the present invention, in the solid-state image sensor according to the 20th or the 21st aspect, it is preferred that the plurality of switches includes at least three first switches, via each of which the charge accumulating unit in each of three or more pixels among the plurality of pixels and the connection region among three or more connection regions each corresponding to the charge accumulating unit in each of the three or more pixels are electrically connected with each other and disconnected from each other; the three or more connection regions are connected in a string via a plurality of second switches; and the solid-state image sensor includes three or more reset switches each used to reset the voltage at each of the three or more connection regions to the reference voltage.

According to the 26th aspect of the present invention, in the solid-state image sensor according to the 25th aspect, it is preferred that the solid-state image sensor further comprises: a control unit that assumes a first operation mode for controlling the first switch via which the charge accumulating unit in one pixel among the three or more pixels and the connection region corresponding to the charge accumulating unit are electrically connected with each other and disconnected from each other, and the reset switch which resets the voltage at the connection region corresponding to the charge accumulating unit in the one pixel among the three or more pixels to the reference voltage, so that the first switch is temporarily turned on only when an electric potential at the charge accumulating unit in the one pixel among the three or more pixels is reset, and that the reset switch is turned on at least in case that the electric potential at the charge accumulating unit in the one pixel among the three or more pixels is reset.

According to the 27th aspect of the present invention, in the solid-state image sensor according to the 22nd aspect, it is preferred that the control unit assumes a second operation mode for controlling the first switch, via which the charge accumulating unit in one pixel among the three or more pixels and the connection region corresponding to the charge accumulating unit are electrically connected with each other and disconnected from each other, the second switches and the reset switch that resets the voltage at the connection region corresponding to the charge accumulating unit in the one pixel among the three or more pixels to the reference voltage, so that the first switch is turned on, the second switches are turned off and the reset switch is turned on only when the electric potential at the charge accumulating unit in the one pixel among the three or more pixels is reset.

According to the 28th aspect of the present invention, in the solid-state image sensor according to the 26th or the 27th aspect, it is preferred that the control unit assumes a third operation mode for controlling the first switch, via which the charge accumulating unit in one pixel among the three or more pixels and the connection region corresponding to the charge accumulating unit are electrically connected with each other and disconnected from each other, the second switch, and the reset switch that resets the voltage at the connection region corresponding to the charge accumulating unit in the one pixel among the three or more pixels to the reference voltage, so that the first switch is turned on, the second switches are turned on and the reset switch is turned on only when the electric potential at the charge accumulating unit in the one pixel among the three or more pixels is reset.

According to the 29th aspect of the present invention, in the solid-state image sensor according to the 1st aspect, it is preferred that the connection unit includes a plurality of switches and a connection region; and the pixels each include the connection region and a dummy wiring that forms a parasitic capacitance.

According to the 30th aspect of the present invention, in the solid-state image sensor according to the 29th aspect, it is preferred that the solid-state image sensor further comprises: a reset switch that resets a voltage at the charge accumulating unit in each pixel to a reference voltage. The dummy wiring is disposed so as to run substantially parallel to a wiring constituting a linking unit and one end of the dummy wiring is electrically connected to the reset switch.

According to the 31st aspect of the present invention, in the solid-state image sensor according to the 29th aspect, it is preferred that the solid-state image sensor further comprises: a reset switch that resets a voltage at the charge accumulating unit in each pixel to a reference voltage. In case that the voltage at the charge accumulating unit in the pixel is reset to the reference voltage, the reset switch and one switch among the switches, which is electrically connected to the charge accumulating unit, are temporarily turned on.

According to the 32nd aspect of the present invention, a solid-state image sensor comprises: a plurality of pixel blocks each including one photoelectric conversion unit, a node and one transfer switch disposed in correspondence to the one photoelectric conversion unit to transfer an electric charge from the photoelectric conversion unit to the node; an electrical connection unit disposed between the node in one pixel block among the pixel blocks and the node in another pixel block; and a plurality of linking switches allocated to each pixel block, which are disposed within the connection unit.

According to the 33rd aspect of the present invention, a solid-state image sensor comprises: a plurality of pixel blocks each including a plurality of photoelectric conversion units, a node and a plurality of transfer switches each disposed in correspondence to one of the plurality of photoelectric conversion units, which transfer electric charges from the plurality of photoelectric conversion units to the node; and a plurality of linking switches disposed between the nodes of two adjacent pixel blocks.

According to the 34th aspect of the present invention, a solid-state image sensor comprises: a plurality of pixel blocks each including one photoelectric conversion unit, a first node and one transfer switch disposed in correspondence to the one photoelectric conversion unit to transfer an electric charge from the photoelectric conversion unit to the first node; two second nodes, one corresponding to the first node in one pixel block among the pixel blocks and another corresponding to the first node in another pixel block; two first switch units via each of which the first node in the one pixel block and one of the two second nodes are electrically connected with each other and disconnected from each other and the other pixel block and another one of the two second nodes are electrically connected with each other and disconnected from each other; and a second switch unit via which the two second nodes are electrically connected with each other and disconnected from each other.

According to the 35th aspect of the present invention, a solid-state image sensor comprises: a plurality of pixel blocks each including one photoelectric conversion unit, a first node and one transfer switch disposed in correspondence to the one photoelectric conversion unit to transfer an electric charge from the photoelectric conversion unit to the first node; three or more second nodes, each corresponding to the first node in one pixel block among three or more pixel blocks; three or more first switch units via each of which the first node in each of the three or more pixel blocks and each of the three or more second nodes are electrically connected with each other and disconnected from each other; and a plurality of second switch units connecting the three or more second nodes, via each of which two second nodes are electrically connected with each other and disconnected from each other.

According to the 36th aspect of the present invention, a solid-state image sensor comprises: a plurality of pixel blocks each including one photoelectric conversion unit, a first node and one transfer switch disposed in correspondence to the one photoelectric conversion unit to transfer an electric charge from the photoelectric conversion unit to the first node; two second nodes, one corresponding to the first node in one pixel block among the pixel blocks and another corresponding to the first node in another pixel block; two first switch units via each of which the first node in the one pixel block and one of the two second nodes are electrically connected with each other and disconnected from each other and the other pixel block and another one of the two second nodes are electrically connected with each other and disconnected from each other; a second switch unit via which the two second nodes are electrically connected with each other and disconnected from each other; and two third switch units from each of which a predetermined electric potential is provided to each of the two second nodes.

According to the 37th aspect of the present invention, an image-capturing device equipped with the solid-state image sensor according to any one of the 1st through 36th aspects.

DESCRIPTION OF EMBODIMENTS

The following is a description of the solid-state image sensor and the image-capturing device according to the present invention, given in reference to drawings.

First Embodiment

Figure 1:
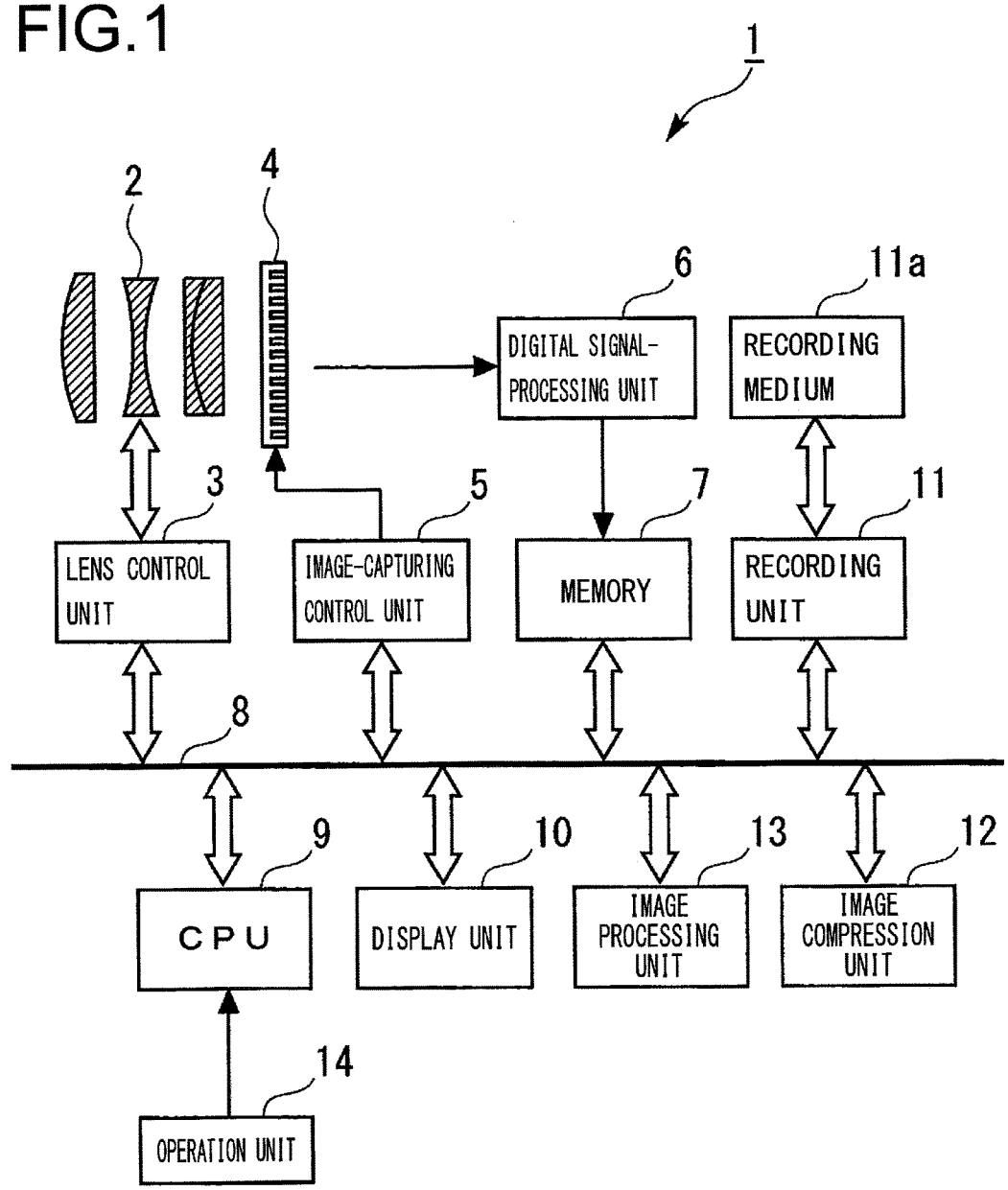
FIG. 1 A schematic block diagram illustrating the electronic camera achieved in a first embodiment of the present invention FIG. 2 A circuit diagram schematically illustrating the structure of the solid-state image sensor in FIG. 1

FIG. 1 is a schematic block diagram of an electronic camera 1 achieved in the first embodiment of the present invention.

While the electronic camera 1 is constituted as, for instance, a single-lens reflex digital camera in this embodiment, the image-capturing device according to the present invention is not limited to this example and the present invention may be adopted in various types of image-capturing devices, including a compact camera, an electronic camera mounted in a portable telephone and a video camera capable of capturing video images.

A photographic lens 2 is mounted at the electronic camera 1. A lens control unit 3 drives the photographic lens 2 so as to adjust the focus and the aperture. An image-capturing surface of a solid-state image sensor 4 is set in an image space of the photographic lens 2.

The solid-state image sensor 4, driven in response to a command issued by an image-capturing control unit 5, outputs digital image signals. For a normal main shooting operation (a still image shooting operation), for instance, the image-capturing control unit 5 controls the solid-state image sensor 4 so as to engage it in a specific read operation once a mechanical shutter (not shown) is released for an exposure following a global reset whereby all the pixels are simultaneously reset. In addition, in an electronic viewfinder mode, during a video shooting operation or the like, the image-capturing control unit 5 controls the solid-state image sensor 4 so as to engage it in a specific read operation while a rolling electronic shutter operation is underway. At these times, the image-capturing control unit 5 controls the solid-state image sensor 4 so that it executes a read operation in a specific operation mode in correspondence to the selected ISO sensitivity setting, as will be explained later. A digital signal-processing unit 6 executes image processing and the like, such as digital amplification, color interpolation processing and white balance processing, on the digital image signals output from the solid-state image sensor 4. The image signals having undergone the processing at the digital signal-processing unit 6 are first stored into a memory 7. The memory 7 is connected to a bus 8. The lens control unit 3, the image-capturing control unit 5, a CPU 9, a display unit 10 constituted with a liquid crystal display panel or the like, a recording unit 11, an image compression unit 12, an image processing unit 13 and the like are also connected to the bus 8. An operation unit 14, such as a shutter release button, is connected to the CPU 9. The ISO sensitivity can be set via the operation unit 14. A recording medium 11a is detachably mounted into the recording unit 11.

In response to an instruction for the electronic viewfinder mode, video shooting operation, regular main shooting operation (still image shooting operation) or the like issued via the operation unit 14, the CPU 9 in the electronic camera 1 drives the image-capturing control unit 5 as instructed. At this time, the lens control unit 3 adjusts the focus and the aperture to optimal settings. The solid-state image-sensor 4, driven in response to a command issued by the image-capturing control unit 5, outputs digital image signals. The digital image signals output from the solid-state image sensor 4 first undergo processing at the digital signal-processing unit 6 and then are stored into the memory 7. In the electronic viewfinder mode, the CPU 9 brings up an image expressed with the image signals on display at the display unit 10. During a video shooting operation, the CPU 9 records the image signals into the recording medium 11a. In the case of the regular main shooting operation (still image shooting operation) or the like, once the digital image signals output from the solid-state image sensor 4 are processed at the digital signal-processing unit 6 and are then stored into the memory 7, the CPU 9 executes desired processing via the image processing unit 13 and the image compression unit 12 based upon a command issued via the operation unit 14, has signals resulting from the processing output to the recording unit 11 and records the output signals into the recording medium 11a.

Figure 2:
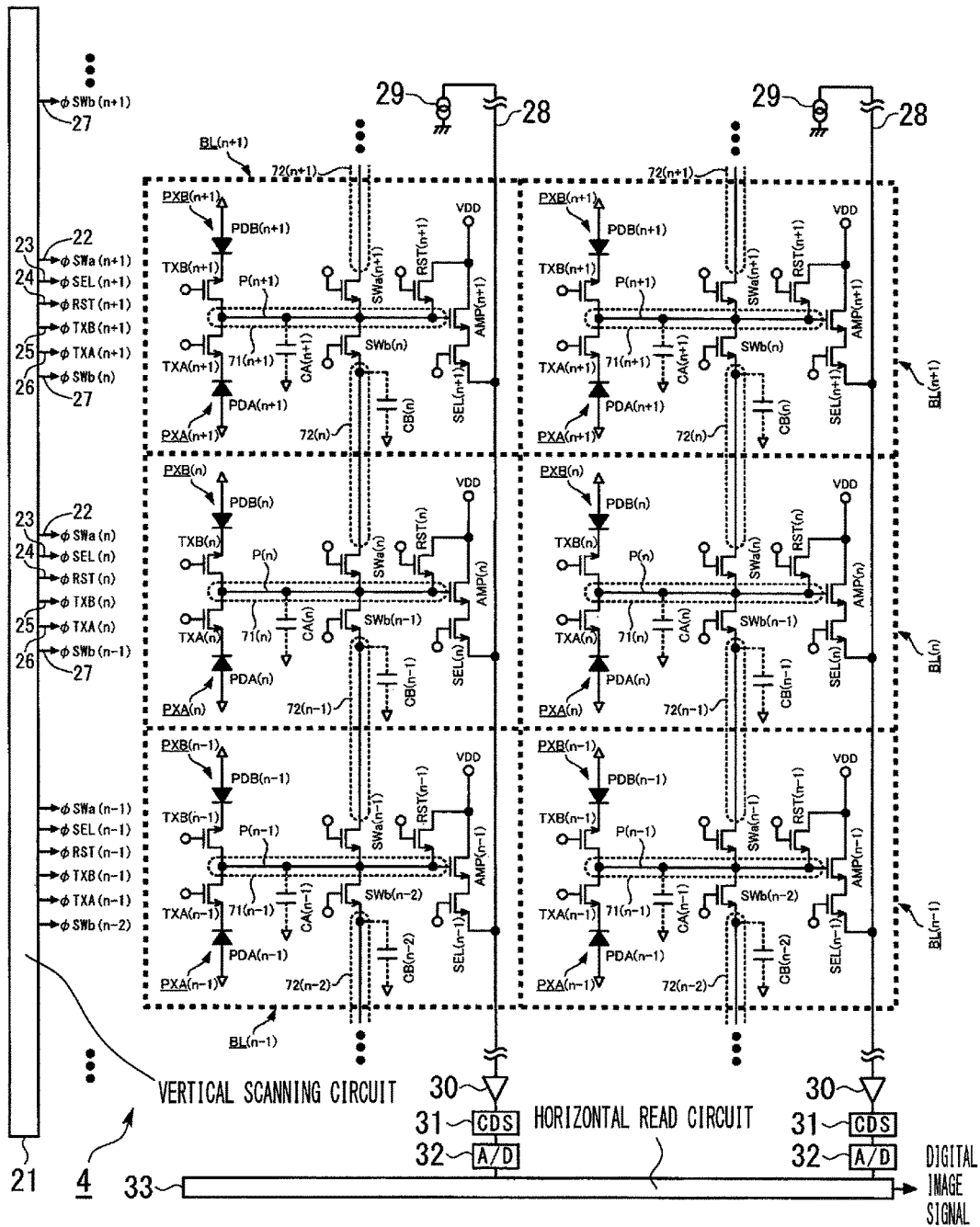
Figure 3:
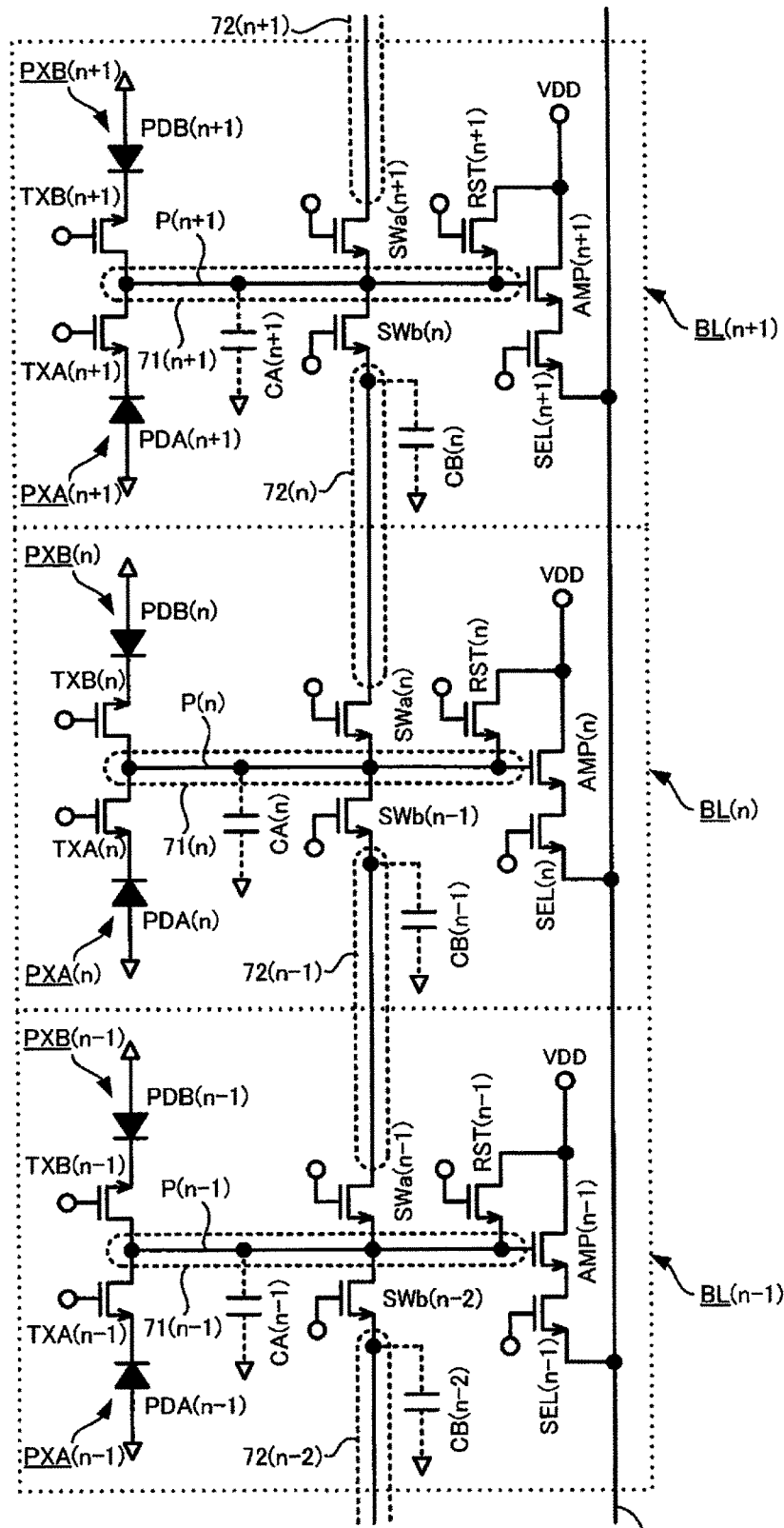
FIG. 3 A circuit diagram enlargement showing an area that includes three pixel blocks in FIG. 2
Figure 4:
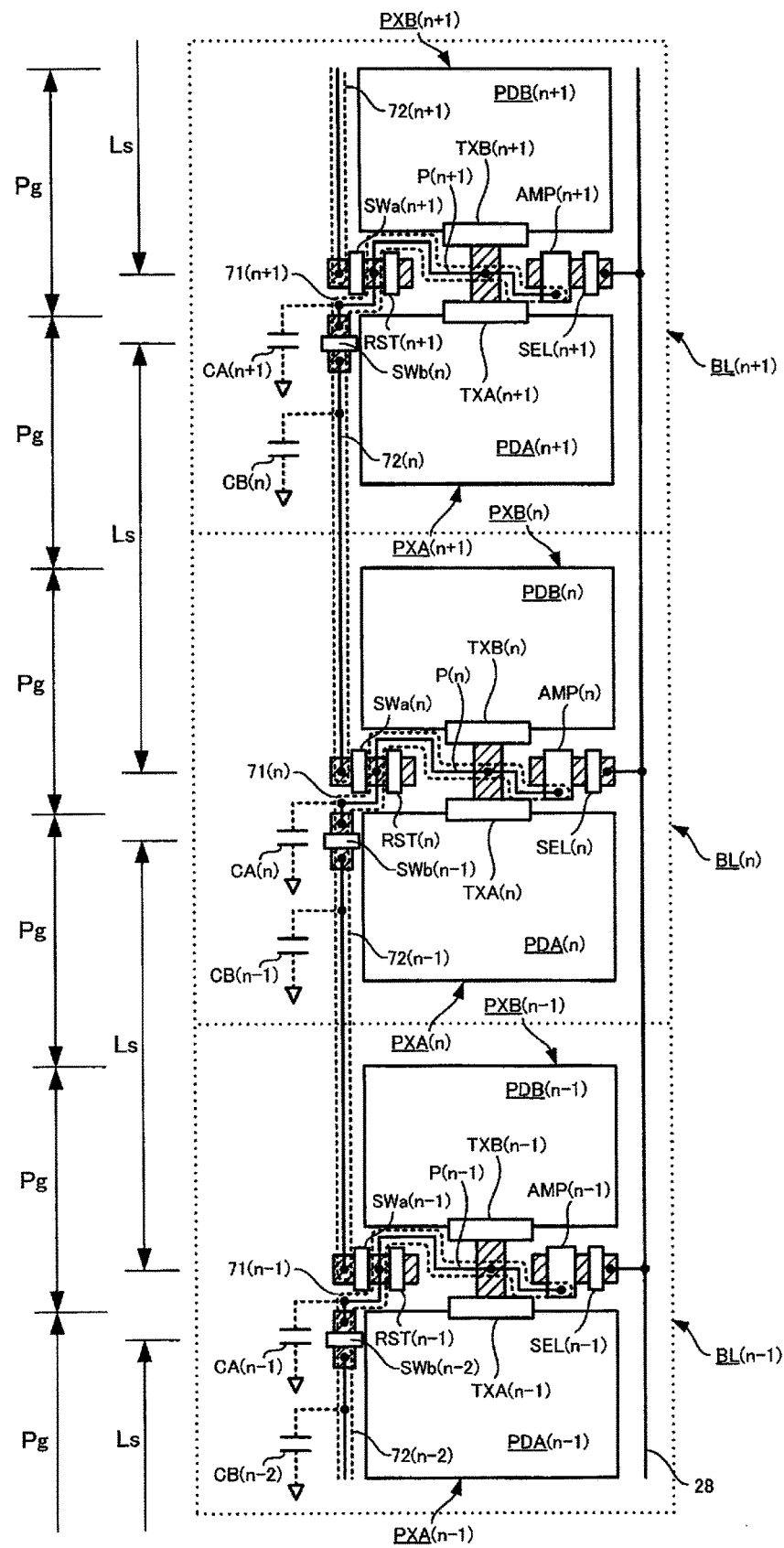
FIG. 4 A schematic plan view of an area that includes the three pixel blocks in FIG. 3
Figure 5:
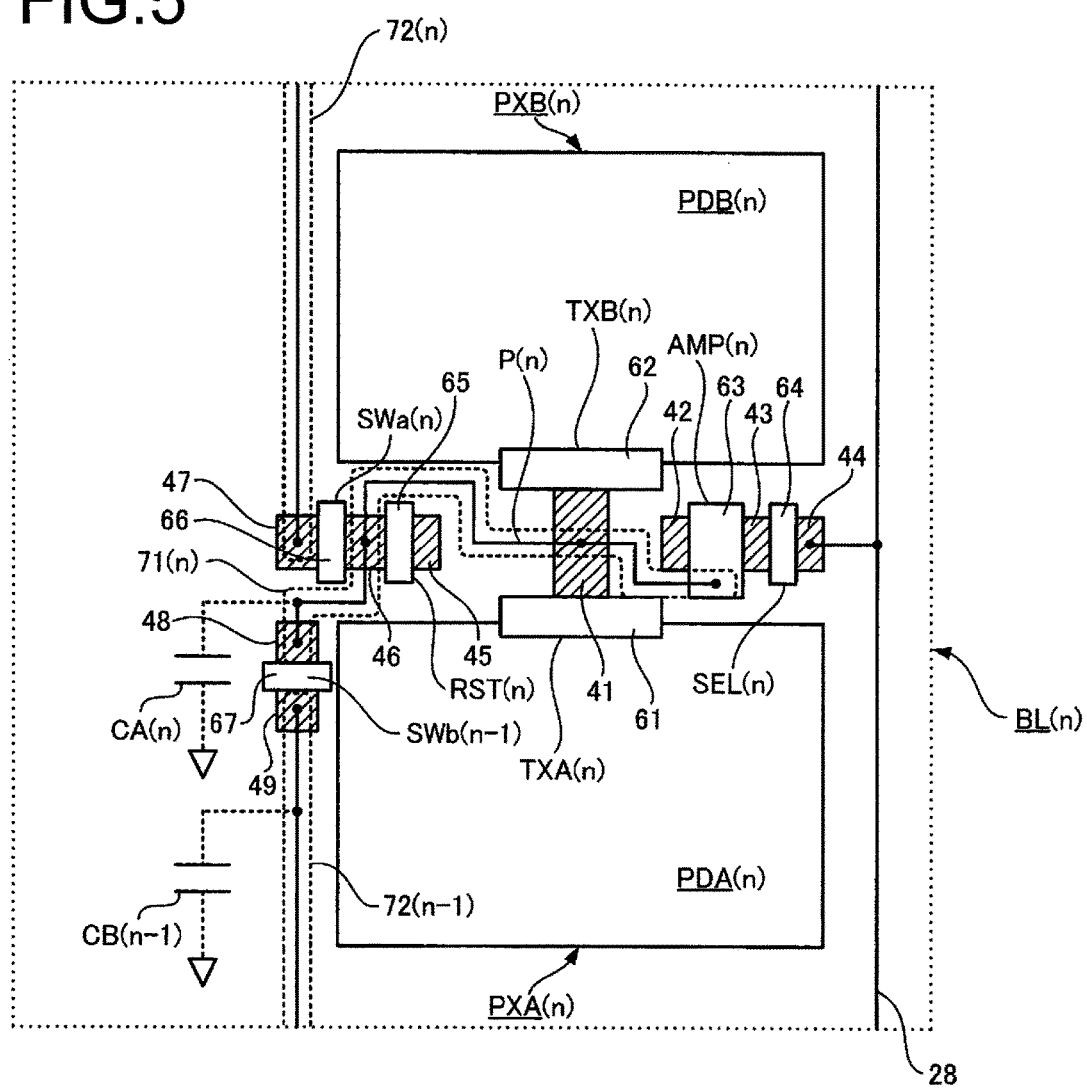
FIG. 5 A schematic plan view enlargement showing an area that includes one of the pixel blocks in FIG. 4

FIG. 2 is a circuit diagram schematically illustrating the structure of the solid-state image sensor 4 in FIG. 1. FIG. 3 is a circuit diagram enlargement showing an area that includes three pixel blocks BL set at consecutive positions along the columnar direction in FIG. 2. FIG. 4 is a schematic plan view of an area that includes the three pixel blocks BL in FIG. 3. FIG. 5 is a schematic plan view showing an area that includes one of the pixel blocks BL in FIG. 4 in an enlargement. While the solid-state image sensor 4 in the embodiment is constituted with a CMOS solid-state image sensor, the present invention is not limited to this example and it may instead be constituted with another type of XY address solid-state image sensor.

As shown in FIG. 2 through FIG. 4, the solid-state image sensor 4 includes pixel blocks BL disposed in a two-dimensional matrix pattern over N rows by M columns and each having two pixels PX (PXA, PXB), linking transistors SWa and SWb that function as a plurality of linking switches for each pixel block BL, a vertical scanning circuit 21, control lines 22 through 27 disposed in correspondence to each row of pixel blocks BL, a plurality of M vertical signal lines 28, each disposed to serve a specific column of pixels PX (in correspondence to a column of pixel blocks BL), through which signals output from the pixels PX (pixel blocks BL) in the corresponding columns are received, constant current sources 29, each disposed at one of the vertical signal lines 28, column amplifiers 30, CDS circuits (correlated double sampling circuits) 31 and A/D converters 32, each disposed in correspondence to one of the vertical signal lines 28, and a horizontal read circuit 33.

It is to be noted that the column amplifiers 30 may be analog amplifiers, or they may be amplifiers commonly referred to as switched capacitor amplifiers. In addition, it is not essential that the column amplifiers 30 be included in the configuration.

While M=2 in the configuration shown in FIG. 2 in order to simplify the illustration, the number of columns M is actually set to any value greater than 2. In addition, there are no limits imposed with regard to the number of rows N, either. A pixel block BL in a given row is distinguished from a pixel block BL in another row by notating a pixel block BL in a jth row as BL(j). Similar notation rules apply to other elements and control signals to be described later. In FIG. 2 and FIG. 3, pixel blocks BL(n−1) through BL(n+1) disposed over three rows, an (n−1)th row through an (n+1)th row, are shown.

It is to be noted that while the pixel located on the lower side in a pixel block BL in FIG. 2 and FIG. 3 is indicated with a reference sign PXA and the pixel located on the upper side in the pixel block BL in FIG. 2 and FIG. 3 is indicated with a reference sign PXB in the drawings so as to distinguish them from each other, they may both be simply referred to as pixels PX when they do not need to be distinguished from each other. In addition, while a photodiode disposed in correspondence to the pixel PXA is notated as PDA and a photodiode disposed in correspondence to the pixel PXB is notated as PDB in the drawings so as to distinguish them from each other, they may both be simply referred to as photodiodes PD when they do not need to be distinguished from each other. Likewise, while a transfer transistor disposed in correspondence to the pixel PXA is notated as TXA and a transfer transistor disposed in correspondence to the pixel PXB is notated as TXB so as to distinguish them from each other, they may both be simply referred to as transfer transistors TX when they do not need to be distinguished from each other. It is also to be noted that the photodiodes PD for the pixels PX are disposed in a two-dimensional matrix pattern over 2N rows by M columns in the embodiment.

Each pixel PX in the embodiment includes a photodiode PD used as a photoelectric conversion unit that generates a signal charge corresponding to incident light and accumulates the signal charge thus generated, and a transfer transistor TX used as a transfer switch via which the charge is transferred from the photodiode PD to a node P.

In the embodiment, two pixels PX (PXA and PXB) with the photodiodes PD thereof disposed at consecutive positions along the columnar direction, among the plurality of pixels PX, form a pixel block BL. As shown in FIGS. 2 and 3, the two pixels PX (PXA and PXB) belonging to a given pixel block BL share a set of components that include a node P, an amplifier transistor AMP, a reset transistor RST and a selector transistor SEL. A capacitance (charge/voltage conversion capacitance) is formed at the node P in relation to a reference electric potential, and the charge transferred to the node P is converted to a voltage with the capacitance thus formed. The amplifier transistor AMP constitutes an amplifier unit that outputs a signal corresponding to the electric potential at the node P. The reset transistor RST constitutes a reset switch via which the electric potential at the node is reset. The selector transistor SEL constitutes a selection unit used to select the particular pixel block Blather two pixels PX (PXA and PXB) do not share a photodiode PD and a transfer transistor TX and instead a photodiode PD and a transfer transistor TX are disposed in correspondence to each pixel PX. n in FIG. 2 and FIG. 3 indicates a specific row of pixel blocks BL. For instance, a first-row pixel block BL is made up with a pixel PX (PXA) disposed in a first row and a pixel PX (PXB) disposed in a second row, and a second-row pixel block BL is made up with a pixel PX (PXA) disposed in a third row and a pixel PX (PXB) disposed in a fourth row.

It is to be noted that the present invention may be also adopted in a configuration in which a pixel block BL is formed with pixels PX with the photodiodes PD thereof disposed at three or more consecutive positions along the columnar direction.

Although not shown in the figures, a plurality of different types color filters, each allowing light with a different color component to be transmitted, are disposed in a predetermined colorimetric array (e.g., a Bayer array) on the light entry side of the photodiodes PD at the individual pixels PX in the embodiment. A pixel PX outputs an electric signal corresponding to a specific color through color separation achieved via its color filter.

For each two pixel blocks adjacent to each other along the columnar direction among the pixel blocks BL, two linking transistors SWa and SWb, to function as two linking switches, are disposed in series within an electrical connection path (connection region) inherent to an area formed between the node P in one of the pixel blocks BL and the node P in the other pixel block BL. Thus, the nodes P in three or more pixel blocks BL are connected in a string via a plurality of connection paths (connection units) in the embodiment. Of the two linking transistors SWa and SWb, the linking transistor SWa is disposed on the side where the node P in the lower pixel block BL in FIG. 2 and FIG. 3 is located and the linking transistor SWb is disposed on the side where the node P in the upper pixel block BL in FIG. 2 and FIG. 3 is located.

For instance, two linking transistors SWa(n) and SWb(n) are disposed in series within the electrical connection path inherent to the area between the node P(n) in an nth-row pixel block BL and the node P(n+1) in the adjacent (n+1) th-row pixel block BL, which electrically connects the node P and the node P(n+1). As shown in FIG. 4, while the linking transistor SWa(n) is formed within the area of the pixel block BL(n) and the linking transistor SWb(n) is formed within the area of the pixel block BL (n+1), these linking transistors are notated with the matching letter (n) at the end of their reference signs i.e., SWa(n) and SWb(n), so as to clearly indicate that they are disposed in series within the same inherent connection path. It is to be noted that while the present invention may be adopted in conjunction with three or more linking switches disposed in series within each inherent connection path, it is desirable, for purposes of structural simplicity, to dispose two linking transistors SWa and SWb within each inherent connection path, as in the embodiment.

VDD in FIG. 2 and FIG. 3 indicates a source electric potential. It is to be noted that the transistors TXA, TXB, AMP, RST, SEL, SWa and SWb are each constituted with an nMOS transistor in the embodiment.

The gates of the transfer transistors TXA in each row are commonly connected to the control line 26, to which a control signal øTXA is provided from the vertical scanning circuit 21. The gates of the transfer transistors TXB in each row are commonly connected to the control line 25, to which a control signal øTXB is provided from the vertical scanning circuit 21. The gates of the reset transistors RST in each row are commonly connected to the control line 24, to which a control signal øRST is provided from the vertical scanning circuit 21. The gates of the selector transistors SEL in each row are commonly connected to the control line 23, to which a control signal øSEL is provided from the vertical scanning circuit 21. The gates of the linking transistors SWa in each row are commonly connected to the control line 22, to which a control signal øSWA is provided from the vertical scanning circuit 21. The gates of the linking transistors SWb in each row are commonly connected to the control line 27, to which a control signal øSWB is provided from the vertical scanning circuit 21. The control signal øTXA(n), for instance, is supplied to the gates of the transfer transistors TXA(n), the control signal øTXB(n) is supplied to the gates of the transfer transistors TXB(n), the control signal øRST(n) is supplied to the gates of the reset transistors RST(n), the control signal øSEL(n) is supplied to the gates of the selector transistors SEL(n), the control signal øSWA(n) is supplied to the gates of the linking transistors SWa(n) and the control signal øSWB(n) is supplied to the gates of the linking transistors SWb(n).

The transistors TXA, TXB, RST, SEL, SWa and SWb are turned on when the corresponding control signals øTXA, øTXB, øRST, øSEL, øSWa and øSWb are at high level (H) and are turned off when the corresponding control signals are at low level (L).

Under control executed by the image-capturing control unit 5 shown in FIG. 1, the vertical scanning circuit 21 outputs the control signals øTXA, øTXB, øRST, øSEL, øSWa and øSWb for each row of pixel blocks BL so as to achieve a still image read operation, a video read operation or the like by controlling the pixel blocks BL and the linking transistors SWa and SWb with the control signals. Under this control, a read operation is executed in a specific operation mode among various operation modes to be described later, in correspondence to, for instance, the value set for the ISO sensitivity. Through the control, signals (analog signals) from the pixels PX in the corresponding column are provided to each vertical signal line 28.

The vertical scanning circuit 21 in the embodiment constitutes a control unit that executes operation by switching to a specific operation mode among the various operation modes to be described later in response to a command (control signal) issued by the image-capturing control unit 5 shown in FIG. 1.

The signals read out to the vertical signal line 28 corresponding to each column are amplified at the column amplifier 30, then undergo processing executed at the CDS circuit 31 to obtain the difference between a light signal (a signal containing optical information resulting from the photoelectric conversion at a pixel PX) and a dark signal (a differential signal containing a noise component to be subtracted from the light signal) and then are converted to digital signals at the A/D converter 32. The digital signals resulting from the conversion are held in the A/D converter 32. The digital image signals held at the individual A/D converters 32 are horizontally scanned by the horizontal read circuit 33, are converted as needed to a predetermined signal format and are output to an external recipient (the digital signal-processing unit 6 in FIG. 1).

It is to be noted that the CDS circuit 31 receives a dark signal sampling signal øDARKC from a timing generation circuit (not shown) under control executed by the image-capturing control unit 5 shown in FIG. 1 and samples signals output from the column amplifier 30 as dark signals when øDARKC is at high level (H) and that the CDS circuit 31 receives a light signal sampling signal øSIGC from the timing generation circuit under control executed by the image-capturing control unit 5 in FIG. 1 and samples signals output from the column amplifier 30 as light signals when øSIGC is at H. Then, based upon a clock and a pulse provided from the timing generation circuit, the CDS circuit 31 outputs signals corresponding to the differences between the sampled dark signals and light signals. Such a CDS circuit 31 may adopt a structure of the known art.

In reference to FIG. 4 and FIG. 5, the structure of the pixel blocks BL will be described. While a color filter, a microlens and the like are actually disposed above each photodiode PD, they are not shown in FIGS. 4 and 5. It is to be noted that the layout of the power lines, ground lines and control lines 22 through 27 is not included in the illustrations provided in FIG. 4 and FIG. 5.

Various elements in a pixel block BL, such as the photodiodes PD, are disposed in a P well (not shown) formed on an N-type silicon substrate (not shown) in the embodiment. Reference numerals 41 through 49 in FIG. 5 each indicate an N-type impurity diffusion area forming part of a given transistor among the various transistors mentioned earlier. Reference numerals 61 through 67 each indicate a gate electrode of a given transistor, constituted of polysilicon. It is to be noted that the diffusion areas 42 and 45 are areas where a source voltage VDD is applied through a power line (not shown).

The photodiodes PDA(n) and PDB(n) are pinned photodiodes (hole accumulated diodes) each constituted with an N-type charge accumulation layer (not shown) formed within the P well and a P-type and a P-type depletion preventing layer (not shown) disposed on the side where the front surface of the N-type charge accumulation layer is present. The incoming light undergoes photoelectric conversion at the photodiodes PDA(n) and PDB(n) and the charges resulting from the photoelectric conversion are then stored in the respective charge accumulation layers.

The transfer transistor TXA(n) is an nMOS transistor with a source, a drain and a gate thereof respectively constituted with the charge accumulation layer of the photodiode PDA (n), the diffusion area 41 and the gate electrode 61. The transfer transistor TXB(n) is an nMOS transistor with a source, a drain and a gate thereof respectively constituted with the charge accumulation layer of the photodiode PDB (n), the diffusion area 41 and the gate electrode 62. The diffusion area 41 is formed between the photodiode PDA(n) and the photodiode PDB(n). The diffusion area 41 is a shared diffusion area that functions as both the drain of the transfer transistor TXA(n) and the drain of the transfer transistor TXB(n). The gate electrode 61 of the transfer transistor TXA(n) is disposed on the side of the diffusion area 41 further toward the photodiode PDA(n). The gate electrode 62 of the transfer transistor TXB(n) is disposed on the side of the diffusion area 41 further toward the photodiode PDB(n).

The amplifier transistor AMP(n) is an nMOS transistor with a drain, a source and a gate thereof respectively constituted with the diffusion area 42, the diffusion area 43 and the gate electrode 63. The selector transistor SEL(n) is an nMOS transistor with a drain, a source and a gate thereof respectively constituted with the diffusion area 43, the diffusion area 44 and the gate electrode 64. The diffusion area 44 is connected to the vertical signal line 28. The reset transistor RST(n) is an nMOS transistor with a drain, a source and a gate thereof respectively constituted with the diffusion area 45, the diffusion area 46 and the gate electrode 65.

The linking transistor SWa(n) is an nMOS transistor with a source, a drain and a gate thereof respectively constituted with the diffusion area 46, the diffusion area 47 and the gate electrode 66. The linking transistor SWb(n−1) is an nMOS transistor with a drain, a source and a gate thereof respectively constituted with the diffusion area 48, the diffusion area 49 and the gate electrode 67.

The gate electrode 63, the diffusion areas 41 and 46 and the diffusion area 48 at the linking transistor SWb(n−1) in the pixel block BL(n) are electrically connected with one another through a wiring 71(*n*), thereby achieving electrical continuity. The node P(n) in the embodiment is equivalent to the wiring 71(*n*) and the entire region where electrical continuity is achieved through the electrical connection via the wiring 71(*n*).

The pixel blocks BL in rows other than the nth row are structured similarly to the nth-row pixel block BL(n) described above. The linking transistors SWa other than the linking transistor SWa(n) are structured similarly to the linking transistor SWa(n).

Likewise, the linking transistors SWb other than the linking transistor SWb(n) are structured similarly to the linking transistor SWb(n).

In addition, the diffusion area 47 and the diffusion area 49 of the two linking transistor SWa and SWb disposed in series within each inherent connection path are connected via a wiring 72. For instance, the diffusion area 47 of the linking transistor SWa(n−1) and the diffusion area 49 of the linking transistor SWb(n−1) are electrically connected via a wiring 72(*n*−1). The wiring 72(*n*−1) constitutes a connecting portion connecting the linking transistors SWa(n−1) and SWb(n−1) when the linking transistors SWa(n−1) and SWb(n−1) are in the off state. The diffusion area 47 of the linking transistor SWa(n) and the diffusion area 49 of the linking transistor SWb(n) are electrically connected via a wiring 72(*n*). The wiring 72(*n*) constitutes a connecting portion connecting the linking transistors SWa(n) and SWb(n) when the linking transistors SWa(n) and SWb(n) are in the off state.

Ls and Pg in the following description respectively indicate an offset quantity representing the extent of offset between the two linking transistors SWa and SWb, disposed in series within each inherent connection path, along the columnar direction and the pitch at which consecutive photodiodes PD are disposed along the columnar direction. While the present invention does not impose any restriction on the relationship between the pitch Pg and the offset Ls, it is desirable that Pg<Ls<2×Pg so as to lower the capacitance value Cfd1 of a capacitance CA to be described later. In the embodiment, the offset quantity Ls is set slightly less than 2×Pg by disposing, for instance, the linking transistor SWb(n−1) near the linking transistor SWa(n) so as to minimize the length of the wiring 71(*n*) and thus minimize the capacitance value Cfd1 of the capacitance CA(n), to be described later.

CA(n) in FIGS. 2 through 5 is a capacitance formed between the node P(n) and the reference electric potential when the linking transistors SWa(n) and SWb(n−1) are in the off state. Cfd1 indicates the capacitance value of the capacitance CA(n). CB(n) is a capacitance formed between the wiring 72(*n*) and the reference electric potential when the linking transistors SWa(n) and SWb(n) are in the off state. Cfd2 indicates the capacitance value of the capacitance CB(n). Similar notations are applicable in other rows of pixel blocks BL.

The capacitance CA(n) is made up with the capacitance in the drain diffusion area 41 shared by the transfer transistors TXA(n) and TXB(n), the capacitance in the source diffusion area 46 of the reset transistor RST(n), the capacitance in the source diffusion area 46 of the linking transistor SWa(n), the capacitance in the drain diffusion area 48 of the linking transistor SWb(n−1), the capacitance at the gate electrode 63 of the amplifier transistor AMP(n) and the wiring capacitance at the wiring 71(*n*), and the capacitance value Cfd1 of the capacitance CA(n) equals the total sum of their capacitance values. This principle also applies to other rows of pixel blocks BL.

The value assumed for the channel capacitance when the linking transistor SWa is in the on state and the value assumed for the channel capacitance when the linking transistor SWb is in the on state are both notated as Csw. The capacitance value Csw is normally smaller than the capacitance values Cfd1 and Cfd2.

Figure 6:
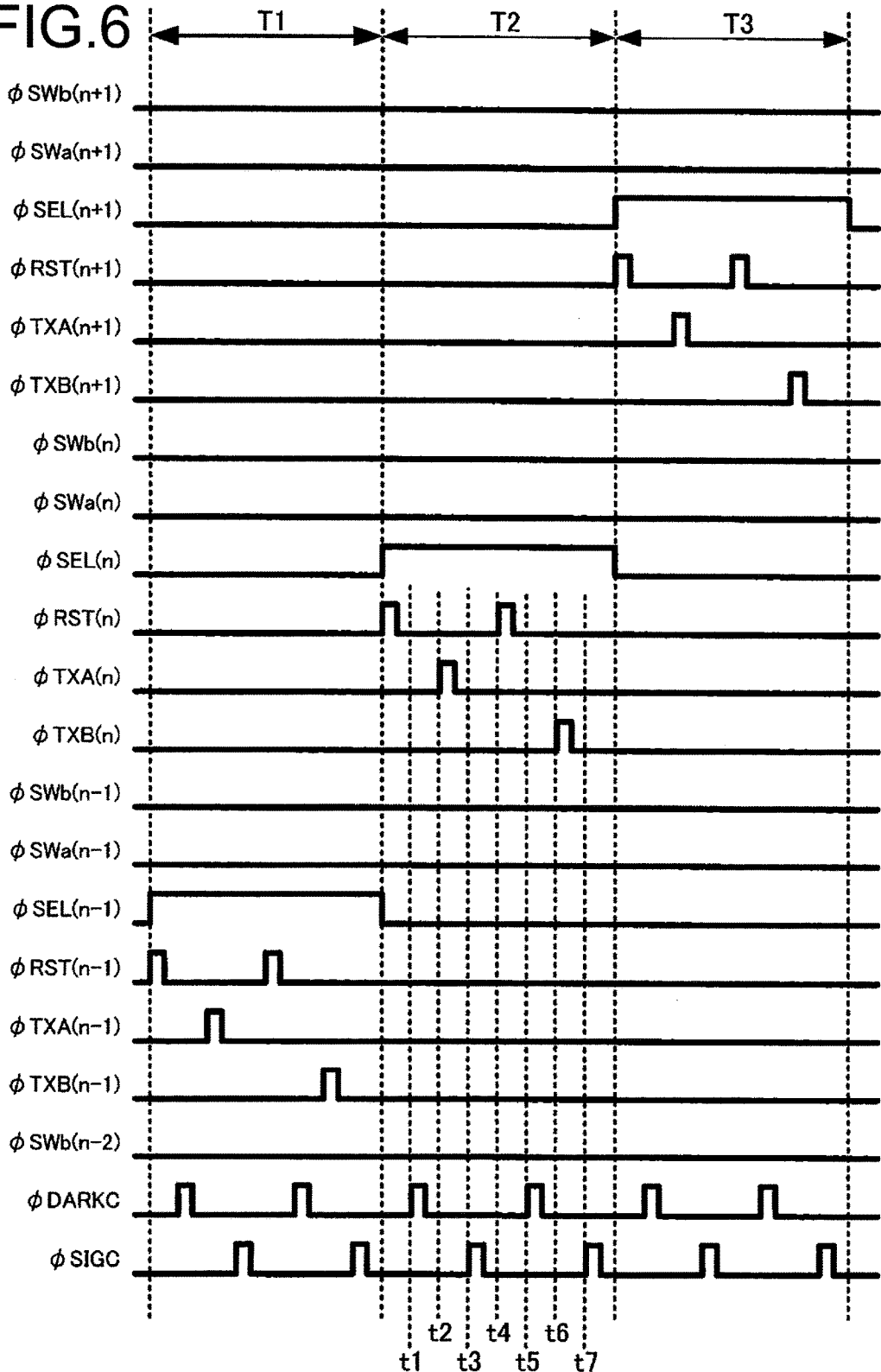
FIG. 6 A timing chart pertaining to a specific operation mode that may be selected in the solid-state image sensor shown in FIG. 2

When the linking transistors SWa(n) and SWb(n−1) in a pixel block BL(n) are both off (i.e., a linking transistor in the on state among the various linking transistors SWa and SWb does not achieve an electrical connection to the node P(n)) and thus, the connection paths where the linking transistors SWa and SWb are disposed cannot achieve a state of electrical connection to the node P(n)), the capacitance (charge/voltage conversion capacitance) between the node P(n) and the reference electric potential is the capacitance CA(n). The capacitance value of the charge/voltage conversion capacitance at the node P(n) is thus Cfd1. This state is equivalent to the state that occurs during a period T2 in FIG. 6 illustrating a first operation mode, which will be described later.

Figure 7:
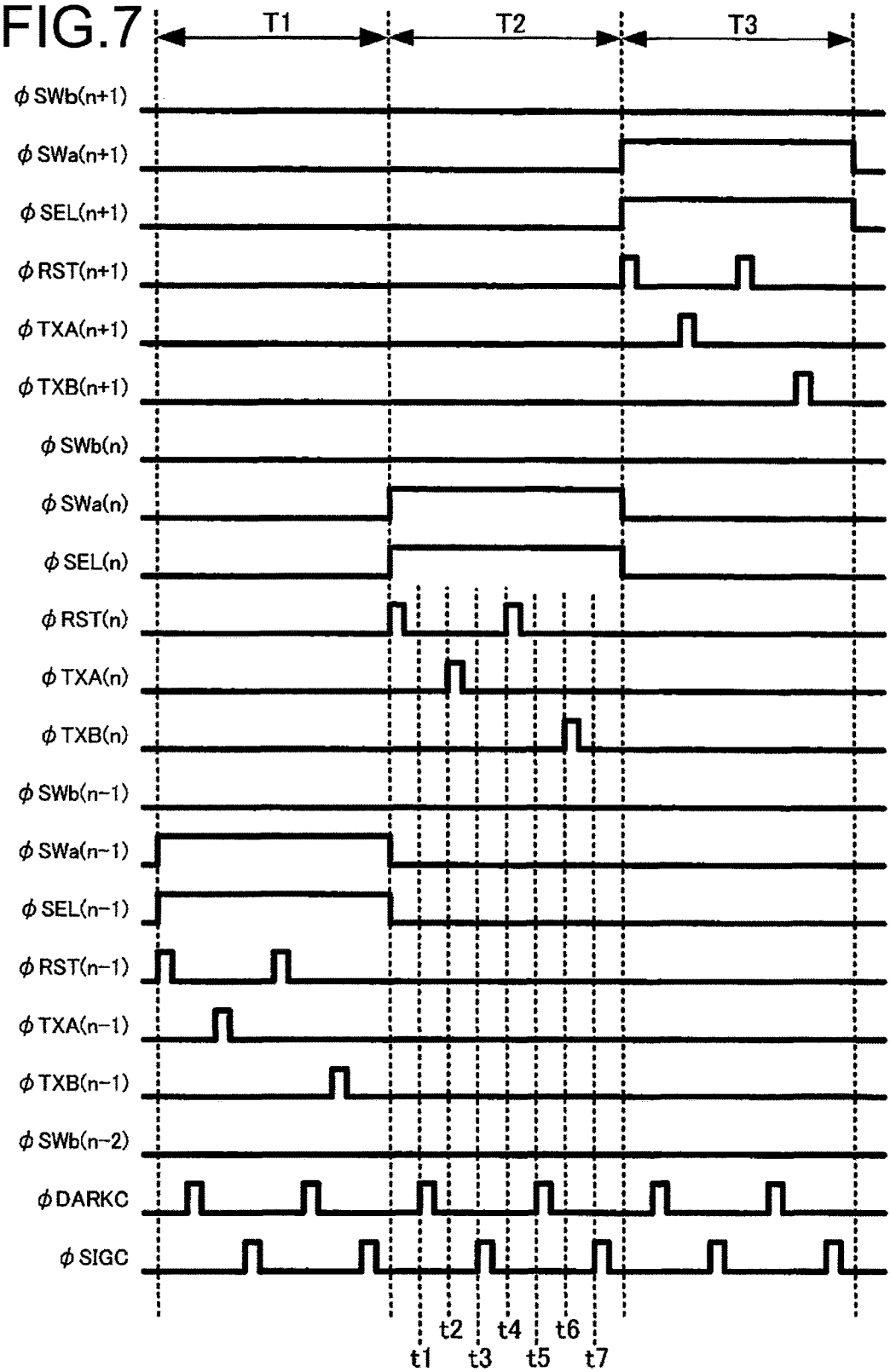
FIG. 7 A timing chart pertaining to another operation mode that may be selected in the solid-state image sensor shown in FIG. 2

In addition, when the linking transistor SW(n) is turned on in the pixel block BL(n), the capacitance (charge/voltage conversion capacitance) between the node P(n) and the reference electric potential equals a sum calculated by adding the capacitance CB(n) and the channel capacitance of the linking transistor SWa(n) in the on state to the capacitance CA(n), unless a linking transistor in the on state other than the linking transistor SWa(n), among the various linking transistors SWa and SWb, enters a state of electrical connection to the node P(n) (in more specific terms, if the linking transistors SWb(n−1) and SWb(n) are in the off state). Under these circumstances, the capacitance value of the charge/voltage conversion capacitance at the node P(n) is expressed as; Cfd1+Cfd2+Csw≈Cfd1+Cfd2. This state is equivalent to the state that occurs during the period T2 in FIG. 7 illustrating a second A operation mode, which will be described later.

Figure 8:
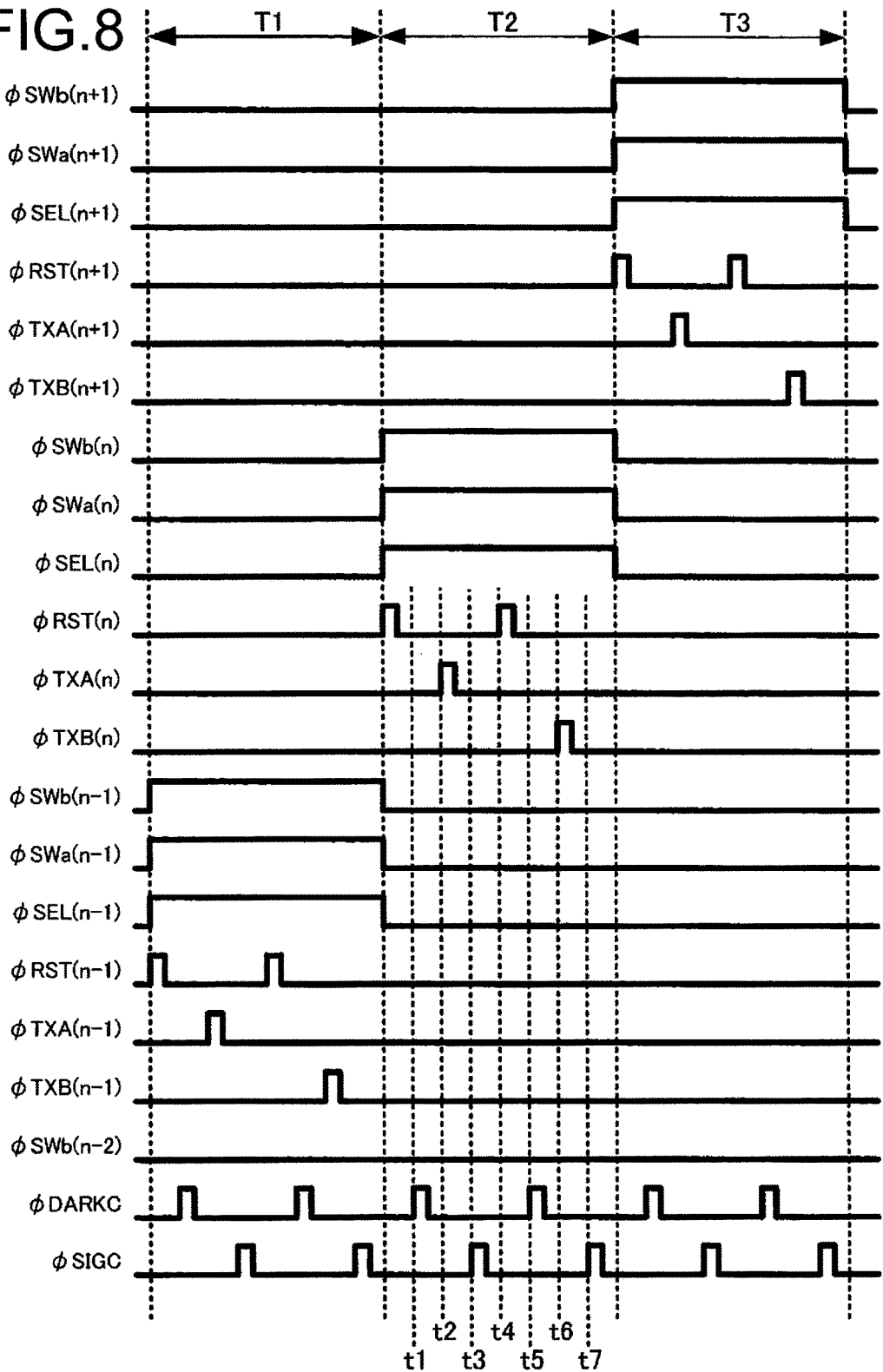
FIG. 8 A timing chart pertaining to yet another operation mode that may be selected in the solid-state image sensor shown in FIG. 2

Furthermore, when the linking transistors SWa(n) and SWb(n) are both turned on in relation to the pixel block BL(n), the charge/voltage conversion capacitance at the node P(n) equals a sum calculated by adding the capacitance CB(n), the channel capacitances of the linking transistors SWa(n) and SWb(n) in the on state and the capacitance CA(n+1) to the capacitance CA(n), unless a linking transistor in the on state other than the linking transistors SWa(n) and SWb(n), among the various linking transistors SWa and SWb enters a state of electrical connection to the node P(n) (in more specific terms, if the linking transistors SWb(n−1) and SWa(n+1) are in the off state). Accordingly, the capacitance value of the charge/voltage conversion capacitance at the node P(n) is expressed as; 2×Cfd1+Cfd2+2×Csw≈2×Cfd1+Cfd2. This state is equivalent to the state that occurs during the period T2 in FIG. 8 illustrating a second B operation mode, which will be described later.

Thus, as long as there is no linking transistor in the on state that is electrically connected to the node P(n), among the various linking transistors SWa and SWb, the capacitance value of the charge/voltage conversion capacitance at the node P(n) is minimized and thus, a greater value is taken for the charge/voltage conversion coefficient corresponding to the charge/voltage conversion capacitance, thereby enabling a read at the highest possible SN ratio.

In addition, the number of linking transistors in the on state that are electrically connected to the node P(n), among the various linking transistors SWa and SWb, may be increased to a desired value equal to or greater than 1 so as to raise the capacitance value of the charge/voltage conversion capacitance at the node P(n) to a desired value and thus enable handling of a greater signal charge quantity, which, in turn, makes it possible to increase the number of saturation electrons. This ultimately makes it possible to increase the dynamic range.

While a description has been given above in reference to the node P(n) in the pixel block BL(n), the principle described above in reference to the node P(n) in a pixel block BL(n) also applies to the nodes P in other pixel blocks BL.

FIG. 6 is a timing chart pertaining to the first operation mode that may be selected in the solid-state image sensor 4 shown in FIG. 2. In a typical example of an operation executed in the first operation mode, the pixel blocks BL are sequentially selected in units corresponding to the individual rows, the transfer transistors TXA and TXB in the selected pixel blocks BL are selectively turned on in sequence while there is no linking transistor in the on state that is electrically connected to the node P in each selected pixel block BL (i.e., while the charge/voltage conversion capacitance at the particular node P is at the lowest) among the various linking transistors SWa and SWb, and signals from the photodiodes PDA and PDB in the selected pixel blocks BL are sequentially read out in correspondence to the individual rows. While signals are read out from all the pixels PXA and PXB in the example presented in FIG. 6, the present invention is not limited to this example and signals may be read through a culled read (a sub-sampling read) by skipping some pixel rows. Such a culled read may be executed in the examples to be described later in reference to FIGS. 7 and 8.

FIG. 6 indicates that pixel blocks BL(n−1) in the (n−1)th row are selected during the period T1, that pixel blocks BL(n) in the nth row are selected during the period T2 and pixel blocks BL(n+1) in the (n+1)th row are selected during the period T3. Since the operation executed when the pixel blocks BL in a given row are selected is identical to the operation executed when the pixel blocks BL in any other row are selected, the following explanation will focus on the operation executed when the pixel blocks BL(n) in the nth row are selected.

Exposure via the photodiodes PDA(n) and PDA(n) will have been completed through a predetermined exposure time period preceding the start of the period T2. This exposure is executed via a mechanical shutter (not shown) following a global reset, whereby all the pixels are reset simultaneously, in a regular main shooting operation (still image shooting operation) and the like, whereas it is executed through an operation commonly referred to as a rolling electronic shutter operation in the electronic viewfinder mode or during a video shooting operation. Immediately before the period T2 starts, all the transistors SEL, RST, TXA, TXB, SWa and SWb are in the off state.

At the start of the period T2, øSEL(n) for the nth row is set to H so as to turn on the selector transistors SEL(n) in the nth-row pixel blocks BL(n) and select the pixel blocks BL(n) in the nth row.

In addition, in the period T2, øSWa(n) and øSWb(n−1) are set to L, thereby turning off the linking transistors SWa(n) and SWb(n−1). As a result, the selected pixel blocks BL(n) enter a state in which there is no linking transistor in the on state that is electrically connected to the node P(n) in each selected pixel block BL(n), among the various linking transistors SWa and SWb. Thus, the charge/voltage conversion capacitance at each node P(n) takes on the smallest capacitance value Cfd1.

Over a predetermined length of time immediately following the start of the period T2, øRST(n) is set to H so as to temporarily turn on the reset transistors RST(n) in the nth row and thus reset the electric potential at the nodes P(n) to the source voltage VDD for the time being.

Over a predetermined length of time starting at a following time point t1 during the period T2, the dark signal sampling signal øDARKC is set to H and the electric potential at each node P(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t2 during the period T2, øTXA(n) is set to H so as to turn on the nth row transfer transistors TXA(n). As a result, the signal charges having been accumulated in the photodiodes PDA(n) in the nth-row pixel blocks BL(n) are transferred to the charge/voltage conversion capacitances at the nodes P(n). The electric potential at each node P(n) minus the noise component takes on a value that is in proportion to both the quantity of the corresponding signal charge and the reciprocal of the capacitance value of the charge/voltage conversion capacitance at the particular node P(n).

At a following time point t3 during the period T2, the light signal sampling signal øSIGC is set to H, and the electric potential at each node P(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a subsequent time point at which øSIGC is set to L, each CDS circuit 31 outputs a signal corresponding to the difference between the dark signal sampled over the predetermined length of time starting at the time point t1 and the light signal sampled over the predetermined length of time starting at the time point t3. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

Then, over a predetermined length of time starting at a time point t4 during the period T2, øRST(n) is set to H so as to temporarily turn on the reset transistors RST(n) in the nth row and thus reset the electric potential at the nodes P(n) to the source voltage VDD for the time being.

Over a predetermined length of time starting at a following time point t5 during the period T2, the dark signal sampling signal øDARKC is set to H and the electric potential at each node P(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t6 during the period T2, øTXB(n) is set to H so as to turn on the nth row transfer transistors TXB(n). As a result, the signal charges having been accumulated in the photodiodes PDB(n) in the nth-row pixel blocks BL(n) are transferred to the charge/voltage conversion capacitances at the nodes P(n). The electric potential at each node P(n) minus the noise component takes on a value that is in proportion to both the quantity of the corresponding signal charge and the reciprocal of the capacitance value of the charge/voltage conversion capacitance at the particular node P(n).

At a following time point t7 during the period T2, the light signal sampling signal øSIGC is set to H, and thus, the electric potential at each node P(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a subsequent time point at which øSIGC is set to L, each CDS circuit 31 outputs a signal corresponding to the difference between the dark signal sampled over the predetermined length of time starting at the time point t5 and the light signal sampled over the predetermined length of time starting at the time point t7. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

In the first operation mode described above, there is no linking transistor in the on state that is electrically connected to the node P in each selected pixel block BL, among the various linking transistors SWa and SWb, and thus, the charge/voltage conversion capacitance at the node P in each selected pixel block BL takes on the smallest capacitance value, resulting in a greater charge/voltage conversion coefficient corresponding to the charge/voltage conversion capacitance, which, in turn, enables a read operation at the highest possible SN ratio. The image-capturing control unit 5 issues a command for the first operation mode when, for instance, the ISO sensitivity is set to the highest value.

FIG. 7 is a timing chart pertaining to the second A operation mode that may be selected in the solid-state image sensor 4 shown in FIG. 2. The second A operation mode is a type of second operation mode. In this second operation mode, the pixel blocks BL are sequentially selected in units of the individual rows, and the transfer transistors TXA and TXB in each selected pixel block BL are selectively turned on in sequence while a predetermined number of at least one linking transistor in the on state, among the various linking transistors SWa and SWb, is electrically connected to the node P in the selected pixel block BL so as to sequentially read out signals output from the photodiodes PDA and PDB in the selected pixel blocks BL in units of the individual rows. In the second A operation mode, which is a type of second operation mode, the predetermined number is set to 1.

As does FIG. 6, FIG. 7 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the second A operation mode shown in FIG. 7 that distinguish it from the first operation mode shown in FIG. 6.

In the second A operation mode shown in FIG. 7, during the period T2 through which the nth-row pixel blocks BL(n) are selected, øSWa(n) is set to H and øSWb(n−1) is set to L, thereby turning on the linking transistors SWa(n) and turning off the linking transistors SWb(n−1). Thus, the selected pixel blocks BL(n) each assume a state that occurs during the period T2 in which one linking transistor (the linking transistor SWa(n) in this example), among the various linking transistors SWa and SWb is electrically connected to the node P(n) therein. As a result, the charge/voltage conversion capacitance at the node P(n) takes on a capacitance value expressed as; $Cfd1+Cfd2+Csw \approx Cfd1+Cfd2$, as explained earlier, achieving an increase in the capacitance value by an extent equivalent to one stage over that achieved in the first operation mode shown in FIG. 6.

While an explanation has been given in reference to the period T2 through which the nth-row pixel blocks BL(n) are selected, a similar operation is executed during periods through which other pixel blocks BL are selected.

In the second A operation mode described above, one linking transistor in the on state among the various linking transistors SWa and SWb, is electrically connected to the node P in each selected pixel block BL, thereby achieving an increase in the capacitance value of the charge/voltage conversion capacitance at the node P in the selected pixel block BL by an extent equivalent to one stage, which allows the number of saturation electrons corresponding to the charge/voltage conversion capacitance at the node P to be increased by an extent equivalent to one stage. As a result, the dynamic range can be expanded by an extent equivalent to one stage. The image-capturing control unit 5 issues a command for operation in the second A operation mode when, for instance, a value smaller than the highest value by one step is set for the ISO sensitivity.

FIG. 8 is a timing chart pertaining to the second B operation mode that may be selected in the solid-state image sensor 4 shown in FIG. 2. The second B operation mode is another type of second operation mode in which the predetermined number is set to 2.

As do FIG. 6 and FIG. 7, FIG. 8 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the second B operation mode shown in FIG. 8 that distinguish it from the first operation mode shown in FIG. 6 and the second A operation mode shown in FIG. 7.

In the second B operation mode shown in FIG. 8, during the period T2 through which the nth-row pixel blocks BL(n) are selected, øSWa(n) and øSWb(n) are set to H and øSWb(n−1) and øSWa(n+1) are set to L, thereby turning on the linking transistors SWa(n) and SWb(n) and turning off the linking transistors SWb(n−1) and SWa(n+1). Thus, the selected pixel blocks BL(n) each assume a state that occurs during the period T2 in which two linking transistors in the on state (the linking transistors SWa(n) and SWb(n) in this example), among the various linking transistors SWa and SWb are electrically connected to the node P(n) therein. As a result, the charge/voltage conversion capacitance at the node P(n) takes on a capacitance value 2×Cfd1+Cfd2+2 Csw≈2×Cfd1+Cfd2, as explained earlier, achieving an increase in the capacitance value by an extent equivalent to two stages over that achieved in the first operation mode shown in FIG. 6.

While an explanation has been given in reference to the period T2 through which the nth-row pixel blocks BL(n) are selected, a similar operation is executed during periods through which other pixel blocks BL are selected.

In the second B operation mode described above, two linking transistors in the on state among the various linking transistors SWa and SWb, are electrically connected to the node P in each selected pixel block BL, thereby achieving an increase in the capacitance value of the charge/voltage conversion capacitance at the node P in the selected pixel block BL by an extent equivalent to two stages, which allows the number of saturation electrons corresponding to the charge/voltage conversion capacitance at the node P to be increased by two stages. As a result, the dynamic range can be expanded by two stages. The image-capturing control unit 5 issues a command for operation in the second B operation mode when, for instance, a value smaller than the highest value by two steps is set for the ISO sensitivity.

It is to be noted that the predetermined number may be set to three or higher in the second operation mode.

Figure 9:
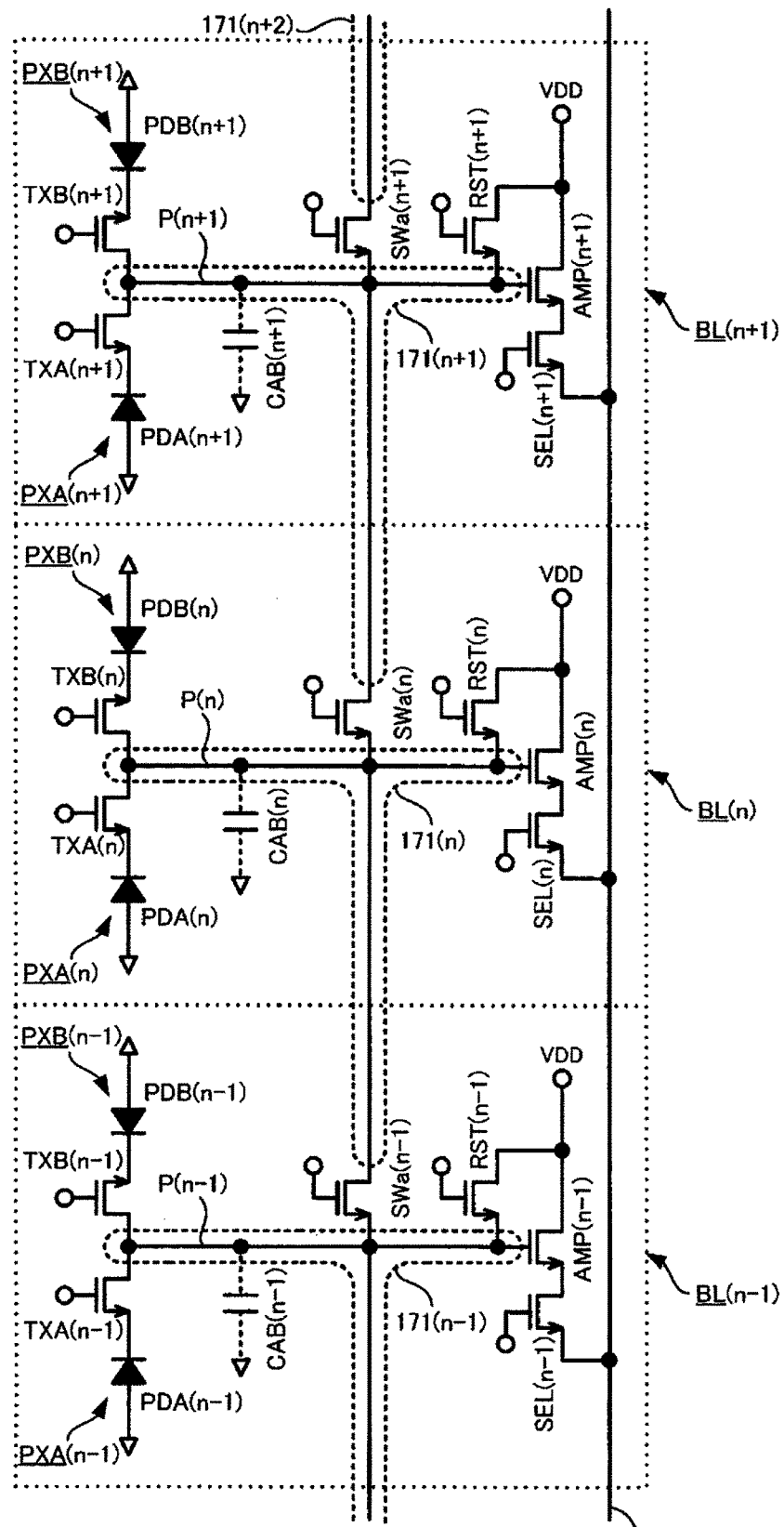
FIG. 9 A circuit diagram showing an area that includes three pixel blocks in a solid-state image sensor achieved in a comparison example FIG. 10 A schematic plan view of an area that includes the three pixel blocks in FIG. 9
Figure 10:
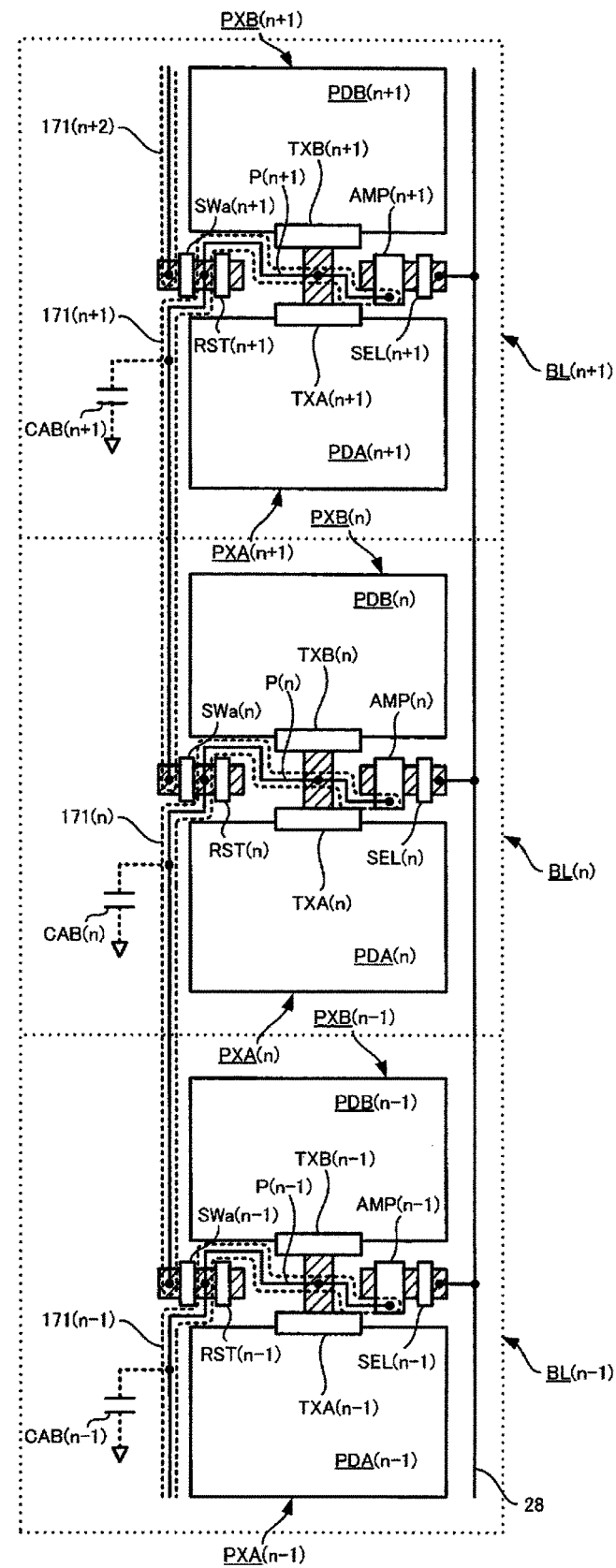

A solid-state image sensor in a comparison example, provided for purposes of comparison with the solid-state image sensor 4 in the embodiment, will be explained next. FIG. 9 is a circuit diagram corresponding to that in FIG. 3, showing an area that includes three pixel blocks BL in the solid-state image sensor in the comparison example. FIG. 10 is a schematic plan view corresponding to FIG. 4 and FIG. 5, which schematically illustrates an area that includes the three pixel blocks BL in FIG. 9. In FIG. 9 and FIG. 10, the same reference signs are assigned to elements identical to or corresponding to those in FIG. 3, FIG. 4 and FIG. 5, so as to preclude the necessity for a repeated explanation thereof. It is to be noted that while the diffusion areas and the gate electrodes in FIG. 10 do not bear any reference signs, they are assigned with the same reference signs as those in FIG. 5.

The comparison example differs from the embodiment in that it does not include any linking transistors SWb and that a shorted state is achieved in the area that would otherwise be taken up by a linking transistor SWb with a wiring 171 that includes wirings 71 and 72. The linking transistor SWb(n−1), for instance, is absent and a wiring 171(n) that includes wirings 71(n) and 72(n−1) electrically connects the gate electrode 63 and the diffusion areas 41 and 46 in the pixel block BL(n), and the diffusion area 47 at the linking transistor SWa(n−1) for electric continuity.

CAB(n) in FIGS. 9 and 10 is a capacitance formed between the node P(n) and the reference electric potential when the linking transistors SWa(n) and SWa(n−1) are in the off state. Cfd indicates the capacitance value of the capacitance CAB(n). Similar notations are applicable in other rows of pixel blocks BL.

The capacitance CAB(n) is made up with the capacitance in the drain diffusion area 41 shared by the transfer transistors TXA(n) and TXB(n), the capacitance in the source diffusion area 46 of the reset transistor RST(n), the capacitance in the source diffusion area 46 of the linking transistor SWa(n), the capacitance in the drain diffusion area 47 of the linking transistor SWa(n−1), the capacitance at the gate electrode 63 of the amplifier transistor AMP(n) and the wiring capacitance at the wiring 171(n), and the capacitance value Cfd of the capacitance CAB(n) equals the total sum of their capacitance values. This principle also applies to other rows of pixel blocks BL.

The wiring capacitance of the wiring 171(n) is approximately equal to the sum of the wiring capacitance (stray capacitance) of the wiring 71(n) and the wiring capacitance of the wiring 171(n). This means that the capacitance value Cfd of the capacitance CAB(n) is approximately equal to the sum of the capacitance value Cfd1 of the capacitance CA(n) and the capacitance value Cfd2 of the capacitance CB(n) mentioned earlier in the description of the embodiment, i.e., Cfd≈Cfd1+Cfd2.

When the linking transistors SWa(n) and SWa(n−1) are both turned off, the charge/voltage conversion capacitance at the node P(n) in the pixel block BL(n) is the capacitance CAB(n) in the comparison example. As a result, the charge/voltage conversion capacitance at the node P(n) takes on the smallest capacitance value in the comparison example, i.e., Cfd, resulting in a greater charge/voltage conversion coefficient corresponding to the charge/voltage conversion capacitance, which makes possible a read at the highest possible SN ratio in the comparison example.

When a predetermined number of at least one linking transistor in the on state, among the various linking transistors SWa, achieves a state of electrical connection to the node P(n) in the pixel block BL(n) in the comparison example, the capacitance value of the charge/voltage conversion capacitance at the node P(n) increases in correspondence to the number of linking transistors in the on state, and the number of saturation electrons can be increased. This, in turn, makes it possible to expand the dynamic range.

However, the capacitance value of the charge/voltage conversion capacitance at the node P(n) cannot be set smaller than; Cfd≈Cfd1+Cfd2 in the comparison example. Thus, since the charge/voltage conversion coefficient cannot be increased significantly, a read cannot be executed at a very high SN ratio in the comparison example.

In contrast, the embodiment that includes the linking transistors SWb allows the smallest capacitance value for the charge/voltage conversion capacitance at the node P(n) to be reduced, as described earlier to; Cfd1≈Cfd−Cfd2, a value lower than that in the comparison example.

Namely, the embodiment makes it possible to expand the dynamic range and also improves the SN ratio for high-sensitivity read over the comparison example.

While a linking transistor SWa and a linking transistor SWb are disposed between each pair of nodes P taking consecutive positions along the columnar direction in the embodiment, the present invention is not limited to this example. For instance, the area between a (q+1)th node (q is an integer equal to or greater than 2) among nodes P set side-by-side along the columnar direction and a node P located directly below the node P in the figure may be held in an open state at all times without disposing linking transistors SWa and SWb between them. In such a case, if q is smaller, the maximum value that may be taken for the predetermined number set in the second operation mode will be lowered and the extent to which the dynamic range is expanded will thus decrease. However, the SN ratio for high-sensitivity read can be improved over the comparison example described earlier.

It is to be noted that in the various operational examples described in reference to FIGS. 6 through 8, the signal charge at the photodiode PD in each pixel PX is read out separately without combining it with the signal charge at a photodiode PD in another pixel PX. However, the present invention is not limited to these operational examples, and the signal charge at the photodiode PD in each pixel PX may be read out in combination with the signal charge at the photodiode PD in another pixel PX of the same color.

For instance, by turning on the linking transistors SWa(n−1), SWb(n−1), SWa(n) and SWb(n) so as to connect the nodes P(n−1), P(n) and P(n+1) with one another and simultaneously turning on TXA(n−1), TXA(n) and TXA(n+1), the signal charges at the photodiodes PDA(n−1), PDA(n) and PDA(n−1) at the three pixels PXA(n−1), PXA(n) and PXA(n−1) assuming the same color in a Bayer array or the like will be averaged through the nodes P(n−1), P(n) and P(n+1) linked with one another, thereby achieving a same-color, three pixel combined read function. In this situation, the number of linking transistors in the on state that are electrically connected to the nodes P(n−1), P(n) and P(n+1) may be minimized by turning off the linking transistors SWb(n−2) and SWa(n+1) so as to minimize the charge/voltage conversion capacitance values at the linked nodes P(n−1), P(n) and P(n+1) and thus enable a same-color, three pixel combined read operation at the highest possible SN ratio. In addition, by allowing at least one more linking transistor in the on state to electrically connect to the nodes P(n−1), P(n) and P(n+1), as well as to the linking transistors SWa(n−1), SWb(n−1), SWa(n) and SWb(n), an increase in the charge/voltage conversion capacitance values at the linked nodes P(n−1), P(n) and P(n+1), corresponding to the number of additional linking transistors, is achieved and as a result, the dynamic range for the same-color, three pixel combined read can be expanded.

Second Embodiment

Figure 11:
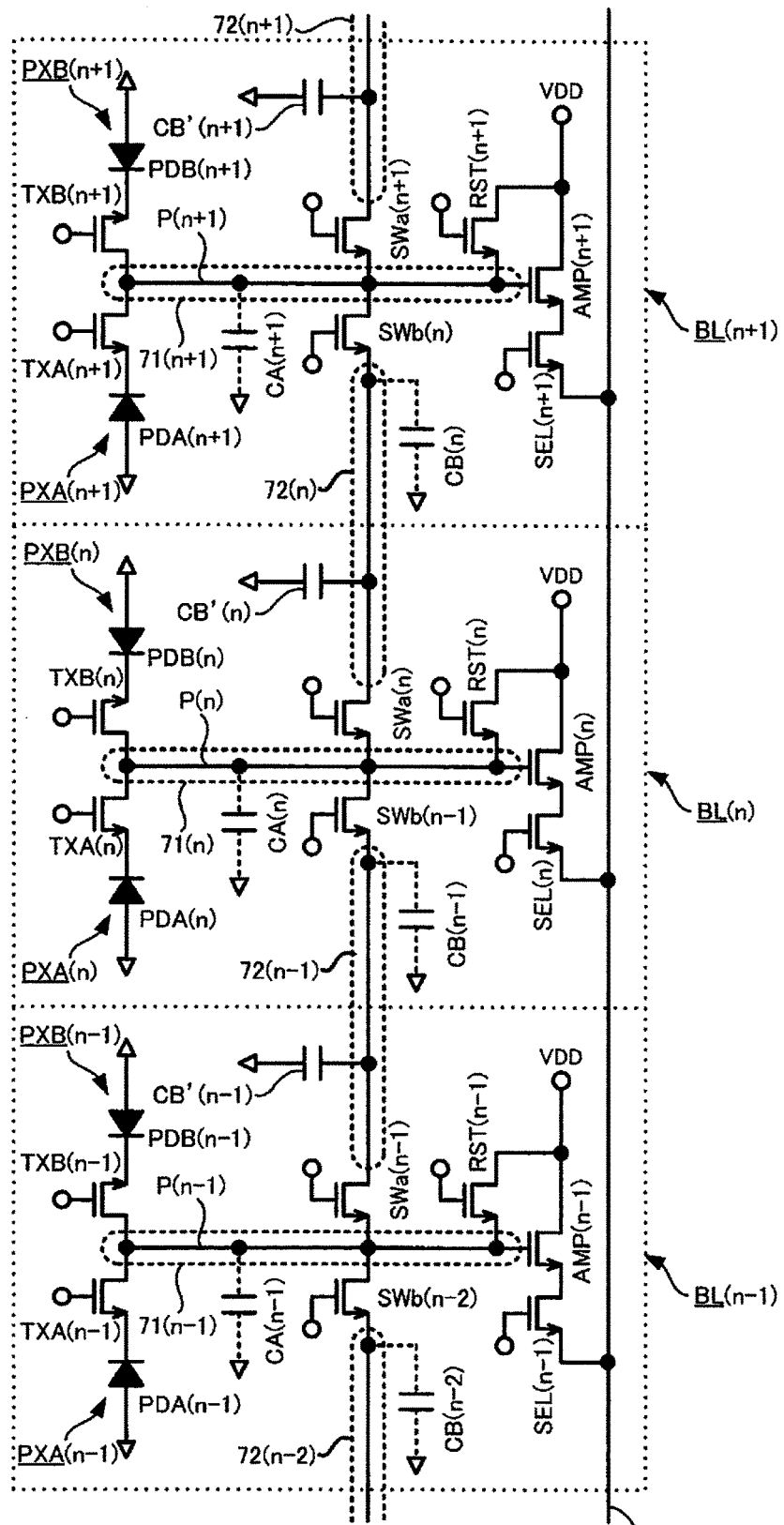
FIG. 11 A circuit diagram showing an area that includes three pixel blocks in a solid-state image sensor in the electronic camera achieved in a second embodiment of the present invention FIG. 12 A schematic plan view of an area that includes the three pixel blocks in FIG. 11
Figure 12:
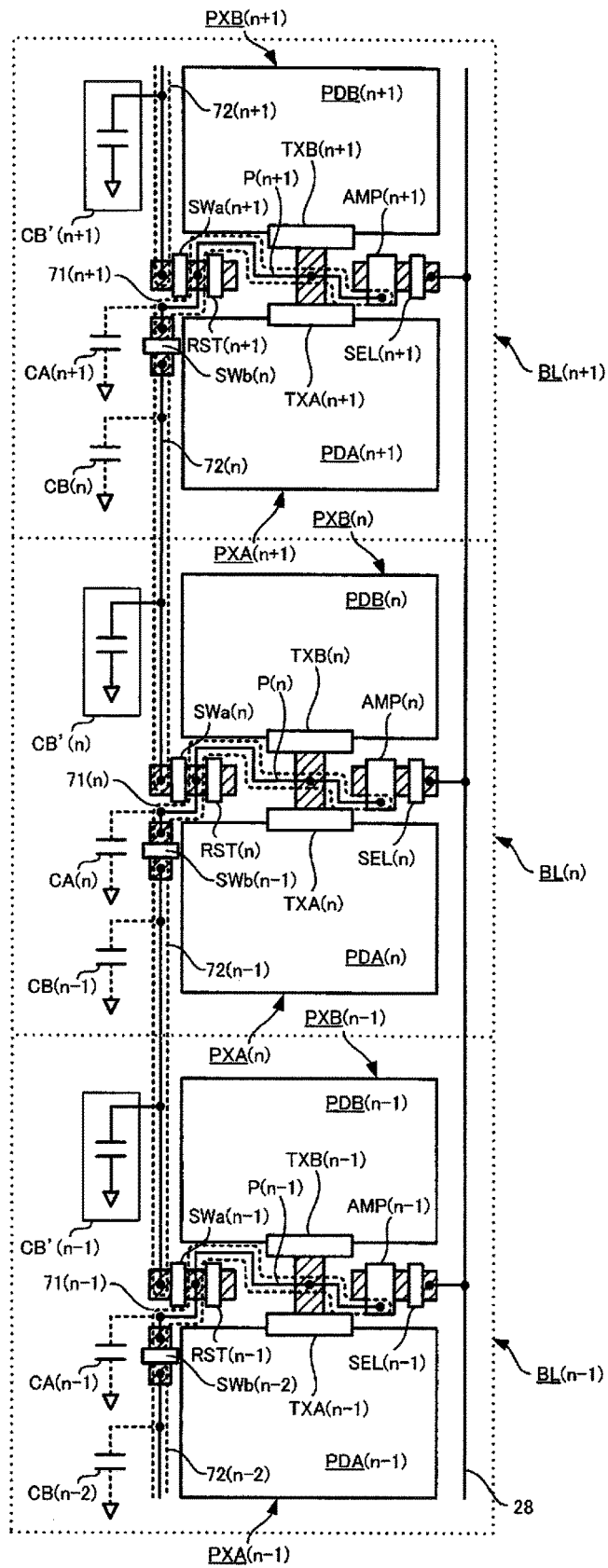

FIG. 11 is a circuit diagram corresponding to that in FIG. 3, showing an area that includes three pixel blocks BL in the solid-state image sensor in the electronic camera achieved in the second embodiment of the present invention. FIG. 12 is a schematic plan view corresponding to FIG. 4 and FIG. 5, which schematically illustrates an area that includes the three pixel blocks BL in FIG. 9. In FIG. 11 and FIG. 12, the same reference signs are assigned to elements identical to or corresponding to those in FIG. 3, FIG. 4 and FIG. 5 so as to preclude the necessity for a repeated explanation thereof.

This embodiment differs from the first embodiment described earlier in that an adjustment capacitance CB' assuming a capacitance value Cfd3 is added in each wiring 72. While the adjustment capacitance CB'(n) is actually part of the capacitance CB(n) that is the capacitance between the wiring 72(n) and the reference electric potential when the linking transistors SWa(n) and SWb(n) are in the off state, FIG. 11 and FIG. 12 show the adjustment capacitance CB' separately from the capacitance CB(n) so as to clearly indicate that the adjustment capacitance CB' is a structural element with a capacitance value Cfd3, added to the structure with the capacitance CB(n) having the capacitance value Cfd2 in the first embodiment. While the capacitance CB(n) assumes the capacitance value Cfd2 in the first embodiment described above, the capacitance value of the capacitance CB(n) in the current embodiment is Cfd2+Cfd3. This principle is also applicable with regard to other capacitances CB, wirings 72 and adjustment capacitances CB'

In addition to advantages and operations similar to those of the first embodiment, an advantage is achieved through the embodiment in that the addition of the adjustment capacitance CB' makes it possible to set the capacitance value of the capacitance CB to any desired value.

In more specific terms, the adjustment capacitance CB' can be formed by adopting one of or a combination of two or more of the following methods:

(i) by at least partially increasing the wiring width of the wiring 72 relative to the wiring width of the other wirings within the pixel block BL so as to achieve a greater area for the wiring 72 relative to the area of the wiring 72 in the first embodiment (ii) by connecting a MOS capacitance to the wiring 72

(iii) by connecting a diffusion capacitance that does not configure the linking transistors SWa and SWb (iv) by allowing the drain diffusion area 47 of the linking transistor SWa to assume a greater area than the area of the drain diffusion area 47 in the first embodiment, and (v) by allowing the source diffusion area 49 of the linking transistor SWb to assume a greater area than the source diffusion area 49 in the first embodiment.

The capacitance value Cfd3 of the adjustment capacitance CB' may be set as described below. It is desirable that the capacitance value of the charge/voltage conversion capacitance at each node P be an integral multiple of the reference capacitance value. However, in the first embodiment described earlier without the adjustment capacitance CB', the capacitance value Cfd2 of the capacitance CB is normally less than the capacitance value Cfd1 of the capacitance CA. Accordingly, in order to achieve a capacitance value for the charge/voltage conversion capacitance at the node P(n) that is double the reference capacitance value, the linking transistors SWa(n) and SWb(n) must be turned on so that the capacitance value of the charge/voltage conversion capacitance at the node P(n) is set to 2×Cfd1+Cfd2+2×Csw over the two pixel blocks BL(n) and BL(n+1), The current embodiment is distinguishable in that the capacitance value of cfd2+Cfd3=Cfd1 is achieved for the capacitance CB by forming the adjustment capacitance CB' so that the adjustment capacitance CB' takes on a capacitance value Cfd3 expressed as; Cfd1−Cfd2. This means that in order to achieve a capacitance value for the charge/voltage conversion capacitance at the node P(n) that is double the reference capacitance value, the linking transistor SWa(n) must simply be turned on and thus only a single pixel block BL(n) needs to be used. In addition, an even greater quantity of charge can be held in the individual pixels before saturation with a much smaller number of linked pixel blocks.

The method for setting the capacitance value Cfd3 for the capacitance CB' described above simply represents an example and the capacitance value may be set through another method.

In order to achieve a capacitance value for the charge/voltage conversion capacitance at the node P that is as close as possible to an integral multiple of the reference capacitance value, it is desirable that the capacitance CB assume a capacitance value within a range of +20% of the capacitance value of the capacitance CA and even more desirably within a range of ±10% of the capacitance value of the capacitance CA.

Third Embodiment

Figure 13:
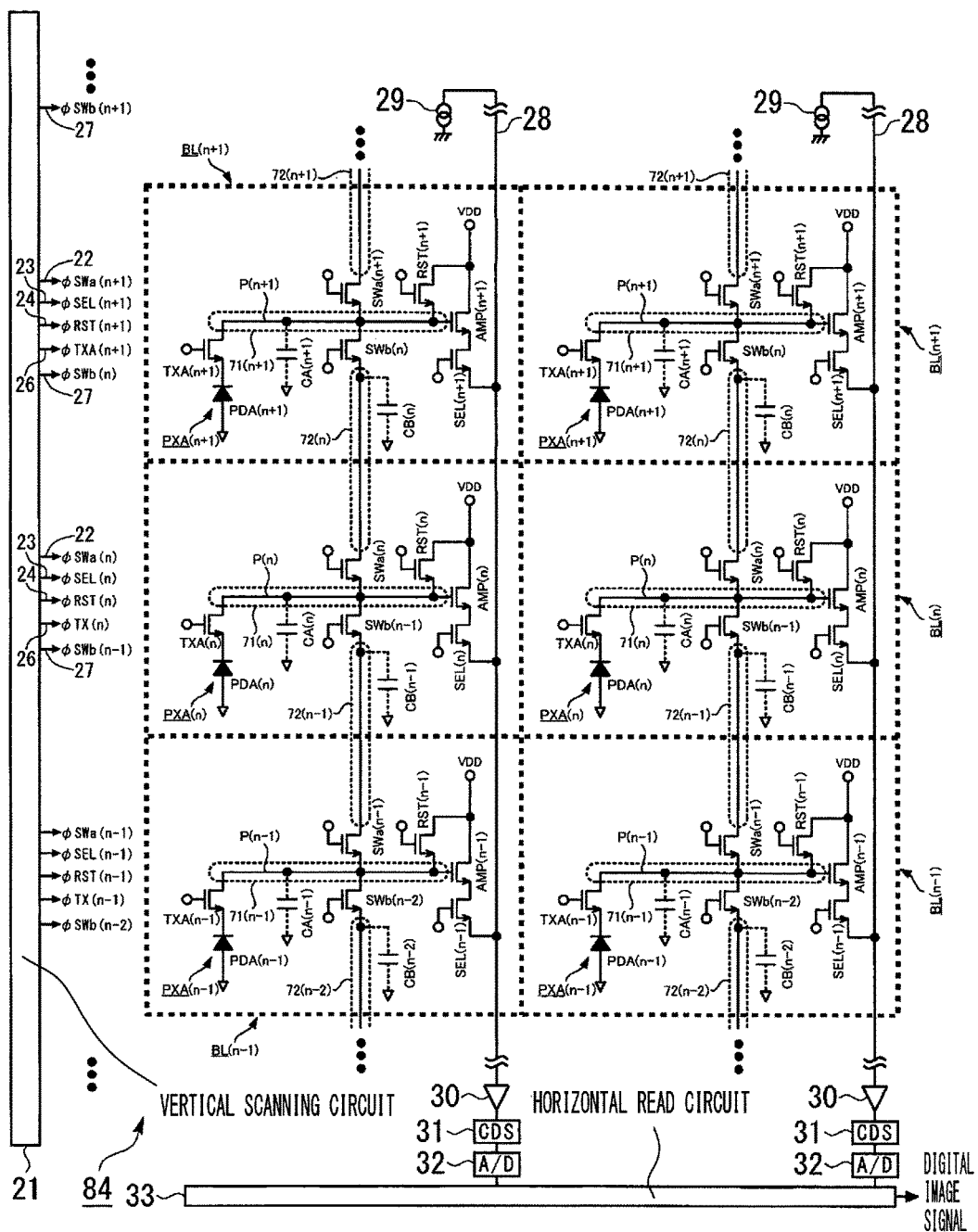
FIG. 13 A circuit diagram schematically illustrating the structure of a solid-state image sensor in the electronic camera achieved in a third embodiment of the present invention FIG. 14 A circuit diagram schematically illustrating the structure of a solid-state image sensor in the electronic camera achieved in a fourth embodiment of the present invention FIG. 15 A circuit diagram enlargement showing an area that includes four pixel blocks in FIG. 14

FIG. 13 is a circuit diagram corresponding to FIG. 2, schematically illustrating the structure of a solid-state image sensor 84 in the electronic camera achieved in the third embodiment of the present invention. In FIG. 13, the same reference signs are assigned to elements identical to or corresponding to elements shown in FIG. 2, so as to preclude the necessity for a repeated explanation thereof.

The current embodiment differs from the first embodiment in that the photodiode PDB and the transfer transistor TXB disposed in each pixel block BL in the first embodiment are not provided and that each pixel block BL is thus made up with a pixel PXA. However, the photodiodes PDA in the embodiment are disposed with a columnar-direction density that is twice the columnar-direction density with which the photodiodes PDA are disposed in the first embodiment. In other words, the photodiodes PDA are disposed with a columnar-direction density matching that with which the photodiodes PDA and PDB are disposed along the columnar direction in the first embodiment. n indicates a specific row of pixel blocks BL and also a specific row of pixels PXA in the embodiment.

Namely, while each pixel block BL in the first embodiment is made up with two pixels PX (PXA and PXB), pixel blocks BL in the current embodiment are each made up with a single pixel (PXA). In addition, while the two pixels PX (PXA and PXB) in a pixel block BL in the first embodiment share a set of elements, i.e., the node P, the amplifier transistor AMP, the reset transistor RST and the selector transistor SEL, the set of elements, i.e., the node P, the amplifier transistor AMP, the reset transistor RST and the selector transistor SEL, is provided for each pixel PX (PXA in the embodiment] in the current embodiment.

The description of the first embodiment also serves as a description of the current embodiment basically by referring to pixel blocks BL as pixels PXA instead. Accordingly, the current embodiment will not be explained in detail.

Through the current embodiment, too, advantages and operations similar to those of the first embodiment are achieved.

It is to be noted that the present invention allows variations similar to the current embodiment, which is achieved by modifying the first embodiment, to be adopted in the second embodiment.

Fourth Embodiment

Figure 14:
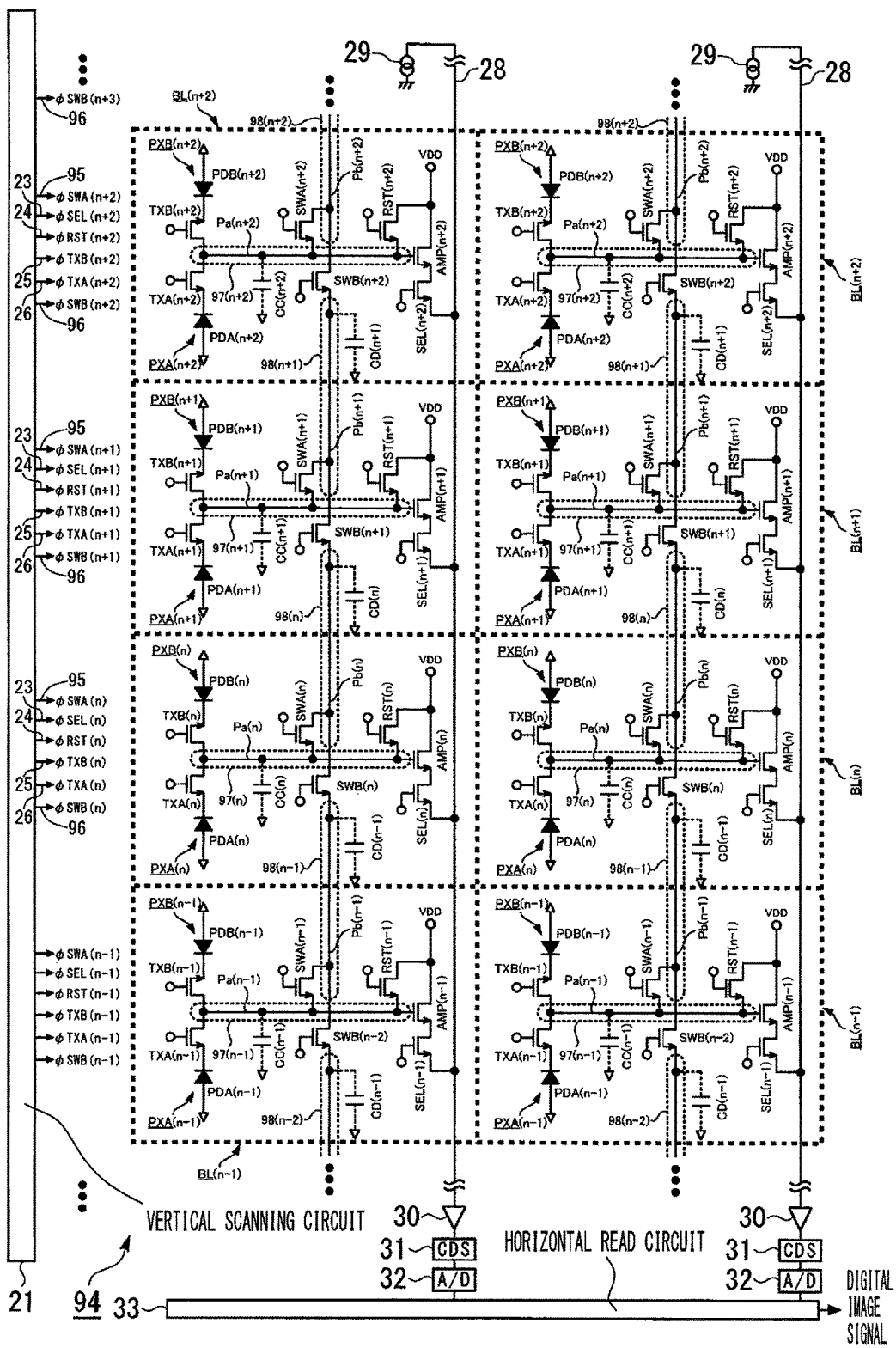
Figure 15:
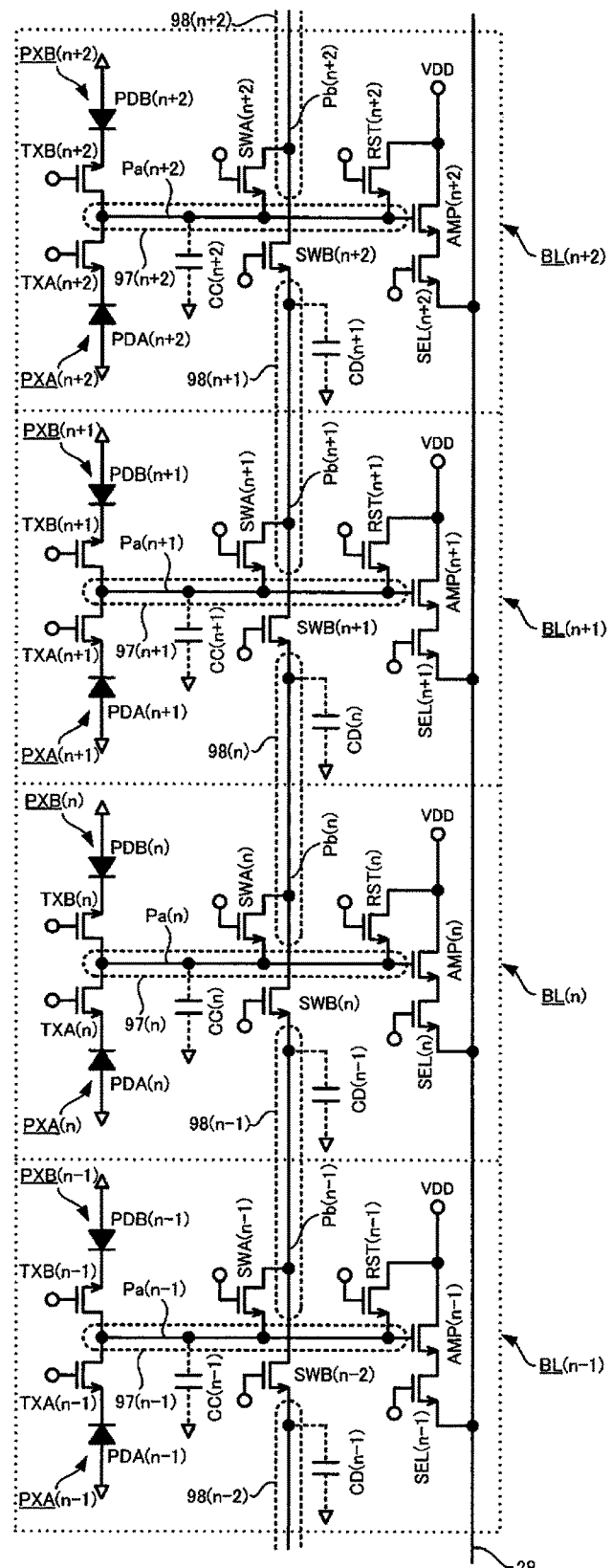

FIG. 14 is a circuit diagram corresponding to FIG. 2, schematically illustrating the structure of a solid-state image sensor 94 in the electronic camera achieved in the fourth embodiment of the present invention. FIG. 15 is a circuit diagram corresponding to that in FIG. 3, which shows in an enlargement an area that includes four pixel blocks BL disposed at consecutive positions along the columnar direction in FIG. 14. In FIG. 14 and FIG. 15, the same reference signs are assigned to elements identical to or corresponding to elements shown in FIG. 2 and FIG. 3, so as to preclude the necessity for a repeated explanation thereof. The features distinguishing the current embodiment from the first embodiment are described below.

The embodiment is distinguishable from the first embodiment in that it does not include the first linking transistors SWa, the second linking transistors SWb and the wirings 71 and 72 and instead includes first transistors SWA each constituting a first switch unit via which a first node Pa and a second node Pb corresponding to the first node Pa are electrically connected with each other and disconnected from each other, second transistors SWB each constituting a second switch unit via which two second nodes Pb are electrically connected with each other and disconnected from each other and wirings 97 and 98.

The first node Pa(n) in a pixel block BL(n) is equivalent to the node P(n) in the first embodiment. The transfer transistor TXA(n) transfers an electric charge to the first node Pa(n) from the photodiode PDA(n), whereas the transfer transistor TXB(n) transfers an electric charge to the first node Pa(n) from the photodiode PDB(n). A capacitance (charge/voltage conversion capacitance) is formed at the first node Pa(n) in relation to a reference electric potential, and the charge transferred to the first node Pa(n) is converted to a voltage with the capacitance thus formed. The amplifier transistor AMP(n) outputs a signal corresponding to the electric potential at the first node Pa(n). The reset transistor RST(n) resets the electric potential at the node Pa(n). These features are also adopted in pixel blocks BL in other rows.

A first transistor SWA(n) constitutes the first switch unit via which the first node Pa(n) and the corresponding second node Pb(n) are electrically connected with each other and disconnected from each other. While such a first switch unit may be constituted by combining a plurality of switches such as transistors, it is desirable to configure it with a single first transistor SWA(n), as in the embodiment, so as to simplify the structure. This concept applies to other first transistors SWA as well.

Each second transistor SWB constitutes a second switch unit disposed so that the second node Pb corresponding to the first node Pa in one of each two pixel blocks BL, adjacent to each other along the columnar direction among the pixel blocks BL, and the second node Pb corresponding to the first node Pa in the other pixel block BL in the pair are electrically connected with each other and disconnected from each other via the second switch unit. As a result, the first nodes Pa in three or more pixel blocks BL are connected in a string via a plurality of second switch units in the embodiment. While such a second switch unit may be constituted by combining a plurality of switches such as transistors, it is desirable to configure it with a single second transistor SWB, as in the embodiment, so as to simplify the structure.

A second transistor SWB(n), for instance, is disposed so that the second node Pb(n) corresponding to the first node Pa(n) in a pixel block BL(n) in the nth row and the second node Pb(n−1) corresponding to the first node P(n−1) in the adjacent pixel block BL(n−1) in the (n−1)th row are electrically connected with each other and disconnected from each other via the second transistor SWB(n). Other second transistors SWB are disposed in a similar manner.

The gate electrode of the amplifier transistor AMP(n), the source area of the reset transistor RST(n), the drain diffusion area shared by the transfer transistors TXA(n) and TXB(n) and the source diffusion area of the first transistor SWA(n) in the pixel block BL(n) are electrically connected with one another via a wiring 97(*n*) so as to achieve electric continuity. The first node Pa(n) is equivalent to the wiring 97(*n*) and the overall region through which electric continuity is achieved through the electrical connection sustained via the wiring 97(*n*). These features are also adopted in pixel blocks BL in other rows.

The drain diffusion area of the first transistor SWA(n), the drain diffusion area of the second transistor SWB(n) and the source diffusion area of the second transistor SWB(n+1) are electrically connected with one another via the wiring 97(*n*) so as to achieve electric continuity. The second node Pb is equivalent to the wiring 98(*n*) and the overall region through which electric continuity is sustained through the electrical connection achieved via the wiring 98(*n*). These features are also adopted in conjunction with other first transistors SWA and other second transistors SWB.

The gates of the first transistors SWA in each row are commonly connected to a control line 95 to which a control signal øSWA is provided from the vertical scanning circuit 21. The gates of the second transistors SWB in each row are commonly connected to a control line 96 to which a control signal øSWB is provided from the vertical scanning circuit 21, CC(n) in FIG. 14 and FIG. 15 indicates the capacitance between the first node Pa(n) and the reference electric potential when the first transistor SWA(n) in the corresponding pixel block is in the off state. Cfd1' represents the capacitance value of the capacitance CC(n). CD(n) indicates the capacitance between the wiring 98(*n*) and the reference electric potential when the first transistor SWA(n) and the second transistors SWB(n) and SWb(n+1) are in the off state. Cfd2' represents the capacitance value of the capacitance CD(n). Similar notations are used for other first transistors SWA and other second transistors SWB.

The capacitance CC(n) is made up with the capacitance in the drain diffusion area shared by the transfer transistors TXA(n) and TXB(n), the capacitance in the source diffusion area of the reset transistor RST(n), the capacitance in the source diffusion area of the first transistor SWA(n), the capacitance at the gate electrode of the amplifier transistor AMP(n) and the wiring capacitance at the wiring 97(*n*), and the capacitance value Cfd1' of the capacitance CC(n) equals the total sum of their capacitance values. This principle also applies to other rows of pixel blocks BL.

It is to be noted that since the capacitance in the source diffusion area of the second transistor SWB(n) is not included in the capacitance CC(n), the capacitance CC(n) takes a smaller capacitance value Cfd1'. In contrast, the capacitance CB in the first embodiment, which includes the capacitance in the drain diffusion area 48 of the linking transistor SWb(n−1) as well as the capacitance in the source diffusion area 46 of the linking transistor SWa(n), takes a greater capacitance value Cfd1. In other words, the capacitance value Cfd1' in the current embodiment is smaller than the capacitance value Cfd1 in the first embodiment by an extent corresponding to one transistor diffusion capacitance.

The value assumed for the channel capacitance when the first transistor SWA is in the on state and the value assumed for the channel capacitance when the second transistor SWB is in the on state are both notated as Csw. The capacitance value Csw is normally smaller than the capacitance values Cfd1' and Cfd2'.

Figure 16:
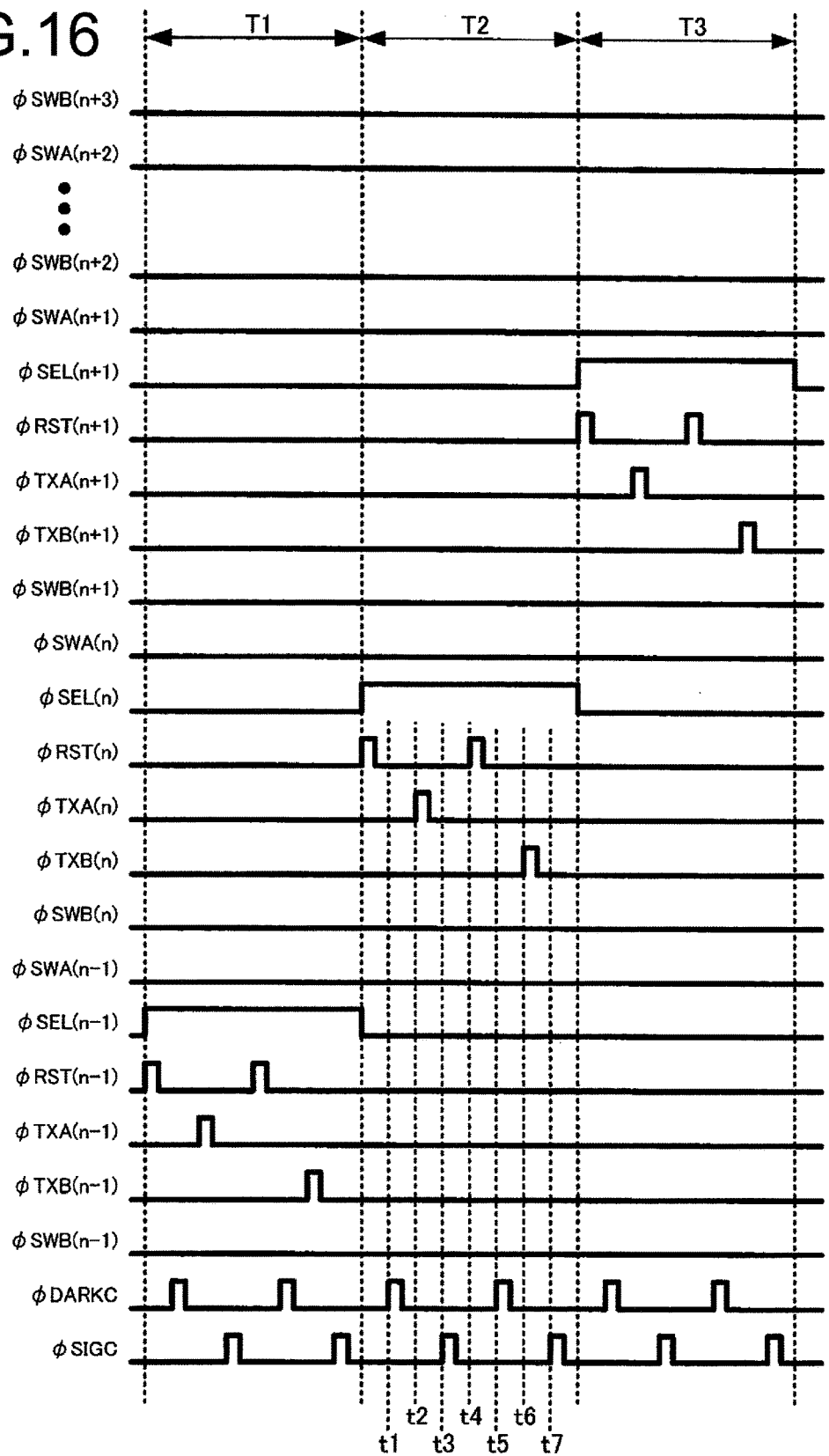
FIG. 16 A timing chart pertaining to a specific operation mode that may be selected in the solid-state image sensor shown in FIG. 14

When the first transistor SWA(n) in a pixel block BL(n) is turned off (i.e., a transistor in the on state among the various first transistors SWA and second transistors SWB, does not achieve electrical connection to the first node Pa(n)), the capacitance (charge/voltage conversion capacitance) between the first node Pa(n) and the reference electric potential is the capacitance CC(n). The capacitance value of the charge/voltage conversion capacitance at the first node Pa(n) is thus Cfd1'. This state is equivalent to the state that occurs during the period T2 in FIG. 16 illustrating a first operation mode, which will be described later.

Figure 17:
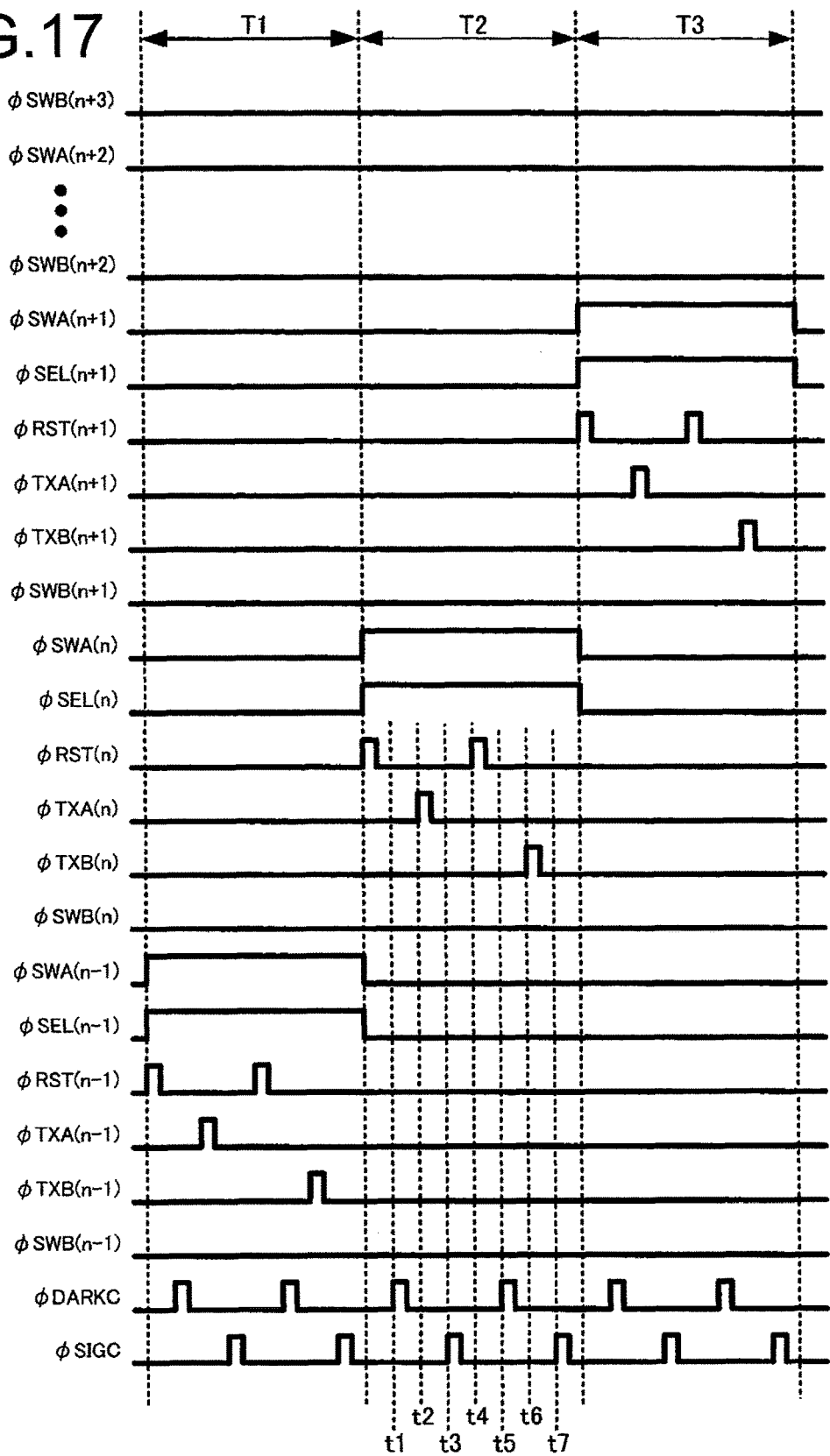
FIG. 17 A timing chart pertaining to another operation mode that may be selected in the solid-state image sensor shown in FIG. 14

In addition, when the first transistor SWA(n) in the pixel block BL(n) is turned on, the capacitance (charge/voltage conversion capacitance) between the first node Pa(n) and the reference electric potential equals a sum calculated by adding the capacitance CD(n) and the channel capacitance of the first transistor SWA(n) in the on state to the capacitance CC(n), unless a transistor in the on state other than the first transistor SWA(n), among the various first transistors SWA and second transistors SWB, enters a state of electrical connection to the first node Pa(n) (in more specific terms, if the second transistors SWB(n) and SWB(n+1) are in the off state). Under these circumstances, the capacitance value of the charge/voltage conversion capacitance at the first node Pa(n) is expressed as; Cfd1'+Cfd2'+Csw≈Cfd1'+Cfd2'. This state is equivalent to the state that occurs during the period T2 in FIG. 17 illustrating a second A operation mode, which will be described later.

Figure 18:
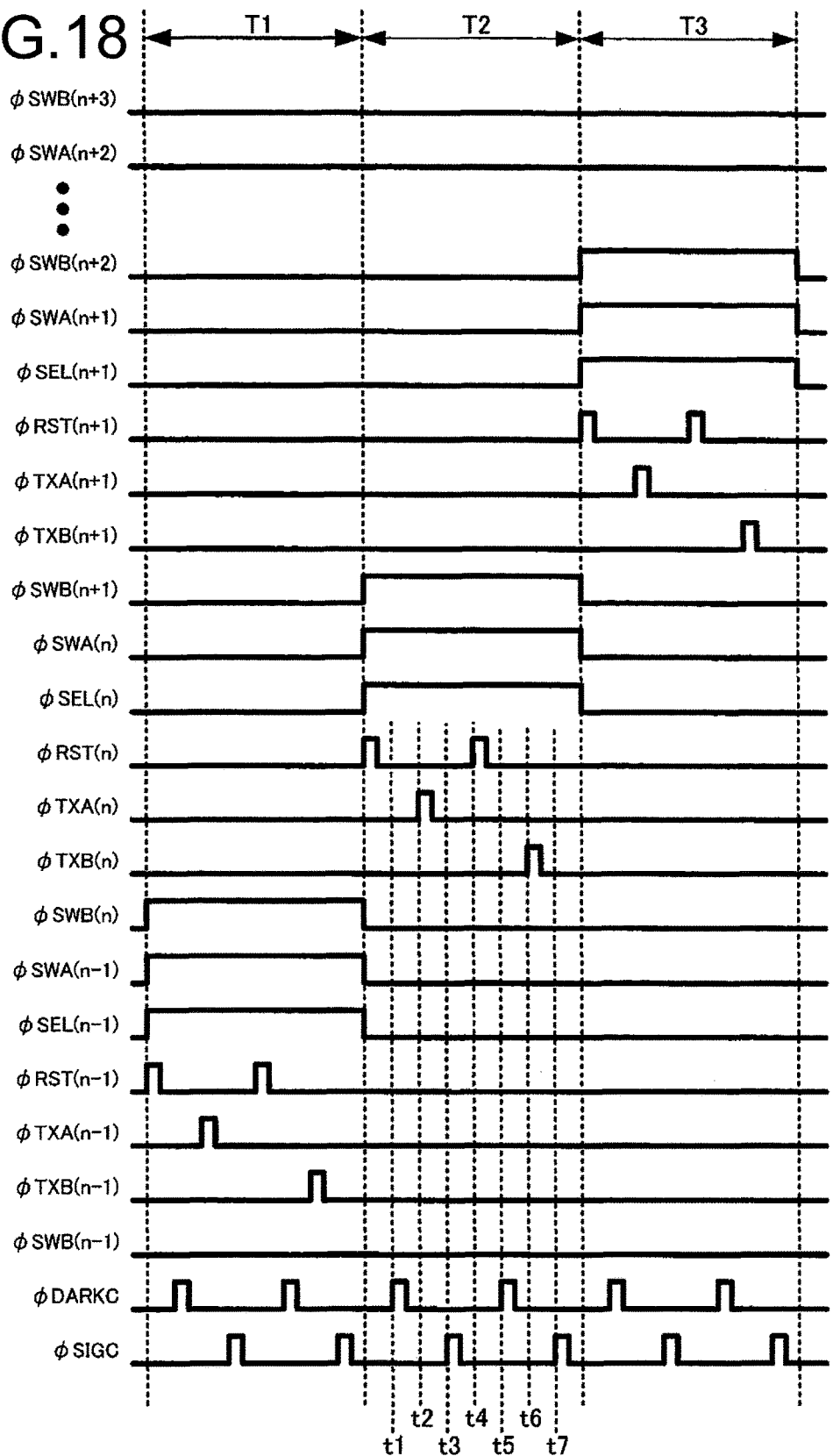
FIG. 18 A timing chart pertaining to yet another operation mode that may be selected in the solid-state image sensor shown in FIG. 14

Furthermore, when the first transistor SWA(n) and the second transistor SWB(n+1) are both turned on in relation to the pixel block BL(n), the charge/voltage conversion capacitance at the first node Pa(n) equals a sum calculated by adding the capacitance CD(n), the capacitance CD(n+1) and the channel capacitances of the transistors SWA(n) and SWB(n+1) in the on state to the capacitance CC(n), unless a transistor in the on state other than the transistors SWA(n) and SWB(n+1), among the various first transistors SWA and second transistors SWB, enters a state of electrical connection to the first node Pa(n) (in more specific terms, if the transistors SWB(n), SWA(n+1) and SWB(n+2) are in the off state). Accordingly, the capacitance value of the charge/voltage conversion capacitance at the first node Pa(n) is expressed as; Cfd1'+2×Cfd2'+2×Csw≈Cfd1'+2×Cfd2'. This state is equivalent to the state that occurs during the period T2 in FIG. 18 illustrating a second B operation mode, which will be described later.

Figure 19:
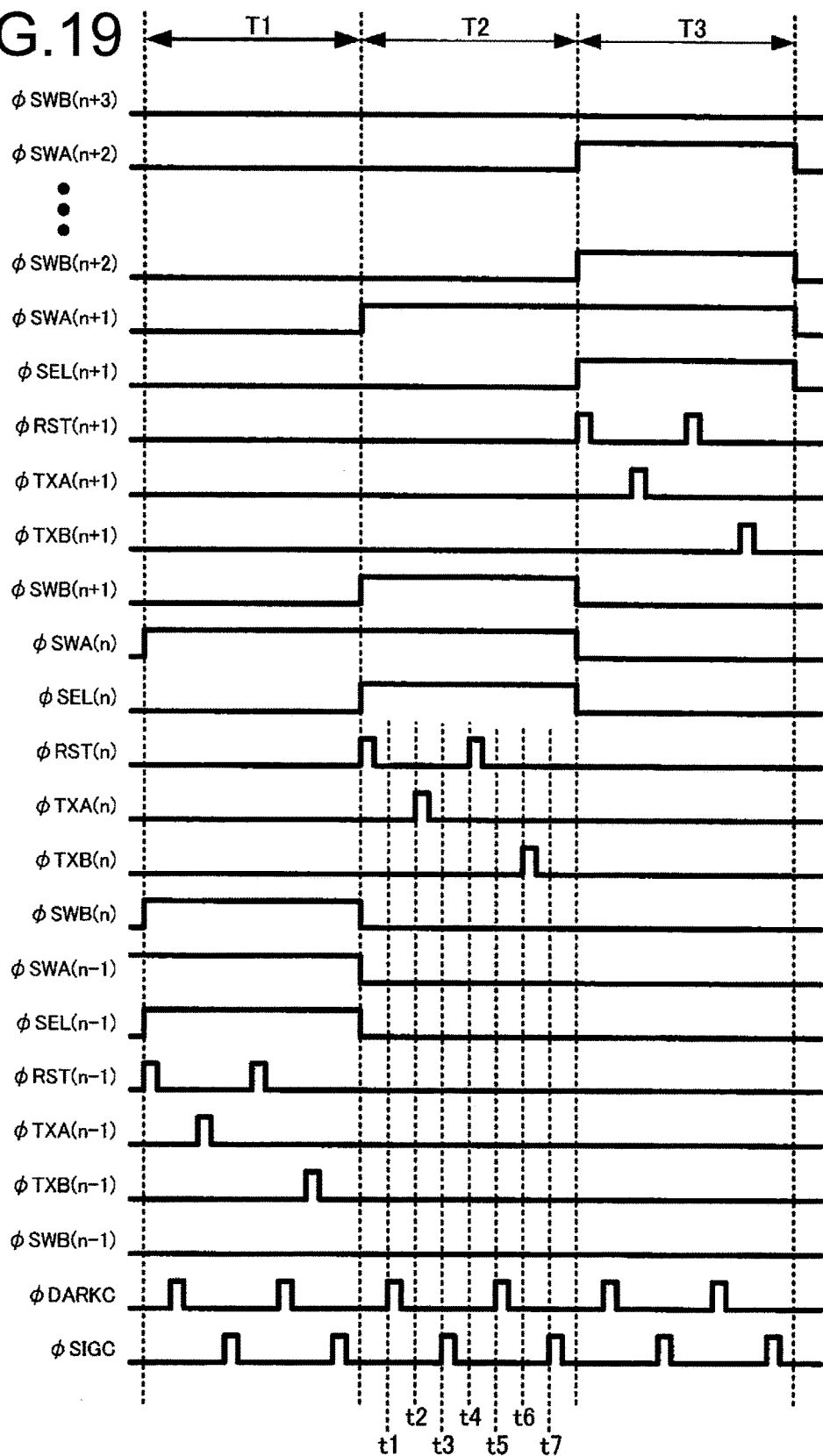
FIG. 19 A timing chart pertaining to still another operation mode that may be selected in the solid-state image sensor shown in FIG. 14

Moreover, when the first transistors SWA(n) and SWA(n+1) and the second transistor SWB(n+1) are turned on in relation to the pixel block BL(n), the charge/voltage conversion capacitance at the first node Pa(n) equals a sum calculated by adding the capacitance CD(n), the capacitance CD(n+1), the capacitance CC(n+1) and the channel capacitances of the transistors SWA(n), SWA(n+1) and SWB(n+1) in the on state to the capacitance CC(n), unless a transistor in the on state other than the transistors SWA(n), SWA(n+1) and SWB(n+1), among the various first transistors SWA and second transistors SWB enters a state of electrical connection to the first node Pa(n) (in more specific terms, if the transistors SWB(n) and SWB(n+2) are in the off state). Accordingly, the capacitance value of the charge/voltage conversion capacitance at the first node Pa(n) is expressed as; 2×Cfd1'+2×Cfd2'+3×Csw≈2×Cfd1'+2×Cfd2'. This state is equivalent to the state that occurs during the period T2 in FIG. 19 illustrating a second C operation mode, which will be described later.

Figure 20:
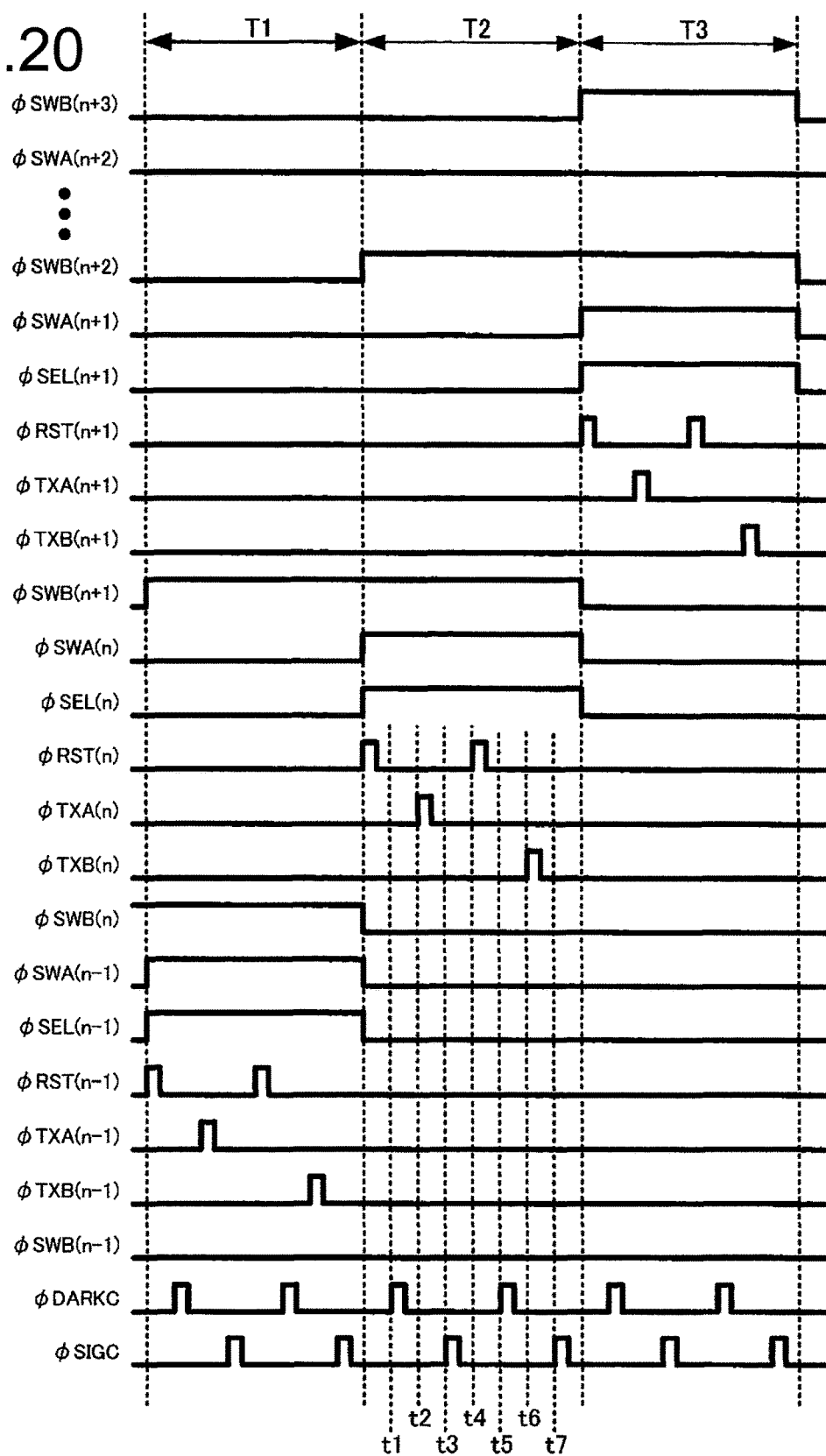
FIG. 20 A timing chart pertaining to still another operation mode that may be selected in the solid-state image sensor shown in FIG. 14

In addition, when the first transistor SWA(n) and the second transistors SWB(n+1) and SWB(n+2) are turned on in relation to the pixel block BL(n), the charge/voltage conversion capacitance at the first node Pa(n) equals a sum calculated by adding the capacitance CD(n), the capacitance CD(n+1), the capacitance CD(n+2) and the channel capacitances of the transistors SWA(n) and SWB(n+1) in the on state to the capacitance CC(n), unless a transistor in the on state other than the transistors SWA(n), SWB(n+1) and SWB(n+2), among the various first transistors SWA and second transistors SWB, enter a state of electrical connection to the first node Pa(n) (in more specific terms, if the transistors SWA(n+1), SWA(n+2), SWB(n) and SWB(n+3) are in the off state). Accordingly, the capacitance value of the charge/voltage conversion capacitance at the first node Pa(n) is expressed as; Cfd1'+3×Cfd2'+3×Csw≈Cfd1'+3×Cfd2'. This state is equivalent to the state that occurs during the period T2 in FIG. 20 illustrating a second C operation mode, which will be described later.

Thus, as long as there is no transistor in the on state that is electrically connected to the first node Pa(n), among the various first transistors SWA and second transistors SWB, the capacitance value of the charge/voltage conversion capacitance at the first node Pa(n) takes the smallest capacitance value Cfd1' and thus, a greater value is taken for the charge/voltage conversion coefficient corresponding to the charge/voltage conversion capacitance, thereby enabling a read at the highest possible SN ratio. In addition, since the capacitance value Cfd1' in this embodiment is smaller than the smallest capacitance value Cfd1 in the first embodiment by an extent corresponding to a single transistor diffusion capacitance as explained earlier, the charge/voltage conversion coefficient takes an even greater value and a read is enabled at an even higher SN ratio in comparison to the first embodiment.

In addition, the number of transistors in the on state that are electrically connected to the first node Pa(n), among the various first transistors SWA and second transistors SWB, may be increased to a desired value equal to or greater than 1 so as to raise the capacitance value of the charge/voltage conversion capacitance at the first node Pa(n) to a desired value and thus enable handling of a greater signal charge quantity, which, in turn, makes it possible to increase the number of saturation electrons. This ultimately makes it possible to increase the dynamic range.

While a description is given above in reference to the first node Pa(n) in a pixel block BL(n), the principle described above also applies to the first nodes Pa in other pixel blocks BL.

FIG. 16 is a timing chart pertaining to the first operation mode that may be selected in the solid-state image sensor 94 shown in FIG. 14. In a typical example of an operation executed in the first operation mode, the pixel blocks BL are sequentially selected in units corresponding to the individual rows, the transfer transistors TXA and TXB in the selected pixel blocks BL are selectively turned on in sequence while there is no transistor in the on state that is electrically connected to the first node Pa in each selected pixel block BL (i.e., while the charge/voltage conversion capacitance at the particular first node Pa is at the lowest) among the various first transistors SWA and second transistors SWB, and signals from the photodiodes PDA and PDB in the selected pixel blocks BL are sequentially read out in correspondence to each row. While signals are read out from all the pixels PXA and PXB in the example presented in FIG. 16, the present invention is not limited to this example and signals may be read through a culled read (a sub-sampling read) by skipping some pixel rows. Such a culled read may be executed in the examples presented in FIG. 17 through FIG. 20.

Since the operation executed in the first operation mode shown in FIG. 16 can be easily understood based upon the description already provided, a detailed explanation is not given.

FIG. 17 is a timing chart pertaining to the second A operation mode that may be selected in the solid-state image sensor 94 shown in FIG. 14. The second A operation mode is a type of second operation mode. In this second operation mode, the pixel blocks BL are sequentially selected in units of individual rows, and the transfer transistors TXA and TXB in each selected pixel block BL are selectively turned on in sequence while a predetermined number of at least one transistor in the on state, among the various first transistors SWA and second transistors SWB, is electrically connected to the first node Pa in the selected pixel block BL so as to sequentially read out signals output from the photodiodes PDA and PDB in the selected pixel blocks BL in units of the individual rows. In the second A operation mode, which is a type of second operation mode, the predetermined number is set to 1 (one of the first transistors SWA is in the on state).

Since the operation executed in the second A operation mode shown in FIG. 17 can be easily understood based upon the description already provided, a detailed explanation is not given.

FIG. 18 is a timing chart pertaining to the second B operation mode that may be selected in the solid-state image sensor 94 shown in FIG. 14. The second B operation mode is another type of second operation mode in which the predetermined number is set to 2 (one of the first transistors SWA and one of the second transistors SWB are in the on state). Since the operation executed in the second B operation mode shown in FIG. 18 can be easily understood based upon the description already provided, a detailed explanation is not given.

FIG. 19 is a timing chart pertaining to the second C operation mode that may be selected in the solid-state image sensor 94 shown in FIG. 14. The second C operation mode is yet another type of second operation mode in which the predetermined number is set to 3 (two first transistors SWA and one of the second transistors SWB are in the on state). Since the operation executed in the second C operation mode shown in FIG. 19 can be easily understood based upon the description already provided, a detailed explanation is not given.

FIG. 20 is a timing chart pertaining to the second D operation mode that may be selected in the solid-state image sensor 94 shown in FIG. 14. The second D operation mode is yet another type of second operation mode in which the predetermined number is set to 3 (one of the first transistors SWA and two second transistors SWB are in the on state). Since the operation executed in the second D operation mode shown in FIG. 20 can be easily understood based upon the description already provided, a detailed explanation is not given.

As does the first embodiment, the current embodiment makes it possible to expand the dynamic range and improves the SN ratio for high-sensitivity read over the comparison example. In addition, the current embodiment achieves an even greater charge/voltage conversion coefficient in comparison to the first embodiment and thus, a high-sensitivity read at an even higher SN ratio is enabled.

While a second transistor SWB is disposed between each pair of second nodes Pb taking consecutive positions along the columnar direction in the embodiment, the present invention is not limited to this example. For instance, the area between an (r+1)th second node Pb (r is an integer equal to or greater than 2) among second nodes Pb set side-by-side along the columnar direction and a second node Pb located directly below the second node Pb in the figure, may be held in an open state at all times without disposing a second transistor SWB between them. In such a case, if r is smaller, the maximum value that may be taken for the predetermined number set in the second operation mode will be lowered and the extent to which the dynamic range is expanded will thus decrease. However, the SN ratio for high-sensitivity read can be improved over the comparison example described earlier. In addition, the area between an (s+1)th second node Pb (s is an integer equal to or greater than 1) among second nodes Pb set side-by-side along the columnar direction and a second node Pb located directly below the second node Pb in the figure, may be electrically shorted without disposing a second transistor SWB between them. As a further alternative, a second transistor SWB may be disposed only between an (u+1)th second node Pb (u is an integer equal to or greater than 1) among second nodes Pb set side-by-side along the columnar direction and a second node Pb directly below the second node Pb in the figure, with the region between each second node Pb other than the (u+1)th second node Pb, among the second nodes Pb set along the columnar direction and a second node Pb directly below the particular second node Pb in the figure in an electrically shorted state.

It is to be noted that an adjustment capacitance such as that in the second embodiment, may be disposed in each wiring 98 in the current embodiment. In addition, the capacitance value for the capacitance CD may be set within a range of ±20% of the capacitance value of the capacitance CC or within a range of +10% of the capacitance value of the capacitance CC in this embodiment. These measures are also applicable to the fifth embodiment, to be described in detail later.

It is to be noted that in the various operational examples described in reference to FIGS. 16 through 20, the signal charge at the photodiode PD in each pixel PX is read out separately without combining it with the signal charge at the photodiode PD in another pixel PX. However, the present invention is not limited to these operational examples, and the signal charge at a photodiode PD in each pixel PX may be read out in combination with the signal charge at a photodiode PD in another pixel PX of the same color.

For instance, by turning on the first transistors SWA(n−1), SWA(n) and SWA(n+1) and the second transistors SWB(n) and SWB(n+1) so as to connect the first nodes Pa(n−1), Pa(n) and Pa(n+1) with one another and simultaneously turning on TXA(n−1), TXA(n) and TXA(n+1), the signal charges at the photodiodes PDA(n−1), PDA(n) and PDA(n−1) at the three pixels PXA(n−1), PXA(n) and PXA(n−1) assuming the same color in a Bayer array or the like will be averaged through the first nodes Pa(n−1), Pa(n) and Pa(n+1) linked with one another, thereby achieving a same-color, three pixel combined read function. In this situation, the number of first or second transistors in the on state that are electrically connected to the first nodes Pa(n−1), Pa(n) and Pa(n+1) may be minimized by turning off the second transistors SWB(n−2) and SWB(n+2) so as to minimize the charge/voltage conversion capacitance at the linked first nodes Pa(n−1), Pa(n) and Pa(n+1) and thus enable a same-color, three pixel combined read operation at the highest possible SN ratio. In addition, by allowing at least one more transistor in the on state among the various first transistors SWA and second transistors SWB to electrically connect with the first nodes Pa(n−1), Pa(n) and Pa(n+1), as well as to the first transistors SWA(n−1), SWA(n) and SWA(n+1) and the second transistors SWB(n) and SWB(n+1) to electrically connect to the first nodes Pa(n−1), Pa(n) and Pa(n+1), an increase in the charge/voltage conversion capacitance at the linked first nodes Pa(n−1), Pa(n) and Pa(n+1), corresponding to the number of additional transistors, is achieved and as a result, the dynamic range for the same-color, three pixel combined read can be expanded.

Fifth Embodiment

Figure 21:
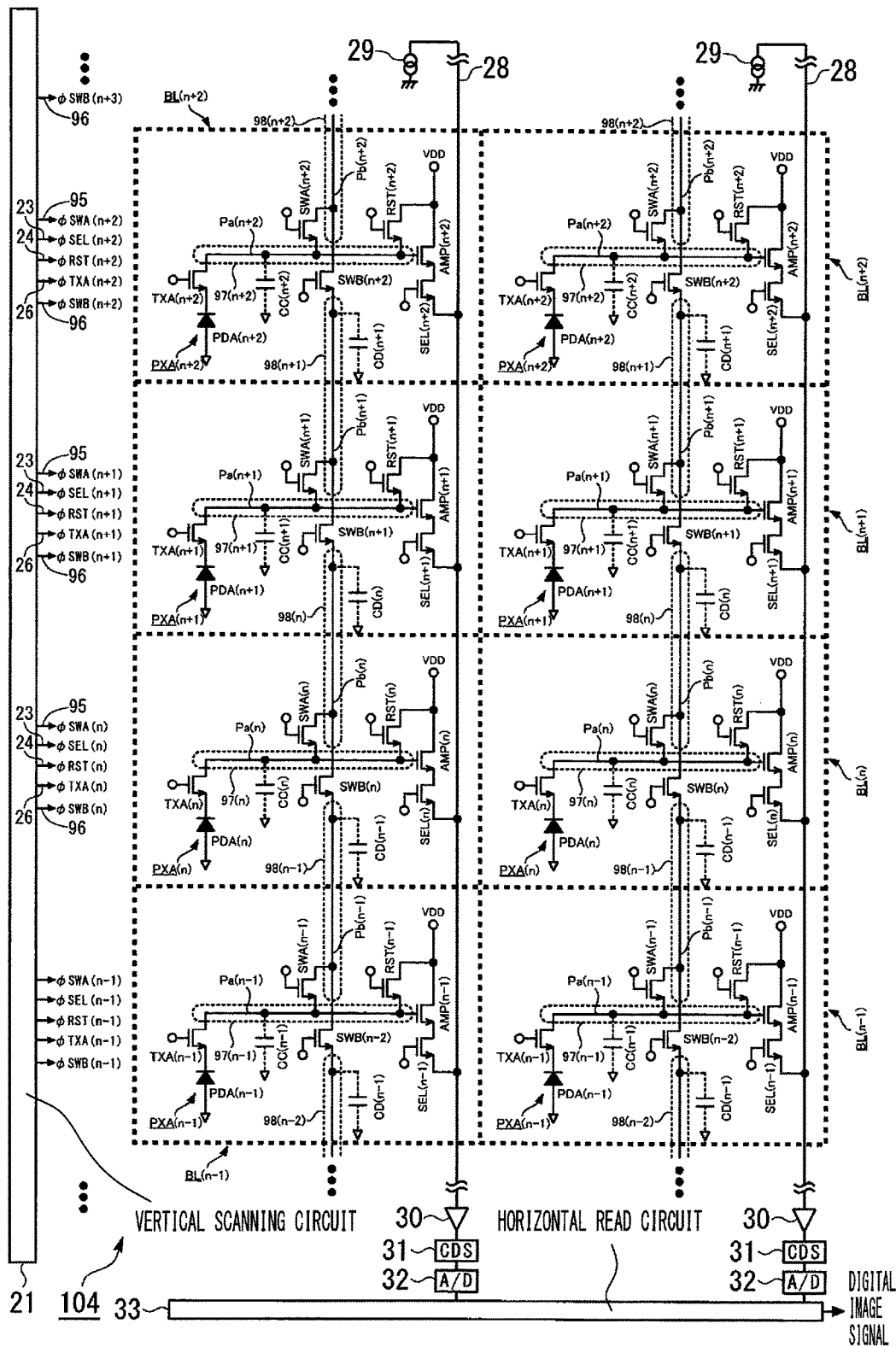
FIG. 21 A circuit diagram schematically illustrating the structure of a solid-state image sensor in the electronic camera achieved in a fifth embodiment of the present invention FIG. 22 A circuit diagram schematically illustrating the structure of the solid-state image sensor in FIG. 1

FIG. 21 is a circuit diagram corresponding to that in FIG. 14, schematically illustrating a solid-state image sensor 104 in the electronic camera achieved in the fifth embodiment of the present invention. In FIG. 21, the same reference signs are assigned to elements identical to or corresponding to those in FIG. 14, so as to preclude the necessity for a repeated explanation thereof.

The current embodiment differs from the fourth embodiment in that the photodiode PDB and the transfer transistor TXB disposed in each pixel block BL in the fourth embodiment are not provided and that each pixel block BL is thus made up with a pixel PXA. However, the photodiodes PDA in the embodiment are disposed with a columnar-direction density that is twice the columnar-direction density with which the photodiodes PDA are disposed in the fourth embodiment. In other words, the photodiodes PDA are disposed with a columnar-direction density matching that with which the photodiodes PDA and PDB are disposed along the columnar direction in the fourth embodiment. Thus, n indicates a specific row of pixel blocks BL and also a specific row of pixels PXA in the embodiment.

Namely, while each pixel block BL in the fourth embodiment is made up with two pixels PX (PXA and PXB), pixel blocks BL in the current embodiment are each made up with a single pixel (PXA). In addition, while the two pixels PX (PXA and PXB) in a pixel block BL share a set of elements, i.e., the first node Pa, the amplifier transistor AMP, the reset transistor RST and the selector transistor SEL, the set of elements, i.e., the first node Pa, the amplifier transistor AMP, the reset transistor RST and the selector transistor SEL, is provided for each pixel PX (PXA in the embodiment] in the current embodiment. The description of the fourth embodiment also serves as a description of the current embodiment basically by referring to pixel blocks BL as pixels PXA instead. Accordingly, the current embodiment will not be explained in detail.

Through the current embodiment, too, advantages and operations similar to those of the fourth embodiment are achieved.

Sixth Embodiment

Figure 22:
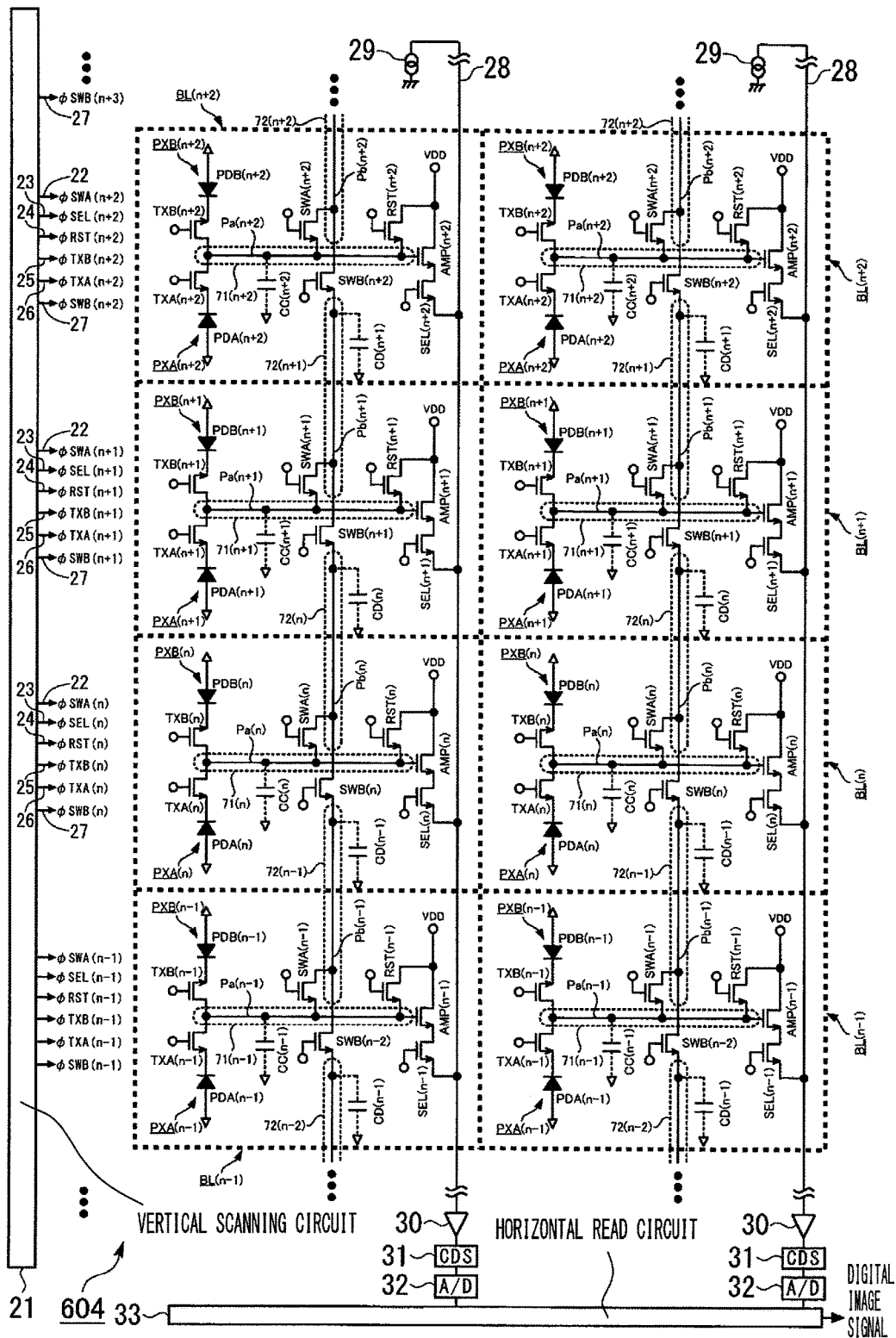
Figure 23:
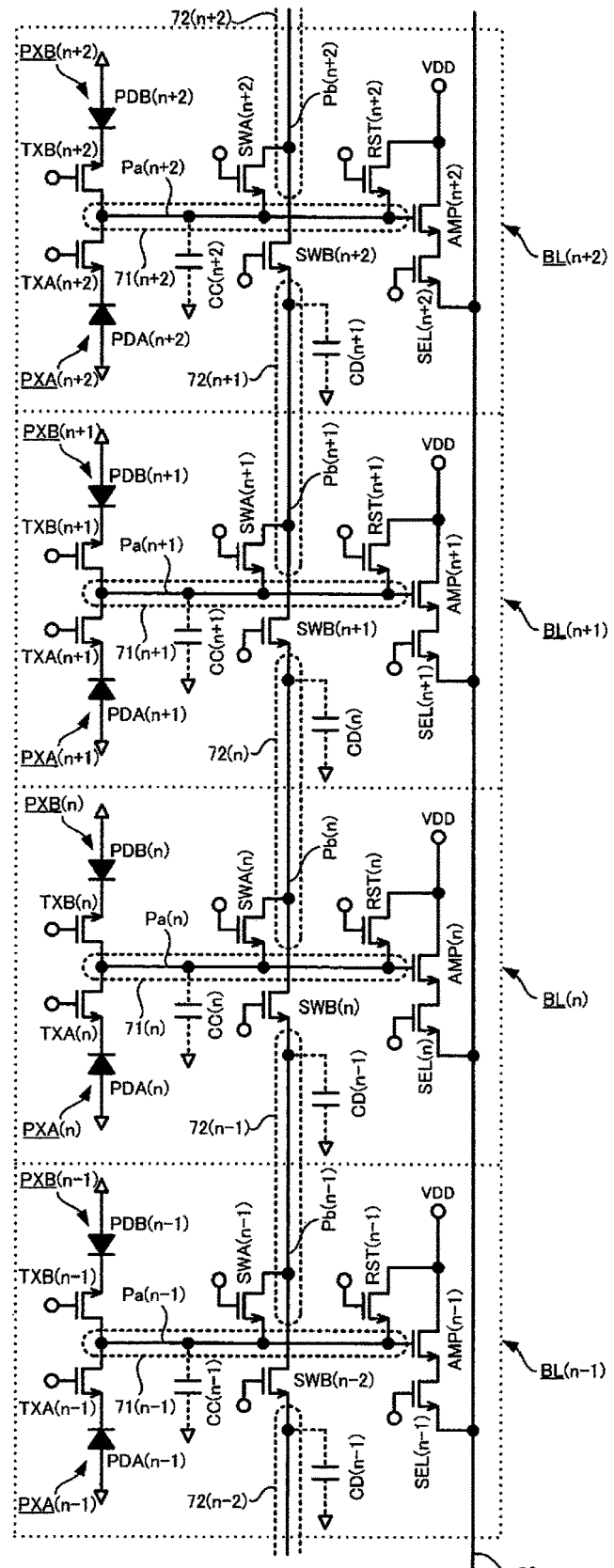
FIG. 23 A circuit diagram enlargement showing an area that includes four pixel blocks in FIG. 1

FIG. 22 is a circuit diagram schematically illustrating the structure of a solid-state image sensor 604 in the electronic camera achieved in the sixth embodiment of the present invention. FIG. 23 is a circuit diagram that shows in an enlargement an area that includes four pixel blocks BL disposed at consecutive positions along the columnar direction in FIG. 22. While the solid-state image sensor 604 in the embodiment is constituted with a CMOS solid-state image sensor, the present invention is not limited to this example and it may be constituted with another type of XY address solid-state image sensor. As shown in FIG. 22 and FIG. 23, the solid-state image sensor 604 includes pixel blocks BL disposed in a two-dimensional matrix pattern over N rows by M columns and each having two pixels PX (PXA, PXB), first transistors SWA, each constituting a first switch unit via which a first node Pa, to be described in detail later, and a second node Pb corresponding to the first node Pa are electrically connected with each other and disconnected from each other, second transistors SWB, each constituting a second switch unit via which two second nodes Pb are electrically connected with each other and disconnected from each other, a vertical scanning circuit 21, control lines 22 through 27 disposed in correspondence to each row of pixel blocks BL, a plurality of M vertical signal lines 28, each disposed to serve a specific column of pixels PX (in correspondence to a column of pixel blocks BL) through which signals output from the pixels PX (pixel blocks BL) in the corresponding columns are received, constant current sources 29, each disposed at one of the vertical signal lines 28, column amplifiers 30, CDS circuits (correlated double sampling circuits) 31 and A/D converters 32, each disposed in correspondence to one of the vertical signal lines 28, and a horizontal read circuit 33.

It is to be noted that the column amplifiers 30 may be analog amplifiers, or they may be amplifiers commonly referred to as switched capacitor amplifiers. In addition, it is not essential that the column amplifiers 30 be included in the configuration.

While M=2 in the configuration shown in FIG. 22 in order to simplify the illustration, the number of columns M is actually set to any value greater than 2. In addition, there are no limits imposed with regard to the number of rows N either. A pixel block BL in a given row is distinguished from a pixel block BL in another row by notating a pixel block BL in a jth row as BL(j). Similar notation rules apply to other elements and control signals to be described later. In FIG. 22 and FIG. 23, pixel blocks BL(n−1) through BL(n+2) disposed over four rows, an (n−1)th row through an (n+2)th row are shown.

It is to be noted that while the pixel located on the lower side in a pixel block BL in FIG. 22 and FIG. 23 is indicated with a reference sign PXA and the pixel located on the upper side in the pixel block BL in FIG. 22 and FIG. 23 is indicated with a reference sign PXB in the drawings so as to distinguish them from each other, they may both be simply referred to as pixels PX when they do not need to be distinguished from each other. In addition, while a photodiode disposed in correspondence to the pixel PXA is notated as PDA and a photodiode disposed in correspondence to the pixel PXB is notated as PDB so as to distinguish them from each other in the drawings, they may both be simply referred to as photodiodes PD when they do not need to be distinguished from each other. Likewise, while a transfer transistor disposed in correspondence to the pixel PXA is notated as TXA and a transfer transistor disposed in correspondence to the pixel PXB is notated as TXB so as to distinguish them from each other, they may both be simply referred to as transfer transistors TX when they do not need to be distinguished from each other. It is also to be noted that the photodiodes PD for the pixels PX are disposed in a two-dimensional matrix pattern over 2N rows by M columns in the embodiment.

Each pixel PX in the embodiment includes a photodiode PD used as a photoelectric conversion unit that generates a signal charge corresponding to incident light and accumulates the signal charge thus generated, and a transfer transistor TX used as a transfer switch via which the charge is transferred from the photodiode PD to a first node Pa.

In the embodiment, two pixels PX (PXA and PXB) with the photodiodes PD thereof disposed at consecutive positions along the columnar direction, among the plurality of pixels PX, form a block BL. As shown in FIGS. 22 and 23, the two pixels PX (PXA and PXB) belonging to a given pixel block BL share a set of components that include a first node Pa, an amplifier transistor AMP, a reset transistor RST and a selector transistor SEL. A capacitance (charge/voltage conversion capacitance) is formed at the first node Pa in relation to a reference electric potential, and the charge transferred to the first node Pa is converted to a voltage with the capacitance thus formed. The amplifier transistor AMP constitutes an amplifier unit that outputs a signal corresponding to the electric potential at the first node Pa. The reset transistor RST constitutes a reset switch via which the electric potential at the first node Pa is reset. The selector transistor SEL constitutes a selection unit used to select the particular pixel block BL. The two pixels PX (PXA and PXB) do not share a photodiode PD and a transfer transistor TX and instead a photodiode PD and a transfer transistor TX are disposed in correspondence to each pixel PX. n in FIG. 23 and FIG. 24 indicates a specific row of pixel blocks BL. For instance, a first-row pixel block BL is made up with a pixel PX (PXA) disposed in a first row and a pixel PX (PXB) disposed in a second row, and a second-row pixel block BL is made up with a pixel PX (PXA) disposed in a third row and a pixel PX (PXB) disposed in a fourth row.

The transfer transistor TXA(n) in a pixel block BL(n), for instance, transfers an electric charge from the photodiode PDA(n) to the first node Pa(n), whereas the transfer transistor TXB(n) in a pixel block BL(n) transfers an electric charge from the photodiode PDB(n) to the first node Pa(n). A capacitance (charge/voltage conversion capacitance) is formed at the first node Pa(n) in relation to the reference electric potential and the electric charge transferred to the first node Pa(n) is converted to a voltage with the capacitance. The amplifier transistor AMP(n) outputs a signal corresponding to the electric potential at the first node Pa(n). The reset transistor RST(n) resets the electric potential at the first node Pa(n). These features are adopted in pixel blocks BL in other rows as well.

It is to be noted that the present invention may be also adopted in a configuration in which a pixel block BL is formed with pixels PX with the photodiodes PD thereof disposed at three or more consecutive positions along the columnar direction.

Although not shown in the figures, a plurality of different types color filters, each allowing light with a different color component to be transmitted, are disposed in a predetermined colorimetric array (e.g., a Bayer array) on the light entry side of the photodiodes PD at the individual pixels PX in the embodiment. A pixel PX outputs an electric signal corresponding to a specific color through color separation achieved via its color filter.

The first transistor SWA(n) constitutes the first switch unit via which the first node Pa(n) and the corresponding second node Pb(n) are electrically connected with each other and disconnected from each other. While such a first switch unit may be constituted by combining a plurality of switches such as transistors, it is desirable to configure it with a single first transistor SWA(n), as in the embodiment, so as to simplify the structure. This concept applies to other first transistors SWA as well.

Each second transistor SWB constitutes a second switch unit disposed so that the second node Pb corresponding to the first node Pa in one of each two pixel blocks BL adjacent to each other along the columnar direction among the pixel blocks BL and the second node Pb corresponding to the first node Pa in the other pixel block BL in the pair are electrically connected with each other and disconnected from each other via the second switch unit. As a result, the first nodes Pa in three or more pixel blocks BL are connected in a string via a plurality of second switch units in the embodiment. While such a second switch unit may be constituted by combining a plurality of switches such as transistors, it is desirable to configure it with a single second transistor SWB, as in the embodiment, so as to simplify the structure.

A second transistor SWB(n), for instance, is disposed so that the second node Pb(n) corresponding to the first node Pa(n) in a pixel block BL(n) in the nth row and the second node Pb(n−1) corresponding to the first node Pa(n−1) in the adjacent pixel block BL(n−1) in the (n−1)th row are electrically connected with each other and disconnected from each other via the second transistor SWB(n). Other second transistors SWB are disposed in a similar manner.

The gate electrode of the amplifier transistor AMP(n), the source area of the reset transistor RST(n), the drain diffusion area shared by the transfer transistors TXA(n) and TXB(n) and the source diffusion area of the first transistor SWA(n) in the pixel block BL(n) are electrically connected with one another via a wiring $71(n)$ so as to achieve electric continuity. The first node Pa(n) is equivalent to the wiring $71(n)$ and the overall region through which electric continuity is sustained through the electrical connection achieved via the wiring $71(n)$. These features are also adopted in pixel blocks BL in other TOWS.

The drain diffusion area of the first transistor SWA(n), the drain diffusion area of the second transistor SWB(n) and the source diffusion area of the second transistor SWB(n+1) are electrically connected with one another via a wiring $72(n)$ so as to achieve electric continuity. The second node Pb(n) is equivalent to the wiring $72(n)$ and the overall region through which electric continuity is sustained through the electrical connection achieved via the wiring $72(n)$. These features are also adopted in conjunction with other first transistors SWA and other second transistors SWB.

VDD in FIG. 22 and FIG. 23 indicates a source electric potential. It is to be noted that the transistors TXA, TXB, AMP, RST, SEL, SWA and SWB are each constituted with an nMOS transistor in the embodiment.

The gates of the transfer transistors TXA in each row are commonly connected to the control line 26, to which a control signal øTXA is provided from the vertical scanning circuit 21. The gates of the transfer transistors TXB in each row are commonly connected to the control line 25, to which a control signal øTXB is provided from the vertical scanning circuit 21. The gates of the reset transistors RST in each row are commonly connected to the control line 24, to which a control signal øRST is provided from the vertical scanning circuit 21. The gates of the selector transistors SEL in each row are commonly connected to the control line 23, to which a control signal øSEL is provided from the vertical scanning circuit 21. The gates of the first transistors SWA in each row are commonly connected to the control line 22, to which a control signal øSWA is provided from the vertical scanning circuit 21. The gates of the second transistors SWB in each row are commonly connected to the control line 27, to which a control signal øSWB is provided from the vertical scanning circuit 21, The control signal øTXA(n), for instance, is supplied to the gates of the transfer transistors TXA(n), the control signal øTXB(n) is supplied to the gates of the transfer transistors TXB(n), the control signal øRST(n) is supplied to the gates of the reset transistors RST(n), the control signal øSEL(n) is supplied to the gates of the selector transistors SEL(n), the control signal øSWA(n) is supplied to the gates of the first transistors SWA(n) and the control signal øSWB(n) is supplied to the gates of the second transistors SWB(n).

The transistors TXA, TXB, RST, SEL, SWA and SWB are turned on when the corresponding control signals øTXA, øTXB, øRST, øSEL, øSWA and øSWB are at high level (H) and are turned off when the corresponding control signals are at low level (L).

Under control executed by the image-capturing control unit 5 shown in FIG. 1, the vertical scanning circuit 21 outputs the control signals øTXA, øTXB, øRST, øSEL, øSWA and øSWB for each row of pixel blocks BL so as to achieve a still image read operation, a video read operation or the like by controlling the pixel blocks BL, the first transistors SWA and second transistors SWB with the control signals. Under this control, a read operation is executed in a specific operation mode among various operation modes to be described later, in correspondence to, for instance, the value set for the ISO sensitivity. Through the control, signals (analog signals) from the pixels PX in the corresponding column are provided to each vertical signal line 28.

The vertical scanning circuit 21 in the embodiment, shown in FIG. 22, constitutes a control unit that executes operation by switching to a specific operation mode among the various operation modes to be described above in response to a command (control signal) issued by the image-capturing control unit 5.

The signals read out to the vertical signal line 28 corresponding to each column are amplified at the column amplifier 30 and then undergo processing executed at the CDS circuit 31 to obtain the difference between a light signal (a signal containing optical information resulting from the photoelectric conversion at a pixel PX) and a dark signal (a differential signal containing a noise component to be subtracted from the light signal) and are then converted to digital signals at the A/D converter 32. The digital signals resulting from the conversion are held in the A/D converter 32. The digital image signals held at the individual A/D converters 32 are horizontally scanned by the horizontal read circuit 33, are converted as needed to a predetermined signal format and are output to an external recipient (the digital signal-processing unit 6 in FIG. 22), It is to be noted that the CDS circuit 31 receives a dark signal sampling signal øDARKC from a timing generation circuit (not shown) under control executed by the image-capturing control unit 5 shown in FIG. 1 and samples signals output from the column amplifier 30 as dark signals when øDARKC is at high level (H) and that the CDS circuit 31 receives a light signal sampling signal øSIGC from the timing generation circuit under control executed by the image-capturing control unit 5 in FIG. 1 and samples signals output from the column amplifier 30 as light signals when øSIGC is at H. Then, based upon a clock and a pulse provided from the timing generation circuit, the CDS circuit 31 outputs signals corresponding to the differences between the sampled dark signals and light signals. Such a CDS circuit 31 may adopt a structure of the known art.

CC(n) in FIGS. 22 and 23 is a capacitance formed between each first node Pa(n) and the reference electric potential when the corresponding first transistors SWA(n) are in the off state. Cfd1 indicates the capacitance value of the capacitance CC(n). CD(n) is a capacitance formed between the corresponding second node Pb(n) and a reference electric potential when the first transistor SWA(n) and second transistors SWB(n) and SWB(n+1) are in the off state. Cfd2 indicates the capacitance value of the capacitance CD(n). Similar notations are applied with regard to other first transistors SWA and other second transistors SWB.

The capacitance CD(n) is made up with the wiring capacitance of the wiring 72(n), the capacitance of the drain diffusion area of the first transistor SWA(n), the capacitance of the drain diffusion area of the second transistor SWB(n) and the capacitance of the source diffusion area of the second transistor SWB(n+1). The capacitances of the source fusion areas and the drain diffusion areas of transistors are affected by a change in the dimensions of the depletion layers resulting from a change in the voltage applied, and thus, CD(n) takes on a different capacitance value Cfd2 when the voltage applied to CD(n) changes. However, the capacitance in the drain diffusion area of the first transistor SWA(n), the capacitance in the drain diffusion area of the second transistor SWB(n) and the capacitance in the source diffusion area of the second transistor SWB(n+1) are relatively small in comparison to the wiring capacitance at the wiring 72(n), and for this reason, the extent of change occurring in the capacitance value Cfd2 of CD(n) when the voltage applied to CD(n) changes can be disregarded. In other words, the extent of voltage dependency can be disregarded with respect to the capacitance value Cfd2 of CD(n).

The capacitance CC(n) is made up with the capacitance in the drain diffusion area shared by the transfer transistors TXA(n) and TXB(n), the capacitance in the source diffusion area of the reset transistor RST(n), the capacitance in the source diffusion area of the first transistor SWA(n), the capacitance at the gate electrode of the amplifier transistor AMP(n) and the wiring capacitance at the wiring 71(n), and the capacitance value Cfd1 of the capacitance CC(n) equals the total sum of their capacitance values. Since the capacitances in the source diffusion areas of the transistors and the capacitance at a gate electrode are affected by a change in the dimensions of the depletion layers resulting from a change in the voltage applied, the capacitance value Cfd1 of the capacitance CC(n) has voltage dependency. This principle also applies to other rows of pixel blocks BL. It is to be noted that since the capacitance in the source diffusion area of the second transistor SWB(n) is not part of the capacitance CC(n), the capacitance CC(n) assumes a capacitance value Cfd1 smaller by the extent corresponding to the capacitance in the source diffusion area of the second transistor SWB(n).

The value assumed for the channel capacitance when the first transistor SWA is in the on state and the value assumed for the channel capacitance when the second transistor SWB is in an on state are both notated as Csw. The capacitance value Csw is normally smaller than the capacitance values Cfd1 and Cfd2.

Figure 24:
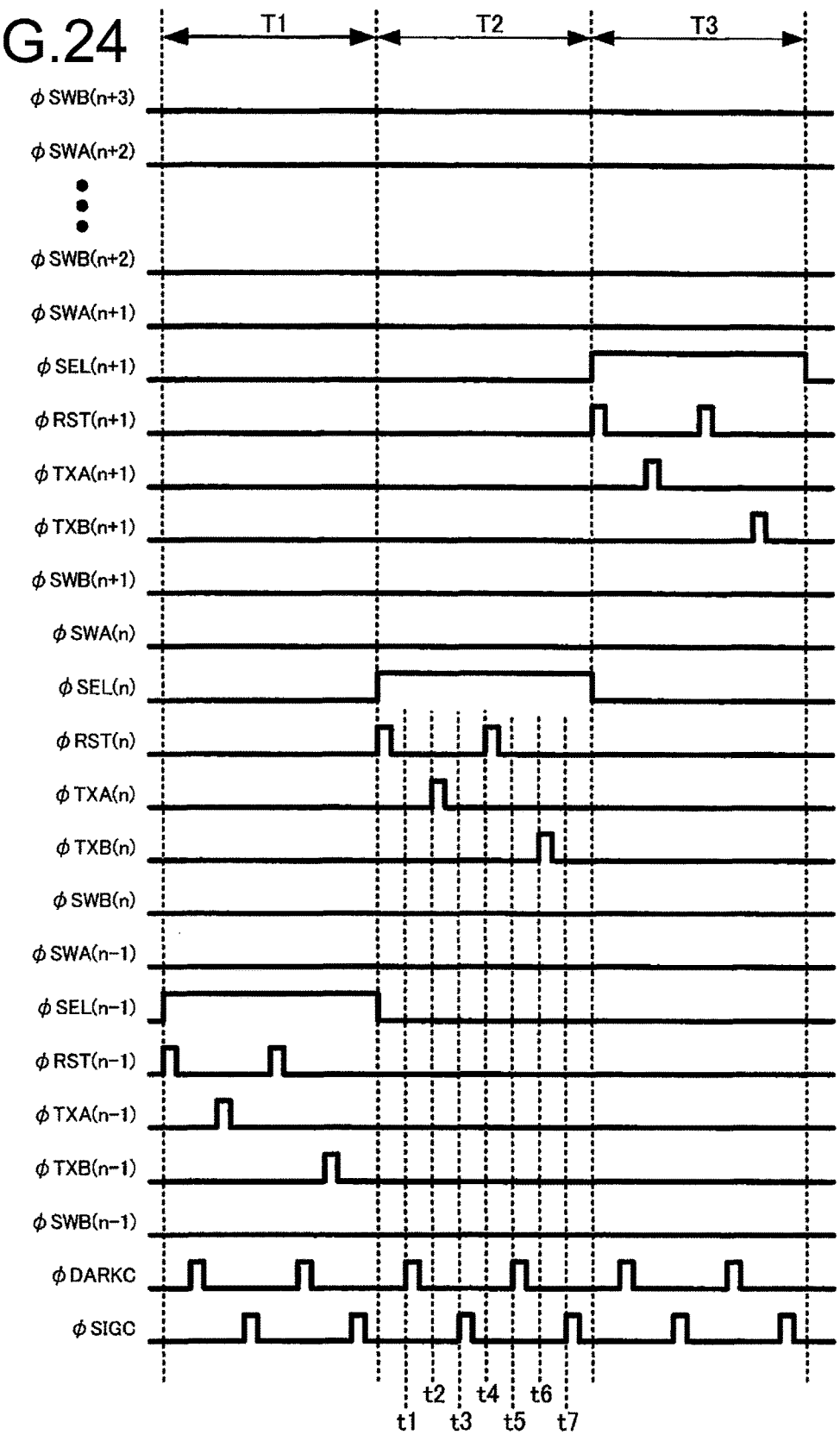
FIG. 24 A timing chart pertaining to a specific operation mode that may be selected in the solid-state image sensor shown in FIG. 22

When the first transistor SWA(n) in a pixel block BL(n) is turned off (i.e., a transistor in an on state among the various first transistors SWA and second transistors SWB does not achieve an electrical connection to the first node Pa(n)), the capacitance (charge/voltage conversion capacitance) between the first node Pa(n) and the reference electric potential is the capacitance CC(n). The capacitance value of the charge/voltage conversion capacitance at the first node Pa(n) is thus Cfd1. This state is equivalent to the state that occurs during the period T2 in FIG. 24 illustrating a first operation mode, which will be described later.

Figure 26:
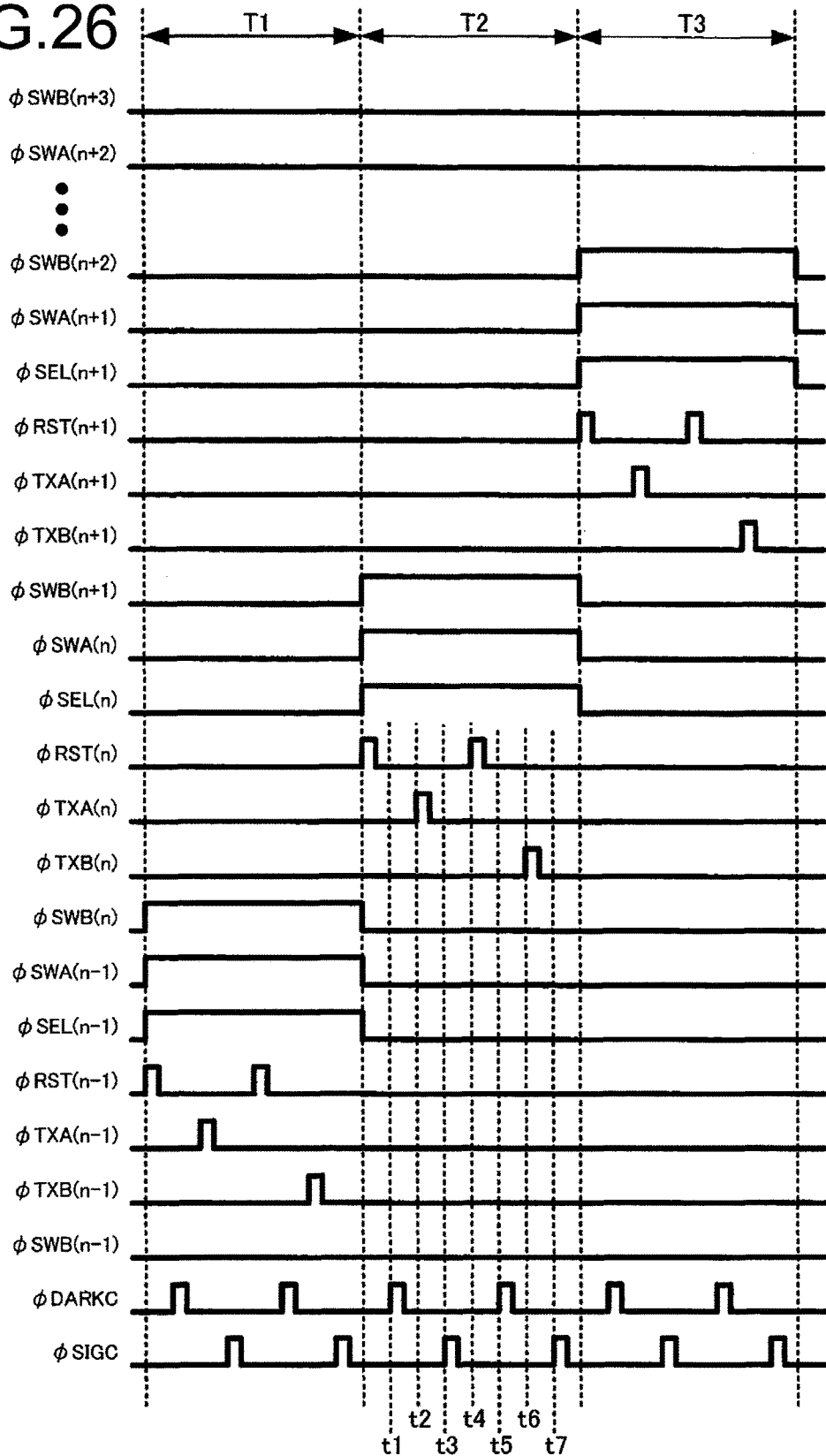
FIG. 26 A timing chart pertaining to yet another operation mode that may be selected in the solid-state image sensor shown in FIG. 22

In addition, when the first transistor SWA(n) in the pixel block BL(n) is turned on, the capacitance (charge/voltage conversion capacitance) between the first node Pa(n) and the reference electric potential equals a sum calculated by adding the capacitance CD(n) and the channel capacitance of the first transistor SWA(n) in the on state to the capacitance CC(n), unless a transistor in the on state other than the first transistor SWA(n) among the various first transistors SWA and second transistors SWB, enters a state of electrical connection to the first node Pa(n) (in more specific terms, if the second transistors SWB(n) and SWB(n+1) are in the off state). Under these circumstances, the capacitance value of the charge/voltage conversion capacitance at the first node Pa(n) is expressed as; Cfd1+Cfd2+Csw≈Cfd1+Cfd2. This state is equivalent to the state that occurs during the period T2 in FIG. 26 illustrating a second operation mode, which will be described later.

Figure 27:
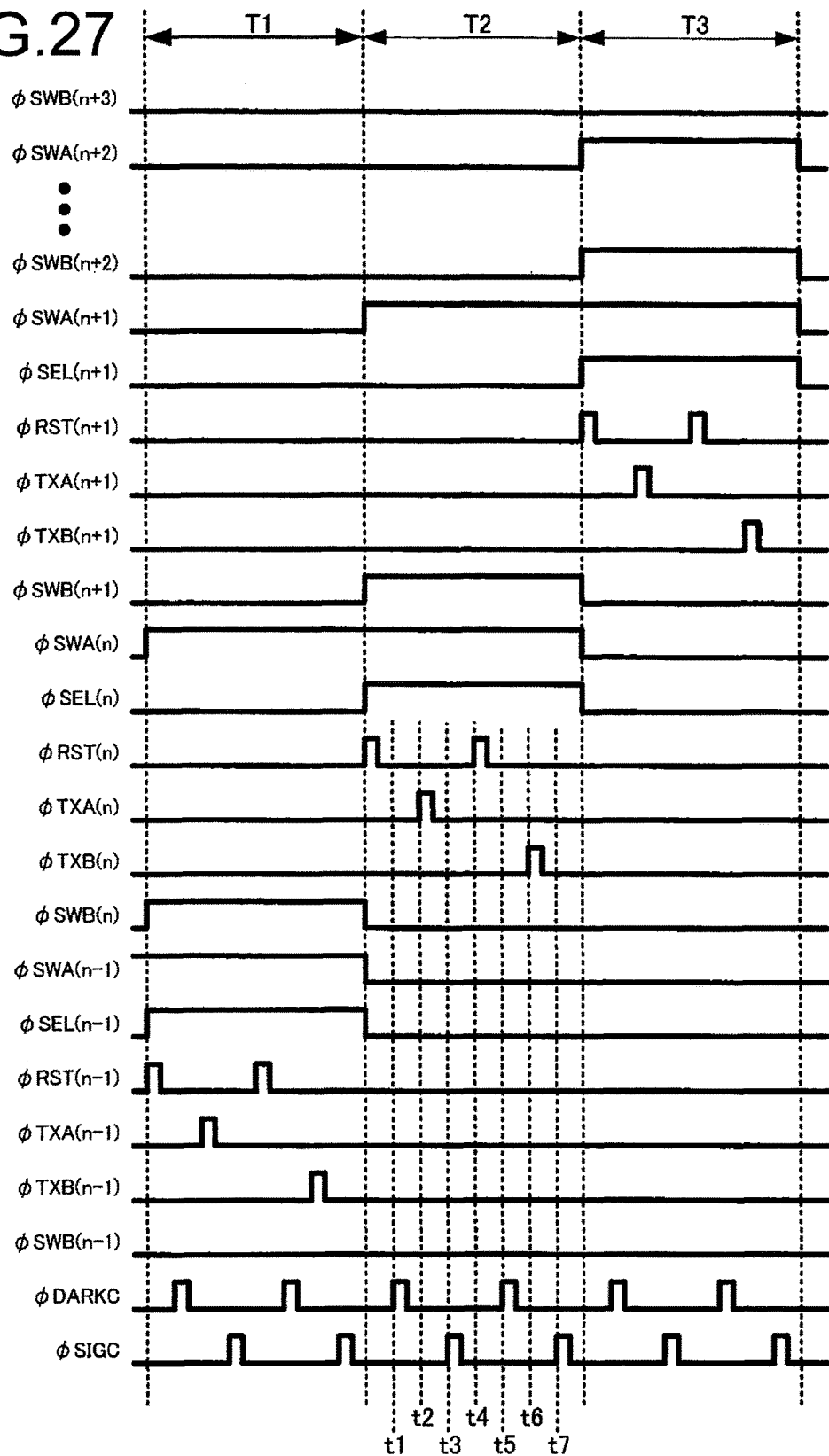
FIG. 27 A timing chart pertaining to still another operation mode that may be selected in the solid-state image sensor shown in FIG. 22

Furthermore, when the first transistor SWA(n) and the second transistor SWB(n+1) are both turned on in relation to the pixel block BL(n), the charge/voltage conversion capacitance at the first node Pa(n) equals a sum calculated by adding the capacitance CD(n), the capacitance CD(n+1) and the channel capacitances of the transistors SWA(n) and SWB(n+1) in the on state to the capacitance CC(n), unless a transistor in the on state other than the transistors SWA(n) and SWB(n+1), among the various first transistors SWA and second transistors SWB, enters a state of electrical connection to the first node Pa(n) (in more specific terms, if the transistors SWB(n), SWA(n+1) and SWB(n+2) are in the off state). Accordingly, the capacitance value of the charge/voltage conversion capacitance at the first node Pa(n) is expressed as; Cfd1+2×Cfd2+2×Csw≈Cfd1+2×Cfd2. This state is equivalent to the state that occurs during the period T2 in FIG. 27 illustrating a third operation mode, which will be described later.

Moreover, when the first transistors SWA(n) and SWA(n+1) and the second transistor SWB(n+1) are turned on in relation to the pixel block BL(n), the charge/voltage conversion capacitance at the first node Pa(n) equals a sum calculated by adding the capacitance CD(n), the capacitance CD(n+1), the capacitance CC(n+1) and the channel capacitances of the transistors SWA(n), SWA(n+1) and SWB(n+1) in the on state to the capacitance CC(n), unless a transistor in the on state other than the transistors SWA(n), SWA(n+1) and SWB(n+1), among the various first transistors SWA and second transistors SWB enter a state of electrical connection to the first node Pa(n) (in more specific terms, if the transistors SWB(n) and SWB(n+2) are in the off state). Accordingly, the capacitance value of the charge/voltage conversion capacitance at the first node Pa(n) is expressed as; 2×Cfd1+2×Cfd2+3×Csw≈2×Cfd1+2×Cfd2. This state is equivalent to the state that occurs during the period T2 in FIG. 27 illustrating a fourth operation mode, which will be described later.

Figure 28:
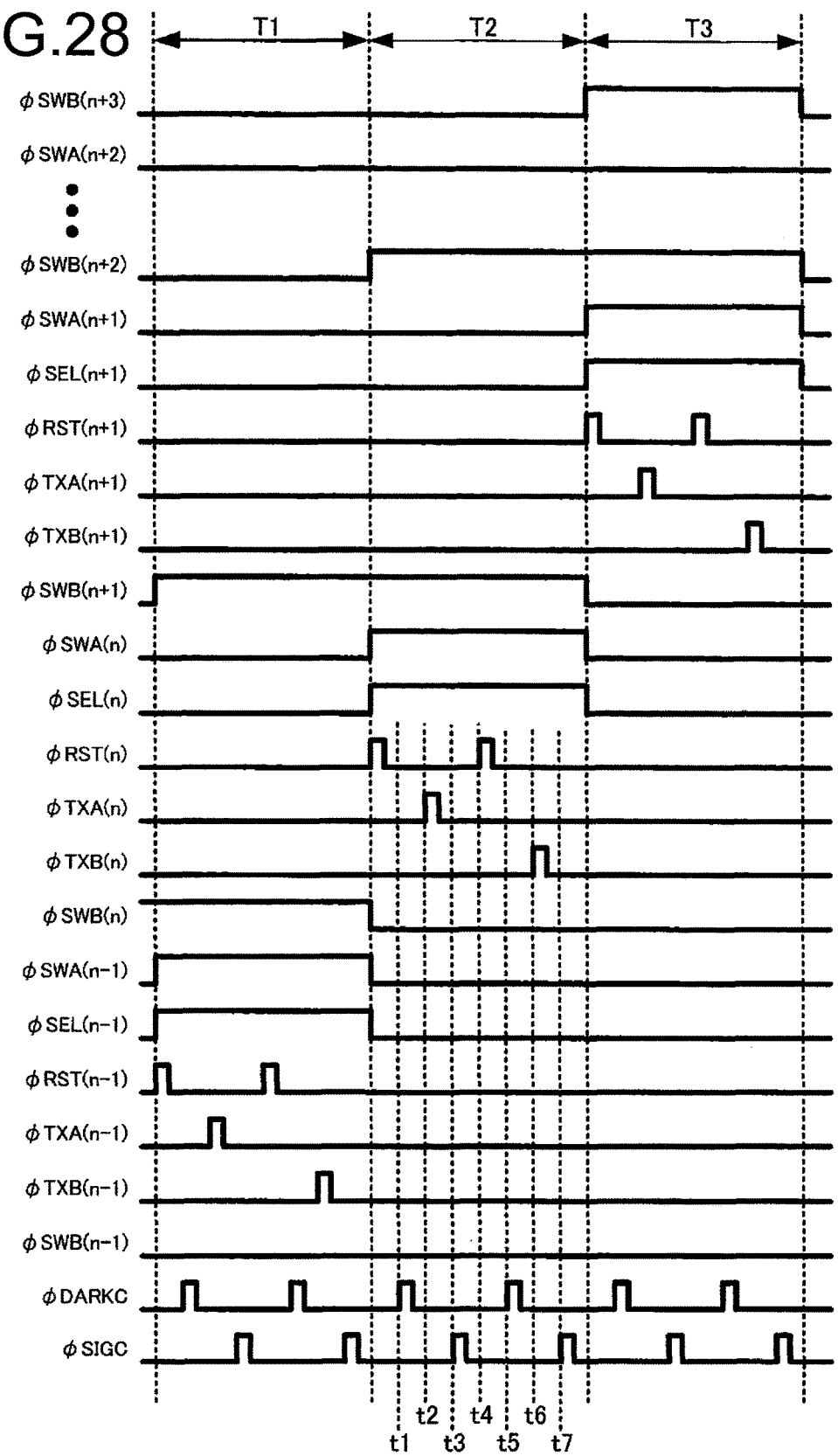
FIG. 28 A timing chart pertaining to still another operation mode that may be selected in the solid-state image sensor shown in FIG. 22

In addition, when the first transistor SWA(n) and the second transistors SWB(n+1) and SWB(n+2) are turned on in relation to the pixel block BL(n), the charge/voltage conversion capacitance at the first node Pa(n) equals a sum calculated by adding the capacitance CD(n), the capacitance CD(n+1), the capacitance CD(n+2) and the channel capacitances of the transistors SWA(n), SWB(n+1) and SWB(n+2) in the on state to the capacitance CC(n), unless a transistor in the on state other than the transistors SWA(n), SWB(n+1) and SWB(n+2), among the various first transistors SWA and second transistors SWB, enters a state of electrical connection to the first node Pa(n) (in more specific terms, if the transistors SWA(n+1), SWA(n+2), SWB(n) and SWB(n+3) are in the off state). Accordingly, the capacitance value of the charge/voltage conversion capacitance at the first node Pa(n) is expressed as; Cfd1+3×Cfd2+3×Csw≈Cfd1+3×Cfd2. This state is equivalent to the state that occurs during the period T2 in FIG. 28 illustrating a fifth operation mode, which will be described later.

Thus, as long as there is no transistor in the on state that is electrically connected to the first node Pa(n), among the various first transistors SWA and second transistors SWB, the charge/voltage conversion capacitance at the first node Pa(n) takes the smallest capacitance value Cfd1, and thus, a greater value is taken for the charge/voltage conversion coefficient corresponding to the charge/voltage conversion capacitance, thereby enabling a read at the highest possible SN ratio.

In addition, the number of transistors in the on state that are electrically connected to the first node Pa(n), among the various first transistors SWA and second transistors SWB, may be increased to a desired value equal to or greater than 1 so as to raise the capacitance value of the charge/voltage conversion capacitance at the first node Pa(n) to a desired value and thus enable handling of a greater signal charge quantity, which, in turn, makes it possible to increase the number of saturation electrons. This ultimately makes it possible to increase the dynamic range.

While a description is given above in reference to the first node Pa(n) in the pixel block BL(n), the principle also applies to the first nodes Pa in other pixel blocks BL.

FIG. 24 is a timing chart pertaining to the first operation mode that may be selected in the solid-state image sensor 604 shown in FIG. 22. In a typical example of an operation executed in the first operation mode, the pixel blocks BL are sequentially selected in units corresponding to the individual rows, the transfer transistors TXA and TXB in the selected pixel blocks BL are selectively turned on in sequence while there is no transistor in the on state that is electrically connected to the first node Pa in each selected pixel block BL (i.e., while the charge/voltage conversion capacitance at the first node Pa is at the lowest) among the various first transistors SWA and second transistors SWB, and signals from the photodiodes PDA and PDB in the selected pixel blocks BL are sequentially read out in correspondence to the individual rows. While signals are read out from all the pixels PXA and PXB in the example presented in FIG. 24, the present invention is not limited to this example and signals may be read through a culled read (a sub-sampling read) by skipping some pixel rows. Such a culled read may also be executed in the examples presented in FIG. 25 through FIG. 28.

FIG. 24 indicates that pixel blocks BL(n−1) in the (n−1)th row are selected during the period T1, that pixel blocks BL(n) in the nth row are selected during the period T2 and pixel blocks BL(n+1) in the (n+1)th row are selected during the period T3. Since the operation executed when the pixel blocks BL in a given row are selected is identical to the operation executed when the pixel blocks BL in any other row are selected, the following explanation will focus on the operation executed when the pixel block BL(n) in the nth row are selected.

Exposure via the photodiodes PDA(n) and PDA(n) will have been completed through a predetermined exposure time period preceding the start of the period T2. This exposure is executed via a mechanical shutter (not shown) following a global reset, whereby all the pixels are reset simultaneously in a regular main shooting operation (still image shooting operation) and the like, whereas it is executed through an operation commonly referred to as a rolling electronic shutter operation in the electronic viewfinder mode or in a video shooting operation. Immediately before the period T2 starts, all the transistors SEL, RST, TXA, TXB, SWA and SWB are in the off state.

At the start of the period T2, øSEL(n) for the nth row is set to H so as to turn on the selector transistors SEL(n) in the nth-row pixel blocks BL(n) and select the pixel blocks BL(n) in the nth row.

In addition, during the period T2, øSWA(n) is set to L, thereby turning off the first transistor SWA(n). As a result, the selected pixel blocks BL(n) enter a state in which there is no transistor in the on state that is electrically connected to the first node Pa(n) in each selected pixel block BL(n), among the various transistors SWA and SWB. Thus, the charge/voltage conversion capacitance at each first node Pa(n) takes on the smallest capacitance value Cfd1.

Over a predetermined length of time immediately following the start of the period T2, øRST(n) is set to H so as to temporarily turn on the reset transistors RST(n) in the nth row and thus reset the electric potential at the first nodes Pa(n) to the source voltage VDD for the time being.

Over a predetermined length of time starting at a following time point t1 during the period T2, the dark signal sampling signal øDARKC is set to H, and the electric potential at each first node Pa(n) is amplified via the corresponding nth-row amplifier transistor AMP(n) and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t2 during the period T2, øTXA(n) is set to H so as to turn on the nth row transfer transistors TXA(n). As a result, the signal charges having been accumulated in the photodiodes PDA(n) in the nth-row pixel blocks BL(n) are transferred to the charge/voltage conversion capacitances at the first nodes Pa(n). The electric potential at each first node Pa(n) minus the noise component takes on a value that is in proportion to both the quantity of the corresponding signal charge and the reciprocal of the capacitance value of the charge/voltage conversion capacitance at the particular first node Pa(n).

At a following time point t3 during the period T2, the light signal sampling signal øSIGC is set to H, and the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a time point at which øSIGC is set to L, each CDS circuit 31 outputs a signal corresponding to the difference between the dark signal sampled over the predetermined length of time starting at the time point t1 and the light signal sampled over the predetermined length of time starting at the time point t3. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

Then, over a predetermined length of time starting at a time point t4 during the period T2, øRST(n) is set to H so as to temporarily turn on the reset transistors RST(n) in the nth row and thus reset the electric potential at the first nodes Pa(n) to the source voltage VDD for the time being.

Over a predetermined length of time starting at a following time point t5 during the period T2, the dark signal sampling signal øDARKC is set to H, and the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t6 during the period T2, øTXB(n) is set to H so as to turn on the nth row transfer transistors TXB(n). As a result, the signal charges having been accumulated in the photodiodes PDB(n) in the nth-row pixel blocks BL(n) are transferred to the charge/voltage conversion capacitances at the first nodes Pa(n). The electric potential at each first node Pa(n) minus the noise component takes on a value that is in proportion to both the quantity of the corresponding signal charge and the reciprocal of the capacitance value of the charge/voltage conversion capacitance at the particular first node Pa(n).

At a following time point t7 during the period T2, the light signal sampling signal øSIGC is set to H, and the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a subsequent time point at which øSIGC is set to L, each CDS circuit 31 outputs a signal corresponding to the difference between the dark signal sampled over the predetermined length of time starting at the time point t5 and the light signal sampled over the predetermined length of time starting at the time point t7. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

In the first operation mode described above, there is no transistor in the on state that is electrically connected to the first node Pa in each selected pixel block BL, among the various transistors SWA and SWB, and thus, the charge/voltage conversion capacitance at the first node Pa in each selected pixel block BL takes on the smallest capacitance value, resulting in a greater charge/voltage conversion coefficient corresponding to the charge/voltage conversion capacitance, which, in turn, enables a read operation at the highest possible SN ratio. The image-capturing control unit 5 issues a command for the first operation mode when, for instance, the ISO sensitivity is set to the highest value.

Figure 25:
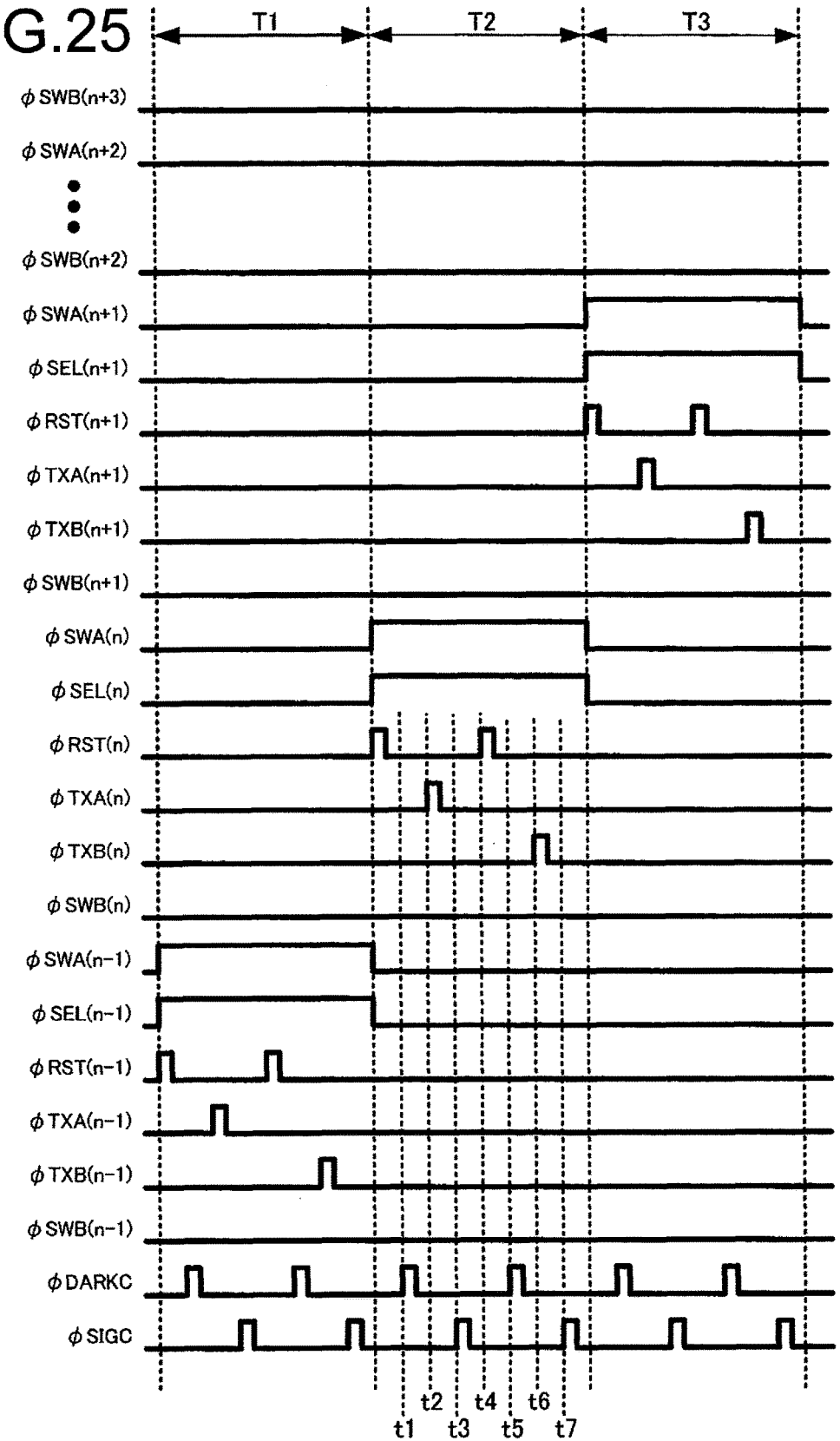
FIG. 25 A timing chart pertaining to another operation mode that may be selected in the solid-state image sensor shown in FIG. 22

FIG. 25 is a timing chart pertaining to the second A operation mode that may be selected in the solid-state image sensor 604 shown in FIG. 22. In this second operation mode, the pixel blocks BL are sequentially selected in units of individual rows, and the transfer transistors TXA and TXB in each selected pixel block BL are selectively turned on in sequence while one transistor SWA in the on state, among the various first transistors SWA and second transistors SWB, is electrically connected to the first node Pa in the selected pixel block BL so as to sequentially read out signals output from the photodiodes PDA and PDB in the selected pixel blocks BL in units of the individual rows.

As does FIG. 24, FIG. 25 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the second operation mode shown in FIG. 25 that distinguish it from the first operation mode shown in FIG. 24.

In the second operation mode shown in FIG. 25, during the period T2 through which the nth-row pixel blocks BL(n) are selected, øSWA(n) is set to H and øSWB(n) and SWB (n+1) are set to L, thereby turning on the first transistors SWA(n) and turning off the second transistors SWB(n−1) and øSWB(n+1). Thus, the selected pixel blocks BL(n) each assume a state that occurs during the period T2 in which one first transistor SW (the first transistor SWA(n) in this example), among the various transistors SWA and SWB is electrically connected to the first node Pa(n) therein. As a result, the charge/voltage conversion capacitance at the first node Pa(n) takes on a capacitance value expressed as; Cfd1+Cfd2+Csw≈Cfd1+Cfd2, as explained earlier, achieving an increase in the capacitance value by an extent equivalent to one stage over that achieved in the first operation mode shown in FIG. 24.

While an explanation has been given in reference to the period T2 through which the nth-row pixel blocks BL(n) are selected, a similar operation is executed during periods through which other pixel blocks BL are selected.

In the second operation mode described above, one first transistor SWA in the on state among the various transistors SWA and SWB is electrically connected to the first node Pa in each selected pixel block BL, thereby achieving an increase in the capacitance value of the charge/voltage conversion capacitance at the first node Pa in the selected pixel block BL by an extent equivalent to one stage, which allows the number of saturation electrons corresponding to the charge/voltage conversion capacitance at the first node Pa to be increased by an extent equivalent to one stage. As a result, the dynamic range can be expanded by an extent equivalent to one stage. The image-capturing control unit 5 issues a command for operation in the second operation mode when, for instance, a value smaller than the highest value by one step is set for the ISO sensitivity.

FIG. 26 is a timing chart pertaining to the third operation mode that may be selected in the solid-state image sensor 604 shown in FIG. 22. In the third operation mode, the pixel blocks BL are sequentially selected in units of individual rows, and the transfer transistors TXA and TXB in each selected pixel block BL are selectively turned on in sequence while one first transistor SWA in the on state and one second transistor SWB in the on state, among the various first transistors SWA and second transistors SWB, are electrically connected to the first node Pa in the selected pixel block BL so as to sequentially read out signals output from the photodiodes PDA and PDB in the selected pixel blocks BL in units of the individual rows.

As does FIG. 24, FIG. 26 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the third operation mode shown in FIG. 26 that distinguish it from the first operation mode shown in FIG. 24.

In the third operation mode shown in FIG. 26, during the period T2 through which the nth-row pixel blocks BL(n) are selected, øSWA(n) and øSWB(n+1) are set to H and øSWA (n+1), øSWB(n) and øSWB(n+2) are set to L, thereby turning on the first transistors SWA(n) and the second transistor SWB(n+1), and turning off the first transistors SWA(n+1) and the second transistors SWB(n) and SWB(n+2). Thus, the selected pixel blocks BL(n) each assume a state that occurs during the period T2 in which one first transistors SWA in the on state (the first transistor SWA(n) in this example) and one second transistor SWB in the on state (the second transistor SWB(n+1) in this example), among the various transistors SWA and SWB, are electrically connected to the first node Pa(n) therein. As a result, the charge/voltage conversion capacitance at the first node Pa(n) takes on a capacitance value expressed as; Cfd1+2×Cfd2+Csw≈Cfd1+2×Cfd2, as explained earlier, achieving an increase in the capacitance value by an extent equivalent to two stages over that achieved in the first operation mode shown in FIG. 24.

While an explanation has been given in reference to the period T2 through which the nth-row pixel blocks BL(n) are selected, a similar operation is executed during periods through which other pixel blocks BL are selected.

In the third operation mode described above, one first transistor SWA in the on state and one second transistor SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by an extent equivalent to two stages, which allows the number of saturation electrons corresponding to the charge/voltage conversion capacitance at the first node Pa to be increased by an extent equivalent to two stages. As a result, the dynamic range can be expanded by two stages. The image-capturing control unit 5 issues a command for operation in the third operation mode when, for instance, a value smaller than the highest value by two steps is set for the ISO sensitivity.

FIG. 27 is a timing chart pertaining to the fourth operation mode that may be selected in the solid-state image sensor 604 shown in FIG. 22. In the fourth operation mode, the pixel blocks BL are sequentially selected in units of individual rows, and the transfer transistors TXA and TXB in each selected pixel block BL are selectively turned on in sequence while two first transistors SWA in the on state and one second transistor SWB in the on state, among the various first transistors SWA and second transistors SWB, are electrically connected to the first node Pa in the selected pixel block BL so as to sequentially read out signals output from the photodiodes PDA and PDB in the selected pixel blocks BL in units of the individual rows.

As does FIG. 24, FIG. 27 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the fourth operation mode shown in FIG. 27 that distinguish it from the first operation mode shown in FIG. 24.

In the fourth operation mode shown in FIG. 27, during the period T2 through which the nth-row pixel blocks BL(n) are selected, øSWA(n), øSWA(n+1) and øSWB(n+1) are set to H and øSWB(n) and øSWB(n+2) are set to L, thereby turning on the first transistors SWA(n) and SWA(n+1) and the second transistor SWB(n+1), and turning off second transistors SWB(n) and SWB(n+2). Thus, the selected pixel blocks BL(n) each assume a state that occurs during the period T2 in which two first transistors SWA in the on state (the first transistors SWA(n) and SWA(n+1) in this example) and one second transistor SWB in the on state (the second transistor SWB(n+1) in this example), among the various transistors SWA and SWB are electrically connected to the first node Pa(n) therein. As a result, the charge/voltage conversion capacitance at the first node Pa(n) takes on a capacitance value expressed as; 2×Cfd1+2×Cfd2+3×Csw≈2×Cfd1+2×Cfd2, as explained earlier, achieving an increase in the capacitance value by an extent equivalent to three stages over that achieved in the first operation mode shown in FIG. 24.

While an explanation has been given in reference to the period T2 through which the nth-row pixel blocks BL(n) are selected, a similar operation is executed during periods through which other pixel blocks BL are selected.

In the fourth operation mode described above, two first transistors SWA in the on state and one second transistor SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by three stages, which allows the number of saturation electrons corresponding to the charge/voltage conversion capacitance at the first node Pa to be increased by an extent equivalent to three stages. As a result, the dynamic range can be expanded by three stages. The image-capturing control unit 5 issues a command for operation in the fourth operation mode when, for instance, a value smaller than the highest value by three steps is set for the ISO sensitivity.

FIG. 28 is a timing chart pertaining to the fifth operation mode that may be selected in the solid-state image sensor 604 shown in FIG. 22. In the fifth operation mode, the pixel blocks BL are sequentially selected in units of individual rows, and the transfer transistors TXA and TXB in each selected pixel block BL are selectively turned on in sequence while one first transistor SWA in the on state and two second transistors SWB in the on state, among the various first transistors SWA and second transistors SWB, are electrically connected to the first node Pa in the selected pixel block BL so as to sequentially read out signals output from the photodiodes PDA and PDB in the selected pixel blocks BL in units of the individual rows.

As does FIG. 24, FIG. 28 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the fifth operation mode shown in FIG. 28 that distinguish it from the first operation mode shown in FIG. 24.

In the fifth operation mode shown in FIG. 28, during the period T2 through which the nth-row pixel blocks BL(n) are selected, øSWA(n), øSWB(n+1) and øSWB(n+2) are set to H and øSWA(n+1), øSWA(n+2), øSWB(n) and øSWB(n+3) are set to L, thereby turning on the first transistors SWA(n) and the second transistors SWB(n+1) and SWB(n+2), and turning off the first transistors SWA(n+1) and SWA(n+2) and the second transistors SWB(n) and SWB(n+3). Thus, the selected pixel blocks BL(n) each assume a state that occurs during the period T2 in which one first transistor SWA in the on state (the first transistor SWA(n) in this example) and two second transistors SWB in the on state (the second transistors SWB(n+1) and SWB(n+2) in this example), among the various transistors SWA and SWB are electrically connected to the first node Pa(n) therein. As a result, the charge/voltage conversion capacitance at the first node Pa(n) takes on a capacitance value expressed as; Cfd1+3×Cfd2+3×Csw≈Cfd1+3×Cfd2, as explained earlier, achieving an increase in the capacitance value by an extent equivalent to three stages over that achieved in the first operation mode shown in FIG. 24.

While an explanation has been given in reference to the period T2 through which the nth-row pixel blocks BL(n) are selected, a similar operation is executed during periods through which other pixel blocks BL are selected.

In the fifth operation mode described above, one first transistor SWA in the on state and two second transistors SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by three stages, which allows the number of saturation electrons corresponding to the charge/voltage conversion capacitance at the first node Pa to be increased by an extent equivalent to one stage. As a result, the dynamic range can be expanded by three stages. The image-capturing control unit 5 issues a command for operation in the fifth operation mode when, for instance, a value smaller than the highest value by three steps is set for the ISO sensitivity.

The fourth operation mode shown in FIG. 27 and the fifth operation mode shown in FIG. 28 will now be compared. As explained earlier, two first transistors SWA in the on state and one second transistor SWB in the on state among the various transistors SWA and SWB are electrically connected to the first node Pa in each selected pixel block BL and the charge/voltage conversion capacitance at the first node Pa in the pixel block BL takes on a capacitance value expressed as 2×Cfd1+2×Cfd2+3×Csw≈2×Cfd1+2×Cfd2 in the fourth operation mode. One first transistor SWA in the on state and two second transistors SWB in the on state among the various transistors SWA and SWB are electrically connected to the first node Pa in each selected pixel block BL and the charge/voltage conversion capacitance at the first node Pa in the pixel block BL takes on a capacitance value expressed as; Cfd1+3×Cfd2+3×Csw≈Cfd1+3×Cfd2 in the fifth operation mode.

Accordingly, as long as the capacitance value Cfd1 of the capacitance CC and the capacitance value Cfd2 of the capacitance CD are equal, the same capacitance value is achieved at the first node Pa in the selected pixel block BL and the dynamic range can be expanded to roughly the same extent regardless of whether the fourth operation mode or the fifth operation mode is selected.

However, while the capacitance value Cfd1 has significant voltage dependency, the extent of voltage dependency in the capacitance value Cfd2 is negligible. Accordingly, the voltage dependency of the capacitance value of the charge/voltage conversion capacitance at the first node P in the selected pixel block BL in the fifth operation mode is less than the voltage dependency of the capacitance value of the charge/voltage conversion capacitance at the first node P in the selected pixel block BL in the fourth operation mode by an extent matching the voltage dependency of the capacitance value Cfd1 corresponding to a single capacitance CC.

This means that the fifth operation mode is advantageous in that the extent to which the capacitance is affected by voltage dependency when the dynamic range is expanded can be reduced compared to the fourth operation mode and thus, better linearity in photoelectric conversion is assured.

In the fifth operation mode, representing an example of an operation mode in which the various first transistors SWA and second transistors SWB are controlled so as to electrically connect p (p is an integer equal to or greater than 1) first transistors SWA in the on state among the various first transistors SWA, and q (q is an integer greater than p) second transistors SWB in the on state among the various second transistors SWB, to the first node Pa in a given selected pixel block BL, p is set to 1 and q is set to 2. As is obvious from an earlier explanation, provided that the sum p+q is any predetermined value equal to or greater than 3, this operation mode makes it possible to reduce the extent to which the capacitance is affected by voltage dependency when the dynamic range is expanded, in comparison to an operation mode in which q<p (an example of this operation mode is the fourth operation mode with p=2 and q=1). While p simply needs to be an integer equal to or greater than 1, it is desirable, in correspondence to a given value taken for the sum p+q, to take a smaller value for p, so as to reduce the extent to which the capacitance is affected by voltage dependency. It is most desirable, in particular, to set p to 1, since the extent to which the capacitance is affected by voltage dependency will be minimized at this setting.

While a second transistor SWB is disposed between each pair of second nodes Pb taking consecutive positions along the columnar direction in the embodiment, the present invention is not limited to this example. For instance, the area between an (r+1)th second node (r is an integer equal to or greater than 2) among second nodes Pb set side-by-side along the columnar direction and a second node Pb located directly below the second node Pb in the figure, may be held in an open state at all times without disposing a second transistor SWB between them. In such a case, if r is smaller, the extent to which the dynamic range is expanded will decrease. However, the SN ratio for high-sensitivity read can be improved. In addition, the area between an (s+1)th node (s is an integer equal to or greater than 4) along the columnar direction and a second node Pb located directly below the second node Pb in the figure may be electrically shorted without disposing a second transistor SWB between them.

It is to be noted that the capacitance value for the capacitance CD may be set within a range of ±20% of the capacitance value of the capacitance CC or within a range of ±10% of the capacitance value of the capacitance CC by, for instance, adjusting the width of the wiring 72 or the like. These concept is also applicable to the seventh embodiment, to be described in detail later.

It is to be noted that in the various operational examples described in reference to FIGS. 24 through 28, the signal charge at a photodiode PD in each pixel PX is read out separately without combining it with the signal charge at a photodiode PD in another pixel PX. However, the present invention is not limited to these operational examples, and the signal charge at the photodiode PD in each pixel PX may be read out in combination with the signal charge at the photodiode PD in another pixel PX of the same color.

For instance, by turning on the first transistors SWA(n−1), SWA(n) and SWA(n+1) and the second transistors SWB(n) and SWB(n+1) so as to connect the first nodes Pa(n−1), Pa(n) and Pa(n+1) with one another and simultaneously turning on TXA(n−1), TXA(n) and TXA(n+1), the signal charges at the photodiodes PDA(n−1), PDA(n) and PDA(n−1) at the three pixels PXA(n−1), PXA(n) and PXA(n−1) assuming the same color in a Bayer array or the like will be averaged through the first nodes Pa(n−1), Pa(n) and Pa(n+1) linked with one another, thereby achieving a same-color, three pixel combined read function. In this situation, the number of first or second transistors in the on state that are electrically connected to the first nodes Pa(n−1), Pa(n) and Pa(n+1) may be minimized by turning off the second transistors SWB(n−2) and SWB(n+2) so as to minimize the charge/voltage conversion capacitance at the linked first nodes Pa(n−1), Pa(n) and Pa(n+1) and thus enable a same-color, three pixel combined read operation at the highest possible SN ratio. In addition, by allowing at least one more transistor in the on state among the various first transistors SWA and second transistors SWB to electrically connect to the first nodes Pa(n−1), Pa(n) and Pa(n+1), as well as to the first transistors SWA(n−1), SWA(n) and SWA(n+1) and the second transistors SWB(n) and SWB(n+1) an increase in the charge/voltage conversion capacitance at the linked first nodes Pa(n−1), Pa(n) and Pa(n+1), corresponding to the number of additional transistors, is achieved and as a result, the dynamic range for the same-color, three pixel combined read can be expanded.

Seventh Embodiment

Figure 29:
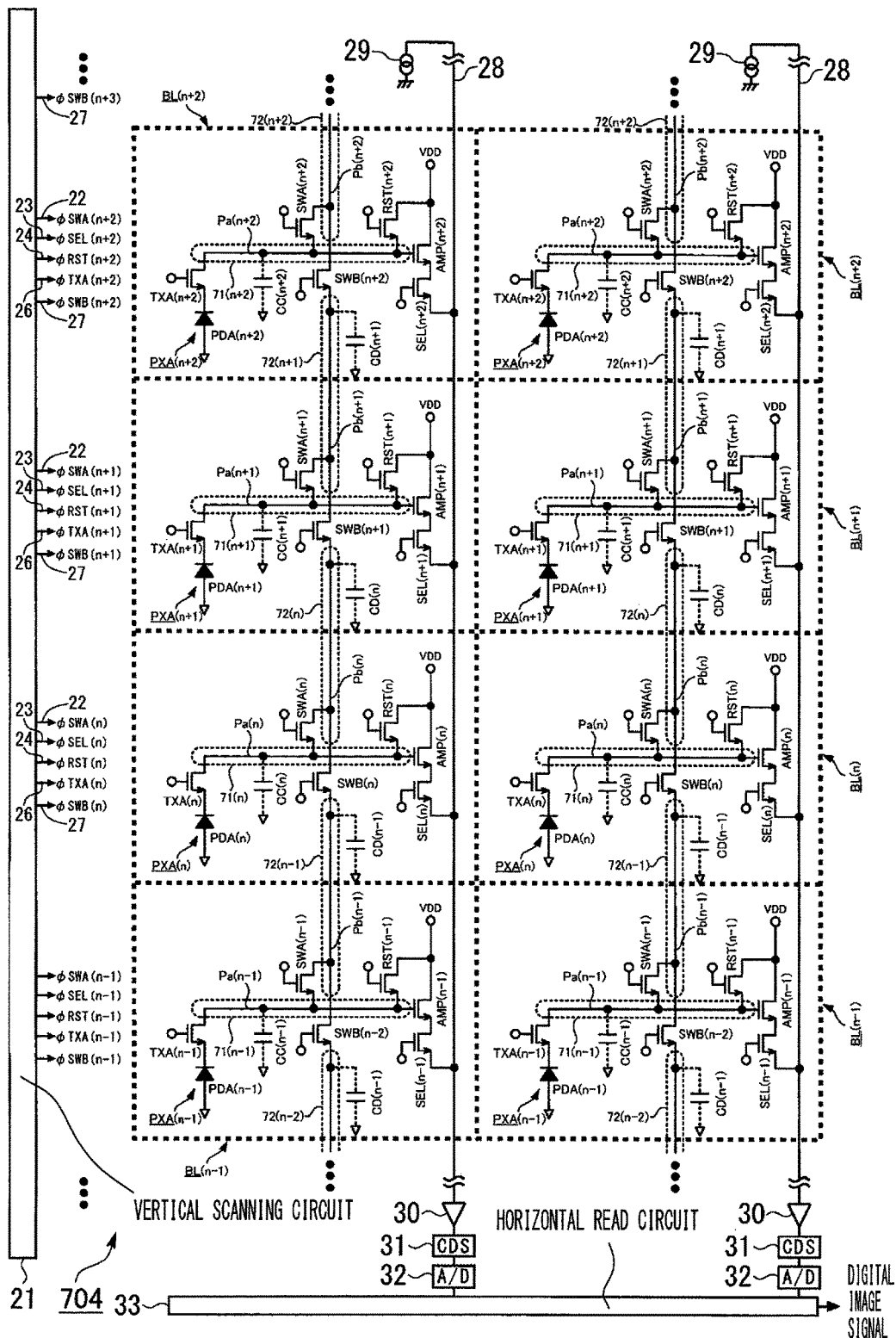
FIG. 29 A circuit diagram schematically illustrating the structure of a solid-state image sensor in the electronic camera achieved in a seventh embodiment of the present invention FIG. 30 A circuit diagram schematically illustrating the structure of the solid-state image sensor in FIG. 1

FIG. 29 is a circuit diagram corresponding to that in FIG. 22, schematically illustrating a solid-state image sensor 704 in the electronic camera achieved in the seventh embodiment of the present invention. In FIG. 29, the same reference signs are assigned to elements identical to or corresponding to those in FIG. 22, so as to preclude the necessity for a repeated explanation thereof.

The current embodiment differs from the sixth embodiment in that the photodiode PDB and the transfer transistor TXB disposed in each pixel block BL in the sixth embodiment are not provided and that each pixel block BL is thus made up with a pixel PXA. However, the photodiodes PDA in the embodiment are disposed with a columnar-direction density that is twice the columnar-direction density with which the photodiodes PDA are disposed in the sixth embodiment. In other words, the photodiodes PDA are disposed with a columnar-direction density matching that with which the photodiodes PDA and PDB are disposed along the columnar direction in the sixth embodiment. Thus, n indicates a specific row of pixel blocks BL and also a specific row of pixels PXA in the embodiment.

Namely, while each pixel block BL in the sixth embodiment is made up with two pixels PX (PXA and PXB), pixel blocks 13L in the current embodiment are each made up with a single pixel (PXA). In addition, while the two pixels PX (PXA and PXB) in a pixel block BL share a set of elements, i.e., the first node Pa, the amplifier transistor AMP, the reset transistor RST and the selector transistor SEL, the set of elements, i.e., the first node Pa, the amplifier transistor AMP, the reset transistor RST and the selector transistor SEL, is provided for each pixel PX (PXA in the embodiment) in the current embodiment.

The description of the sixth embodiment also serves as a description of the current embodiment basically by referring to pixel blocks BL as pixels PXA instead. Accordingly, the current embodiment will not be explained in detail.

Through the current embodiment, too, advantages and operations similar to those of the sixth embodiment are achieved.

Eighth Embodiment

Figure 30:
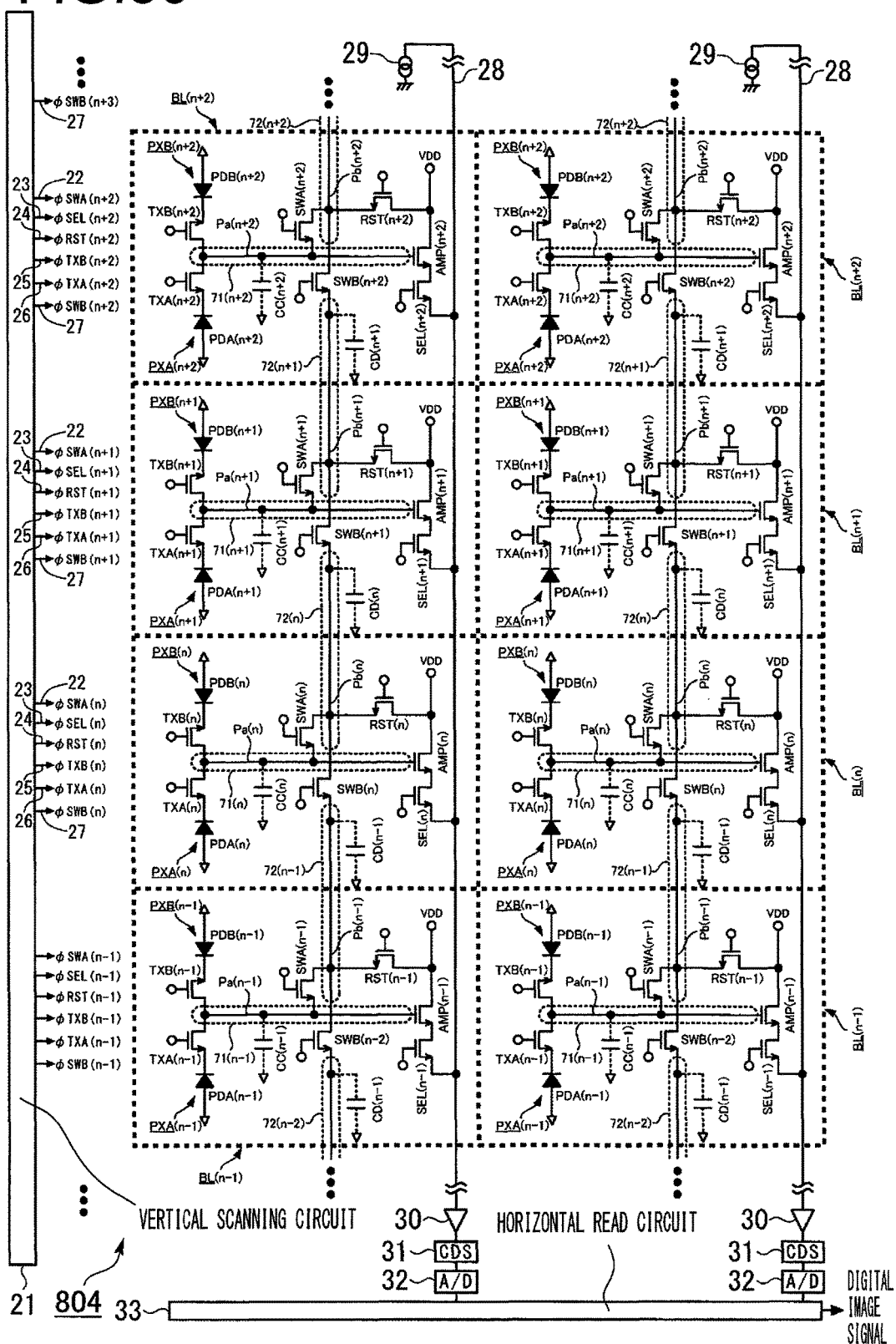
Figure 31:
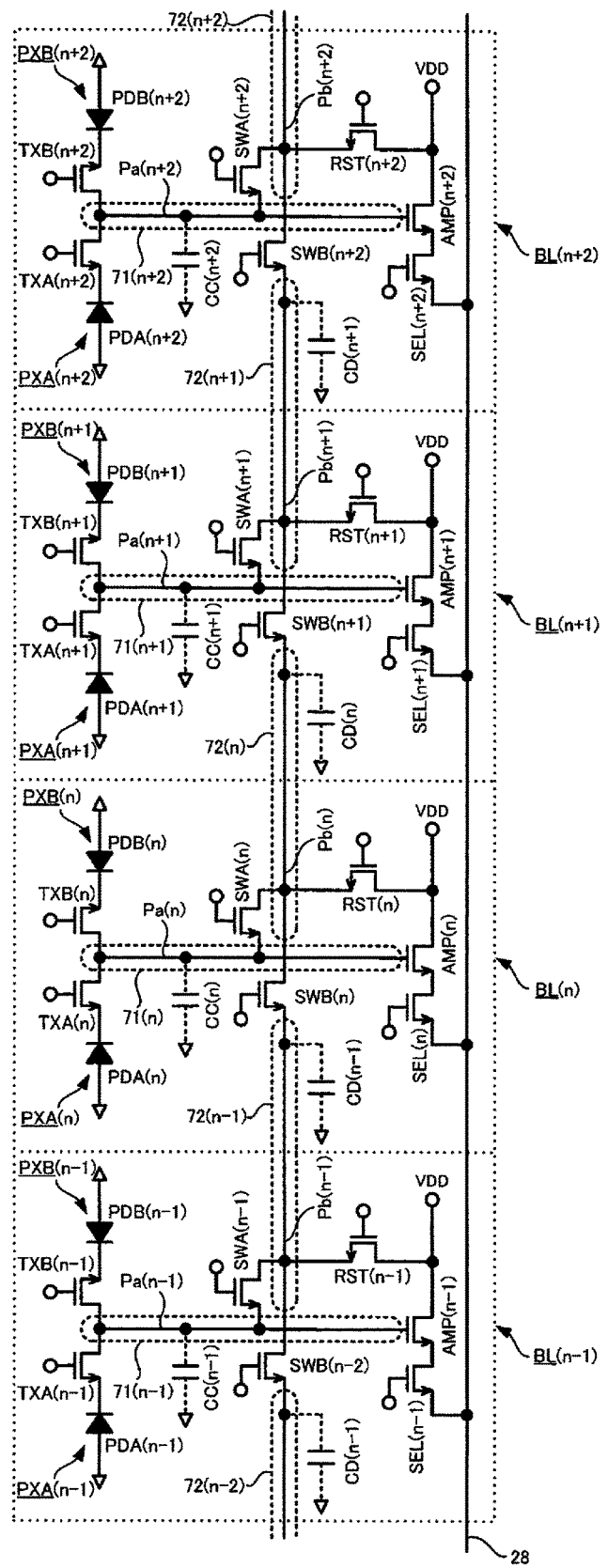
FIG. 31 A circuit diagram showing an area that includes four pixel blocks in FIG. 1 in an enlargement FIG. 32 A schematic plan view of an area that includes three pixel blocks in FIG. 31
Figure 32:
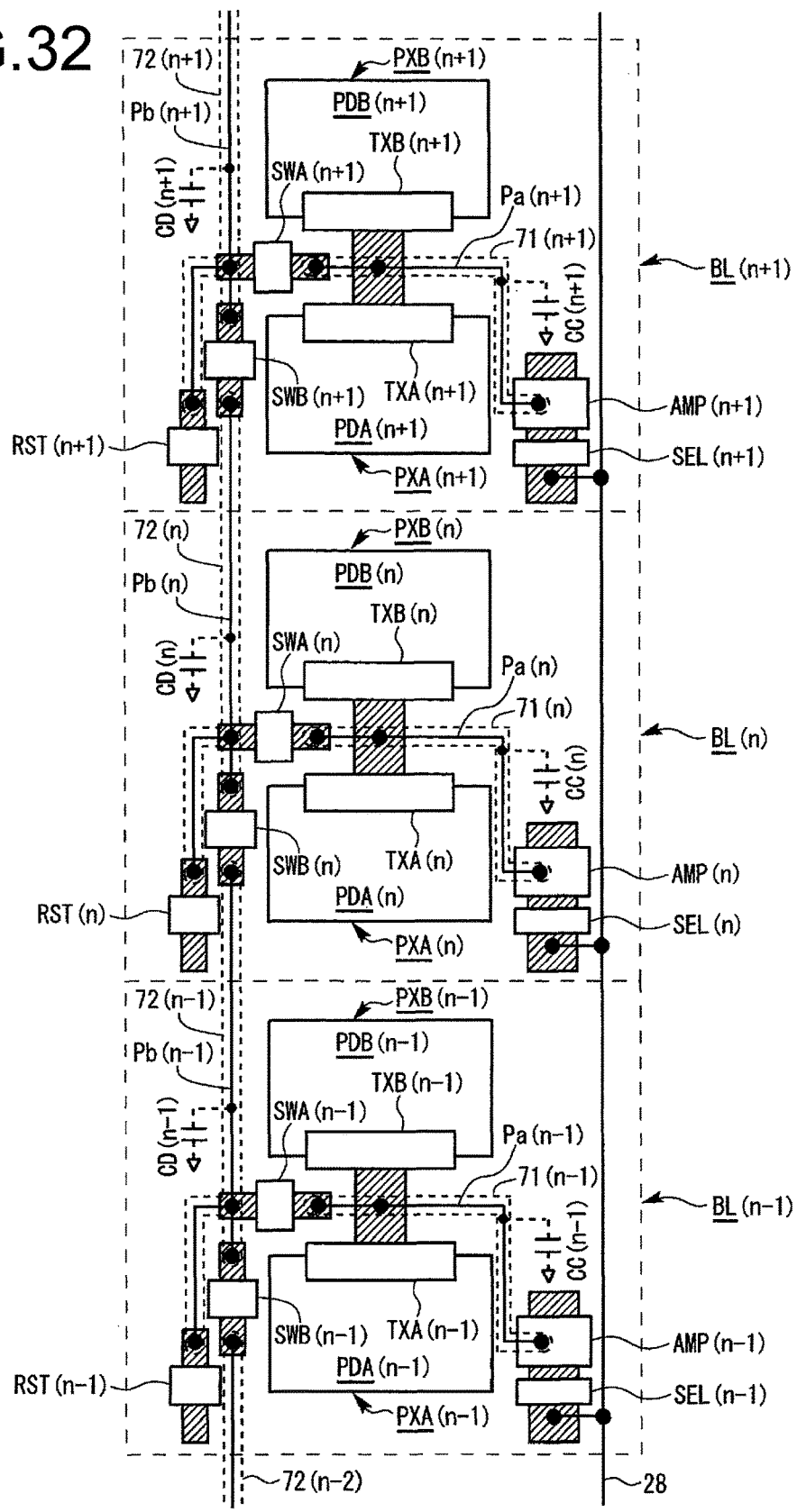
Figure 33:
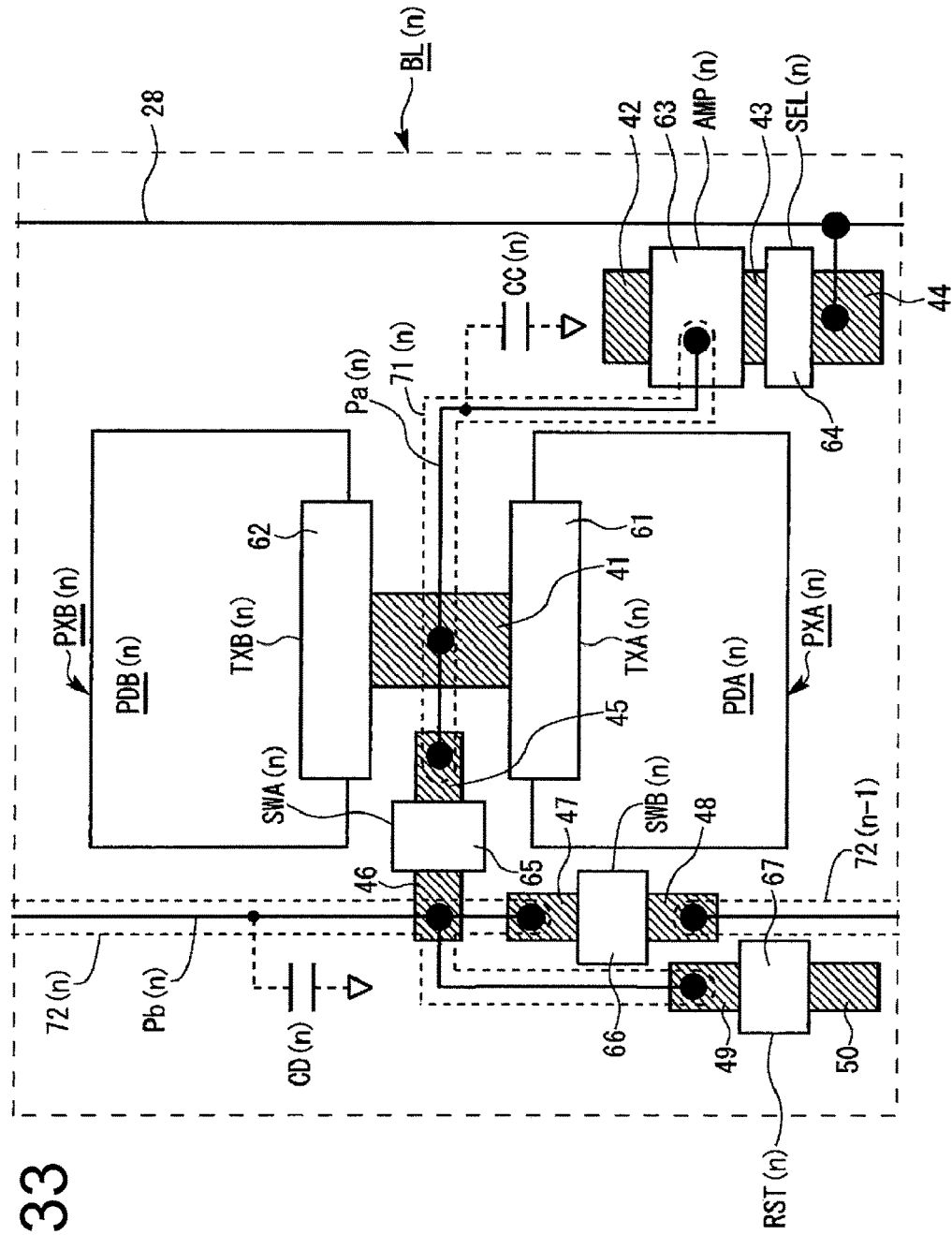
FIG. 33 A schematic plan view enlargement showing an area that includes one of the pixel blocks in FIG. 32

FIG. 30 is a circuit diagram schematically illustrating the structure of a solid-state image sensor 804 in the electronic camera achieved in the eighth embodiment of the present invention. FIG. 31 is a circuit diagram that shows in an enlargement an area that includes four pixel blocks BL disposed at consecutive positions along the columnar direction in FIG. 30. FIG. 32 is a schematic plan view of an area that includes three pixel blocks BL in FIG. 31. FIG. 33 is a schematic plan view showing in an enlargement, an area that includes one of the pixel blocks BL in FIG. 32. While the solid-state image sensor 804 in the embodiment is constituted with a CMOS solid-state image sensor, the present invention is not limited to this example and it may be constituted with another type of XY address solid-state image sensor.

As shown in FIG. 30 through FIG. 32, the solid-state image sensor 804 includes pixel blocks BL disposed in a two-dimensional matrix pattern over N rows by M columns and each having two pixels PX (PXA, PXB), first transistors SWA, each constituting a first switch unit via which a first node Pa, to be described in detail later and a second node Pb corresponding to the first node Pa are electrically connected with each other and disconnected from each other, second transistors SWB, each constituting a second switch unit via which two second nodes Pb are electrically connected with each other and disconnected from each other, reset transistors RST, each constituting a third switch unit that provides a source voltage VDD, to be used as a predetermined electric potential, to a second node Pb, a vertical scanning circuit 21, control lines 22 through 27 disposed in correspondence to each row of pixel blocks BL, a plurality of M vertical signal lines 28, each disposed to serve a specific column of pixels PX (in correspondence to a column of pixel blocks BL) through which signals output from the pixels PX (pixel blocks BL) in the corresponding columns are received, constant current sources 29, each disposed at one of the vertical signal lines 28, column amplifiers 30, CDS circuits (correlated double sampling circuits) 31 and A/D converters 32, each disposed in correspondence to one of the vertical signal lines 28, and a horizontal read circuit 33.

It is to be noted that the column amplifiers 30 may be analog amplifiers, or they may be amplifiers commonly referred to as switched capacitor amplifiers. In addition, it is not essential that the column amplifiers 30 be included in the configuration.

While M=2 in the configuration shown in FIG. 30 in order to simplify the illustration, the number of columns M is actually set to any value greater than 2. In addition, there are no limits imposed with regard to the number of rows N, either. A pixel block BL in a given row is distinguished from a pixel block BL in another row by notating a pixel block BL in a jth row as BL(j). Similar notation rules apply to other elements and control signals to be described later. In FIG. 30 and FIG. 31, pixel blocks BL(n−1) through BL(n+2) disposed over four rows, an (n−1)th row through an (n+2)th row are shown.

It is to be noted that while the pixel located on the lower side in the pixel block BL in FIG. 30 and FIG. 31 is indicated with a reference sign PXA and the pixel located on the upper side in the pixel block BL in FIG. 30 and FIG. 31 is indicated with a reference sign PXB in the drawings so as to distinguish them from each other, they may both be simply referred to as pixels PX when they do not need to be distinguished from each other. In addition, while a photodiode disposed in correspondence to the pixel PXA is notated as PDA and a photodiode disposed in correspondence to the pixel PXB is notated as PDB in the drawings so as to distinguish them from each other in the drawings, they may both be simply referred to as photodiodes PD when they do not need to be distinguished from each other. Likewise, while a transfer transistor disposed in correspondence to the pixel PXA is notated as TXA and a transfer transistor disposed in correspondence to the pixel PXB is notated as TXB so as to distinguish them from each other in the drawings, they may both be simply referred to as transfer transistors TX when they do not need to be distinguished from each other. It is also to be noted that the photodiodes PD for the pixels PX are disposed in a two-dimensional matrix pattern over 2N rows by M columns in the embodiment.

Each pixel PX in the embodiment includes a photodiode PD used as a photoelectric conversion unit that generates a signal charge corresponding to incident light and accumulates the signal charge thus generated, and a transfer transistor TX used as a transfer switch via which the charge is transferred from the photodiode PD to a first node Pa.

In the embodiment, two pixels PX (PXA and PXB) with the photodiodes PD thereof disposed at consecutive positions along the columnar direction, among the plurality of pixels PX, form a block BL. As shown in FIGS. 30 and 31, the two pixels PX (PXA and PXB) belonging to a given pixel block BL share a set of elements that includes a first node Pa, an amplifier transistor AMP and a selector transistor SEL. A capacitance (charge/voltage conversion capacitance) is formed at the first node Pa in relation to a reference electric potential, and the charge transferred to the first node Pa is converted to a voltage with the capacitance thus formed. The amplifier transistor AMP constitutes an amplifier unit that outputs a signal corresponding to the electric potential at the first node Pa. The selector transistor SEL constitutes a selection unit used to select the particular pixel block BL. The two pixels PX (PXA and PXB) do not share a photodiode PD and a transfer transistor TX and instead a photodiode PD and a transfer transistor TX are disposed corresponding to each pixel PX. n in FIG. 30 and FIG. 31 indicates a specific row of pixel blocks BL. For instance, a first-row pixel block BL is made up with a pixel PX (PXA) disposed in a first row and a pixel PX (PXB) disposed in a second row, and a second-row pixel block BL is made up with a pixel PX (PXA) disposed in a third row and a pixel PX (PXB) disposed in a fourth row.

The transfer transistor TXA(n) in a pixel block BL(n), for instance, transfers an electric charge from the photodiode PDA(n) to the first node Pa(n), whereas the transfer transistor TXB(n) in the pixel block BL(n) transfers an electric charge from the photodiode PDB(n) to the first node Pa(n). The capacitance (charge/voltage conversion capacitance) is formed at the first node P(n) in relation to the reference electric potential and the electric charge transferred to the first node Pa(n) is converted to a voltage with the capacitance. The amplifier transistor AMP(n) outputs a signal corresponding to the electric potential at the first node Pa(n). These features are adopted in pixel blocks BL in other rows as well.

It is to be noted that the present invention may be also adopted in a configuration in which a pixel block BL is formed with pixels PX with the photodiodes PD thereof disposed at three or more consecutive positions along the columnar direction.

Although not shown in the figures, a plurality of different types color filters, each allowing light with a different color component to be transmitted, are disposed in a predetermined colorimetric array (e.g., a Bayer array) on the light entry side of the photodiodes PD at the individual pixels PX in the embodiment. A pixel PX outputs an electric signal corresponding to a specific color through color separation achieved via its color filter.

The first transistor SWA(n) constitutes the first switch unit via which the first node Pa(n) and the corresponding second node Pb(n) are electrically connected with each other and disconnected from each other. While such a first switch unit may be constituted by combining a plurality of switches such as transistors, it is desirable to configure it with a single first transistor SWA(n), as in the embodiment, so as to simplify the structure. This concept applies to other first transistors SWA as well.

Each second transistor SWB constitutes a second switch unit disposed so that the second node Pb corresponding to the first node Pa in one of each two pixel blocks BL adjacent to each other along the columnar direction, among the pixel blocks BL, and the second node Pb corresponding to the first node Pa in the other pixel block BL in the pair are electrically connected with each other and disconnected from each other via the second switch unit. As a result, the first nodes Pa in three or more pixel blocks BL are connected in a string via a plurality of second switch units in the embodiment. While such a second switch unit may be constituted by combining a plurality of switches such as transistors, it is desirable to configure it with a single second transistor SWB, as in the embodiment, so as to simplify the structure.

A second transistor SWB(n), for instance, is disposed so that the second node Pb(n) corresponding to the first node Pa(n) in a pixel block BL(n) in the nth row and the second node Pb(n−1) corresponding to the first node P(n−1) in the adjacent pixel block BL(n−1) in the (n−1)th row are electrically connected with each other and disconnected from each other via the second transistor SWB(n). Other second transistors SWB are disposed in a similar manner.

A reset transistor RST(n) constitutes the third switch unit that provides the source voltage VDD, to be used as a predetermined electric potential, to the second node Pb(n). While such a third switch unit may be constituted by combining a plurality of switches such as transistors, it is desirable to configure it with a single reset transistor RST(n), as in the embodiment, so as to simplify the structure. This concept applies to other reset transistors RST as well.

VDD in FIG. 30 and FIG. 31 indicates a source electric potential. It is to be noted that the transistors TXA, TXB, AMP, RST, SEL, SWA and SWB are each constituted with an nMOS transistor in the embodiment.

The gates of the transfer transistors TXA in each row are commonly connected to the control line 26, to which a control signal øTXA is provided from the vertical scanning circuit 21. The gates of the transfer transistors TXB in each row are commonly connected to the control line 25, to which a control signal øTXB is provided from the vertical scanning circuit 21. The gates of the reset transistors RST in each row are commonly connected to the control line 24, to which a control signal øRST is provided from the vertical scanning circuit 21. The gates of the selector transistors SEL in each row are commonly connected to the control line 23, to which a control signal øSEL is provided from the vertical scanning circuit 21. The gates of the first transistors SWA in each row are commonly connected to the control line 22, to which a control signal øSWA is provided from the vertical scanning circuit 21. The gates of the second transistors SWB in each row are commonly connected to the control line 27, to which a control signal øSWB is provided from the vertical scanning circuit 21. The control signal øTXA(n), for instance, is supplied to the gates of the transfer transistors TXA(n), the control signal øTXB(n) is supplied to the gates of the transfer transistors TXB(n), the control signal øRST(n) is supplied to the gates of the reset transistors RST(n), the control signal øSEL(n) is supplied to the gates of the selector transistors SEL(n), the control signal øSWA(n) is supplied to the gates of the first transistors SWA(n) and the control signal øSWB(n) is supplied to the gates of the second transistors SWB(n).

The transistors TXA, TXB, RST, SEL, SWA and SWB are turned on when the corresponding control signals øTXA, øTXB, øRST, øSEL, øSWA and øSWB are at high level (H) and are turned off when the corresponding control signals are at low level (L).

Under control executed by the image-capturing control unit 5 shown in FIG. 1, the vertical scanning circuit 21 outputs the control signals øTXA, øTXB, øRST, øSEL, øSWA and øSWB for each row of pixel blocks BL so as to achieve a still image read operation, a video read operation or the like by controlling the pixel blocks BL and the first transistors SWA and second transistors SWB with the control signals. Under this control, a read operation is executed in a specific operation mode among various operation modes to be described later, in correspondence to, for instance, the value set for the ISO sensitivity. Through the control, signals (analog signals) from the pixels PX in the corresponding column are provided to each vertical signal line 28.

The vertical scanning circuit 21 in the embodiment constitutes a control unit that executes operation by switching to a specific operation mode among the various operation modes to be described above in response to a command (control signal) issued by the image-capturing control unit 5 shown in FIG. 1.

The signals read out to the vertical signal line 28 corresponding to each column are amplified at the column amplifier 30 and then undergo processing executed at the CDS circuit 31 to obtain the difference between a light signal (a signal containing optical information resulting from the photoelectric conversion at a pixel PX) and a dark signal (a differential signal containing a noise component to be subtracted from the light signal) and are then converted to digital signals at the A/D converter 32. The digital signals resulting from the conversion are held in the A/D converter 32. The digital image signals held at the individual A/D converters 32 are horizontally scanned by the horizontal read circuit 33, are converted as needed to a predetermined signal format and are output to an external recipient (the digital signal-processing unit 6 in FIG. 1).

It is to be noted that the CDS circuit 31 receives a dark signal sampling signal øDARKC from a timing generation circuit (not shown) under control executed by the image-capturing control unit 5 shown in FIG. 1 and samples signals output from the column amplifier 30 as dark signals when øDARKC is at high level (H) and that the CDS circuit 31 receives a light signal sampling signal øSIGC from the timing generation circuit under control executed by the image-capturing control unit 5 in FIG. 1 and samples signals output from the column amplifier 30 as light signals when øSIGC is at H. Then, based upon a clock and a pulse provided from the timing generation circuit, the CDS circuit 31 outputs signals corresponding to the differences between the sampled dark signals and light signals. Such a CDS circuit 31 may adopt a structure of the known art.

In reference to FIG. 32 and FIG. 33, the structure of the pixel blocks BL will be described. While a color filter, a micro-lens and the like are actually disposed above each photodiode PD, they are not shown in FIGS. 32 and 33. It is to be noted that the layout of the power lines, ground lines and control lines 22 through 27 is not included in the illustrations provided in FIG. 32 and FIG. 33.

Various elements in the pixel block BL, such as the photodiodes PD, are disposed in a P well (not shown) formed on an N-type silicon substrate (not shown) in the embodiment. Reference numerals 41 through 50 in FIG. 33 each indicate an N-type impurity diffusion area forming part of a given transistor among the various transistors mentioned earlier. Reference numerals 61 through 67 each indicate a gate electrode of a given transistor constituted of polysilicon. It is to be noted that the diffusion areas 42 and 50 are areas where the source voltage VDD is applied through a power line (not shown).

The photodiodes PDA(n) and PDB(n) are pinned photodiodes (hole accumulated diodes) each constituted with an N-type charge accumulation layer (not shown) formed within the P well and a P-type and a P-type depletion preventing layer (not shown) disposed on the side where the front surface of the N-type charge accumulation layer is present. The incoming light undergoes photoelectric conversion at the photodiodes PDA(n) and PDB(n) and the charges resulting from the photoelectric conversion are then stored in the respective charge accumulation layers.

The transfer transistor TXA(n) is an nMOS transistor with a source, a drain and a gate thereof respectively constituted with the charge accumulation layer of the photodiode PDA(n), the diffusion area 41 and a gate electrode 61. The transfer transistor TXB(n) is an nMOS transistor with a source, a drain and a gate thereof respectively constituted with the charge accumulation layer of the photodiode PDB(n), the diffusion area 41 and the gate electrode 62. The diffusion area 41 is formed between the photodiode PDA(n) and the photodiode PDB(n). The diffusion area 41 is a shared diffusion area that functions as both the drain of the transfer transistor TXA(n) and the drain of the transfer transistor TXB(n). The gate electrode 61 of the transfer transistor TXA(n) is disposed on the side of the diffusion area 41 further toward the photodiode PDA(n). The gate electrode 62 of the transfer transistor TXB(n) is disposed on the side of the diffusion area 41 further toward the photodiode PDB(n).

The amplifier transistor AMP(n) is an nMOS transistor with a drain, a source and a gate thereof respectively constituted with the diffusion area 42, the diffusion area 43 and the gate electrode 63. The selector transistor SEL(n) is an nMOS transistor with a drain, a source and a gate thereof respectively constituted with the diffusion area 43, the diffusion area 44 and the gate electrode 64. The diffusion area 44 is connected to the vertical signal line 28.

The first transistor SWA(n) is an nMOS transistor with a source, a drain and a gate thereof respectively constituted with the diffusion area 45, the diffusion area 46 and the gate electrode 65. The second transistor SWB(n) is an nMOS transistor with a drain, a source and a gate thereof respectively constituted with the diffusion area 47, the diffusion area 48 and the gate electrode 66. The reset transistor RST(n) is an nMOS transistor with a source, a drain and a gate thereof respectively constituted with the diffusion area 49, the diffusion area 50 and the gate electrode 67.

The gate electrode 63 and the diffusion areas 41 and 45 in the pixel block BL(n) are electrically connected with one another through a wiring 71(n), thereby achieving electrical continuity. The first node Pa(n) in the embodiment is equivalent to the wiring 71(n) and the entire region where electrical continuity is achieved through the electrical connection via the wiring 71(n).

The drain diffusion area 46 of the first transistor SWA(n), the drain diffusion area 47 of the second transistor SWB(n), the source diffusion area 49 of the reset transistor RST(n) and the source diffusion area 48 of the second transistor SWB(n+1) are electrically connected with one another through a wiring 72(*n*). The second node Pb(n) is equivalent to the wiring 72(*n*) and the entire region where electrical continuity is achieved through the electrical connection via the wiring 72(*n*). This concept also applies with regard to other first transistors SWA, other second transistors SWB and other reset transistors RST.

The pixel blocks BL in rows other than the nth row are structured similarly to the nth-row pixel block BL(n) described above. The first transistors SWA other than the first transistor SWA(n) are structured similarly to the first transistor SWA(n) described above. The second transistors SWB other than the second transistor SWB(n) are structured similarly to the second transistor SWB(n) described above. The reset transistors RST other than the reset transistor RST(n) are structured similarly to the reset transistor RST(n) described above.

CC(n) in FIGS. 30 through 33 is a capacitance formed between the first node Pa(n) and the reference electric potential when the first transistor SWA(n) is in the off state. Cfd1 indicates the capacitance value of the capacitance CC(n). CD(n) is a capacitance formed between the wiring 72(*n*) and the reference electric potential when the first transistor SWA(n), the second transistors SWB(n) and SWB(n+1) and the reset transistor RST(n) are in the off state. Cfd2 indicates the capacitance value of the capacitance CD(n). Similar notations are applied with regard to other first transistors SWA, other second transistors SWB and other reset transistors RST.

The capacitance CC(n) is made up with the capacitance in the drain diffusion area 41 shared by the transfer transistors TXA(n) and TXB(n), the capacitance in the source diffusion area of the first transistor SWA(n), the capacitance at the gate electrode 63 of the amplifier transistor AMP(n) and the wiring capacitance at the wiring 71(*n*), and the capacitance value Cfd1 of the capacitance CC(n) equals the total sum of their capacitance values. This principle also applies to other rows of pixel blocks BL. It is to be noted that since the capacitance CC(n) does not include the capacitance in the drain diffusion area 47 of the second transistor SWB(n) and the source diffusion area 49 of the reset transistor RST(n), the capacitance CC(n) takes a capacitance value Cfd1 smaller by the corresponding extent.

The value assumed for the channel capacitance when the first transistor SWA is in the on state and the value assumed for the channel capacitance when the second transistor SWB is in an on state are both notated as Csw. The capacitance value Csw is normally smaller than the capacitance values Cfd1 and Cfd2.

When the first transistor SWA(n) in a pixel block BL(n) is turned off (i.e., a transistor SWA in the on state among the various first transistors SWA and second transistors SWB does not achieve an electrical connection to the first node Pa(n)) and thus, the capacitance (charge/voltage conversion capacitance) between the first node Pa(n) and the reference electric potential is the capacitance CC(n). The capacitance value of the charge/voltage conversion capacitance at the first node Pa(n) is thus Cfd1. This state is equivalent to the state when the first node Pa(n) is not reset during a period TA in FIG. 34, (i.e., the state in which øSWA(n) is at L during the period T2 in FIG. 34), which shows a first operation mode to be described later.

Figure 35:
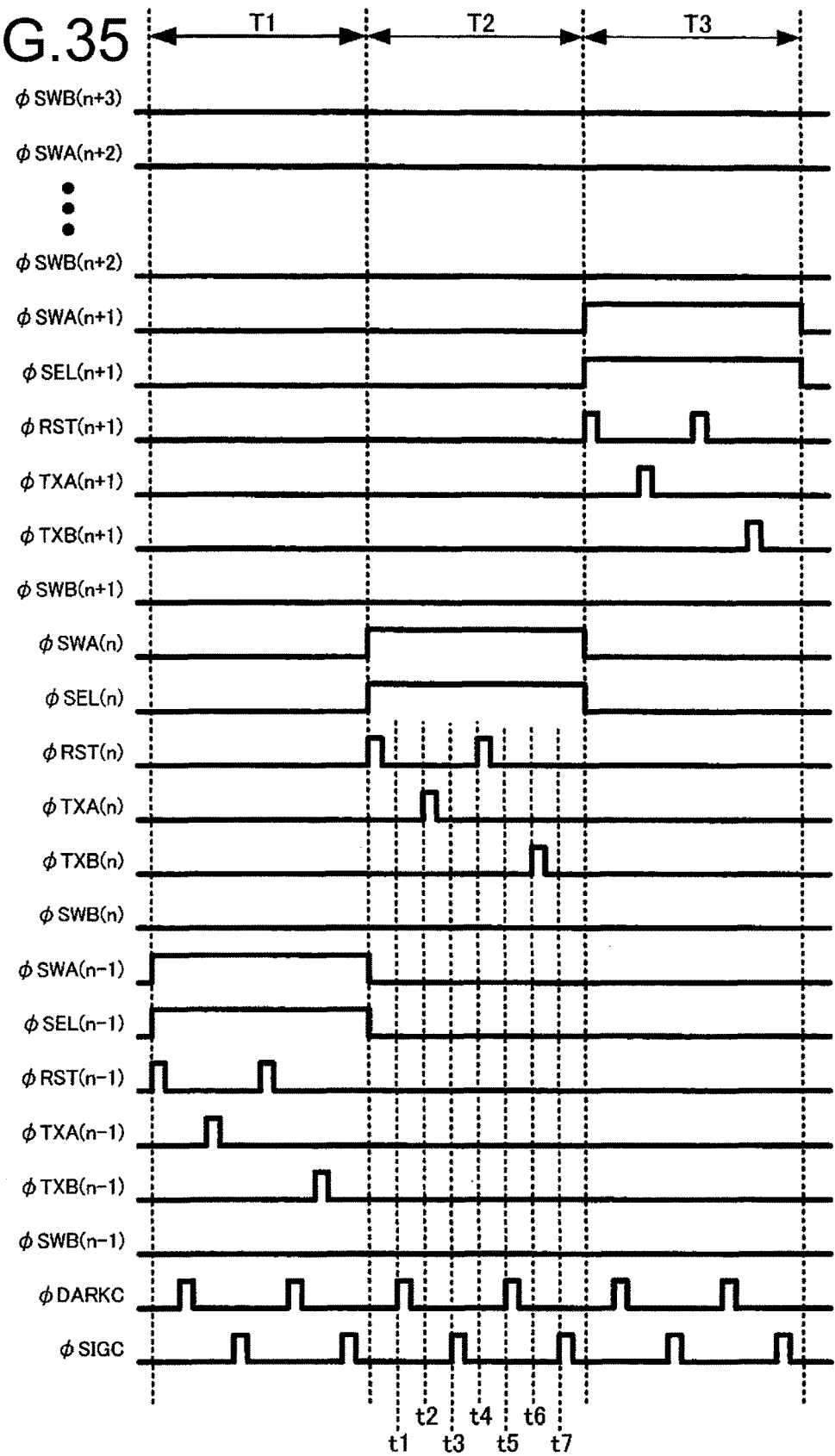
FIG. 35 A timing chart pertaining to another operation mode that may be selected in the solid-state image sensor shown in FIG. 30

In addition, when the first transistor SWA(n) in the pixel block BL(n) is turned on, the capacitance (charge/voltage conversion capacitance) between the first node Pa(n) and the reference electric potential equals a sum calculated by adding the capacitance CD(n) and the channel capacitance of the first transistor SWA(n) in the on state to the capacitance CC(n), unless a transistor in the on state other than the linking transistor SW among the various first transistors SWA and second transistors SWB enters a state of electrical connection to the first node Pa(n) (in more specific terms, if the second transistors SWB(n) and SWB(n+1) are in the off state). Under these circumstances, the capacitance value of the charge/voltage conversion capacitance at the first node Pa(n) is expressed as; Cfd1+Cfd2+Csw≈Cfd1+Cfd2. This state is equivalent to the state that occurs during the period T2 in FIG. 35 illustrating a second operation mode, which will be described later.

Figure 36:
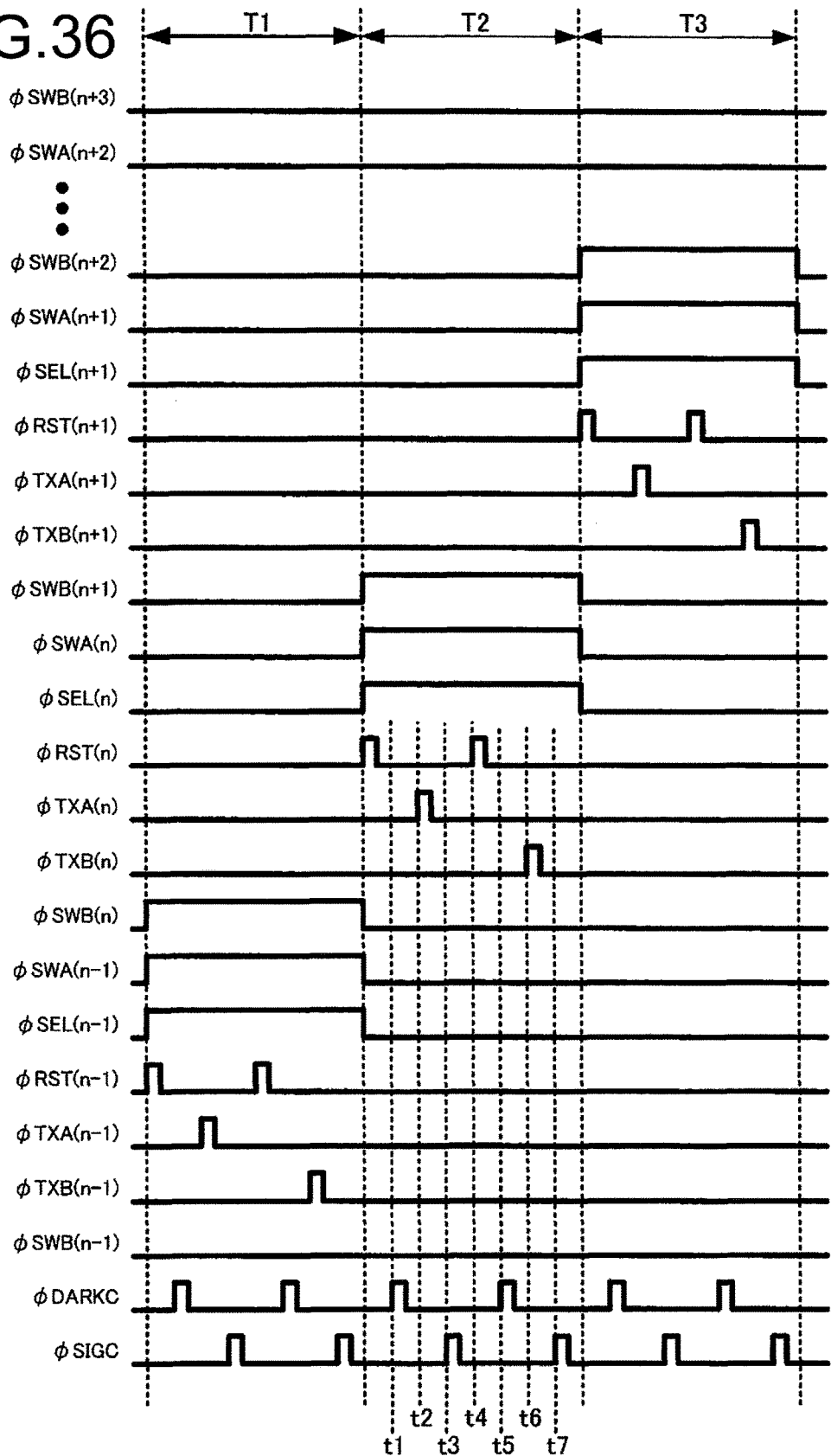
FIG. 36 A timing chart pertaining to yet another operation mode that may be selected in the solid-state image sensor shown in FIG. 30

Furthermore, when the first transistor SWA(n) and the second transistor SWB(n+1) are both turned on in relation to the pixel block BL(n), the charge/voltage conversion capacitance at the first node Pa(n) equals a sum calculated by adding the capacitance CD(n), the capacitance CD(n+1) and the channel capacitances of the transistors SWA(n) and SWB(n+1) in the on state to the capacitance CC(n), unless a transistor in the on state other than the transistors SWA(n) and SWB(n+1), among the various first transistors SWA and second transistors SWB enters a state of electrical connection to the first node Pa(n) (in more specific terms, if the transistors SWB(n), SWA(n+1) and SWB(n+2) are in the off state). Accordingly, the capacitance value of the charge/voltage conversion capacitance at the first node Pa(n) is expressed as; Cfd1+2×Cfd2+2×Csw≈Cfd1+2×Cfd2. This state is equivalent to the state that occurs during the period T2 in FIG. 36 illustrating a third A operation mode, which will be described later.

Figure 37:
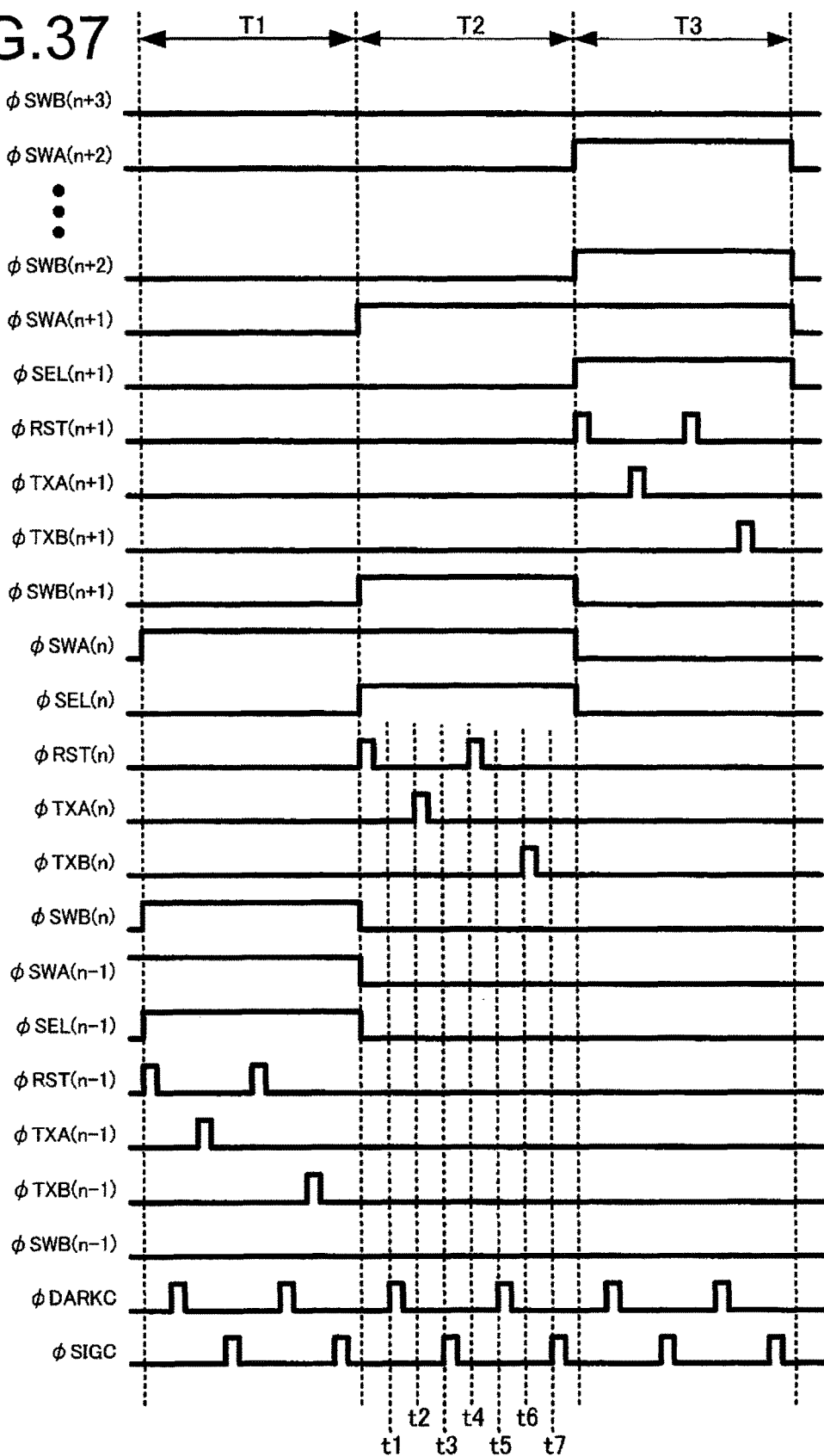
FIG. 37 A timing chart pertaining to still another operation mode that may be selected in the solid-state image sensor shown in FIG. 30

Moreover, when the first transistors SWA(n) and SWA(n+1) and the second transistor SWB(n+1) are turned on in relation to the pixel block BL(n), the charge/voltage conversion capacitance at the first node Pa(n) equals a sum calculated by adding the capacitance CD(n), the capacitance CD(n+1), the capacitance CC(n+1) and the channel capacitances of the transistors SWA(n), SWA(n+1) and SWB(n+1) in the on state to the capacitance CD(n), unless a transistor in the on state other than the transistors SWA(n), SWA(n+1) and SWB(n+1), among the various first transistors SWA and second transistors SWB, enters a state of electrical connection to the first node Pa(n) (in more specific terms, if the transistors SWB(n) and SWB(n+2) are in the off state). Accordingly, the capacitance value of the charge/voltage conversion capacitance at the first node Pa(n) is expressed as; 2×Cfd1+2×Cfd2+3×Csw≈2×Cfd1+2×Cfd2. This state is equivalent to the state that occurs during the period T2 in FIG. 37 illustrating a third B operation mode, which will be described later.

Figure 38:
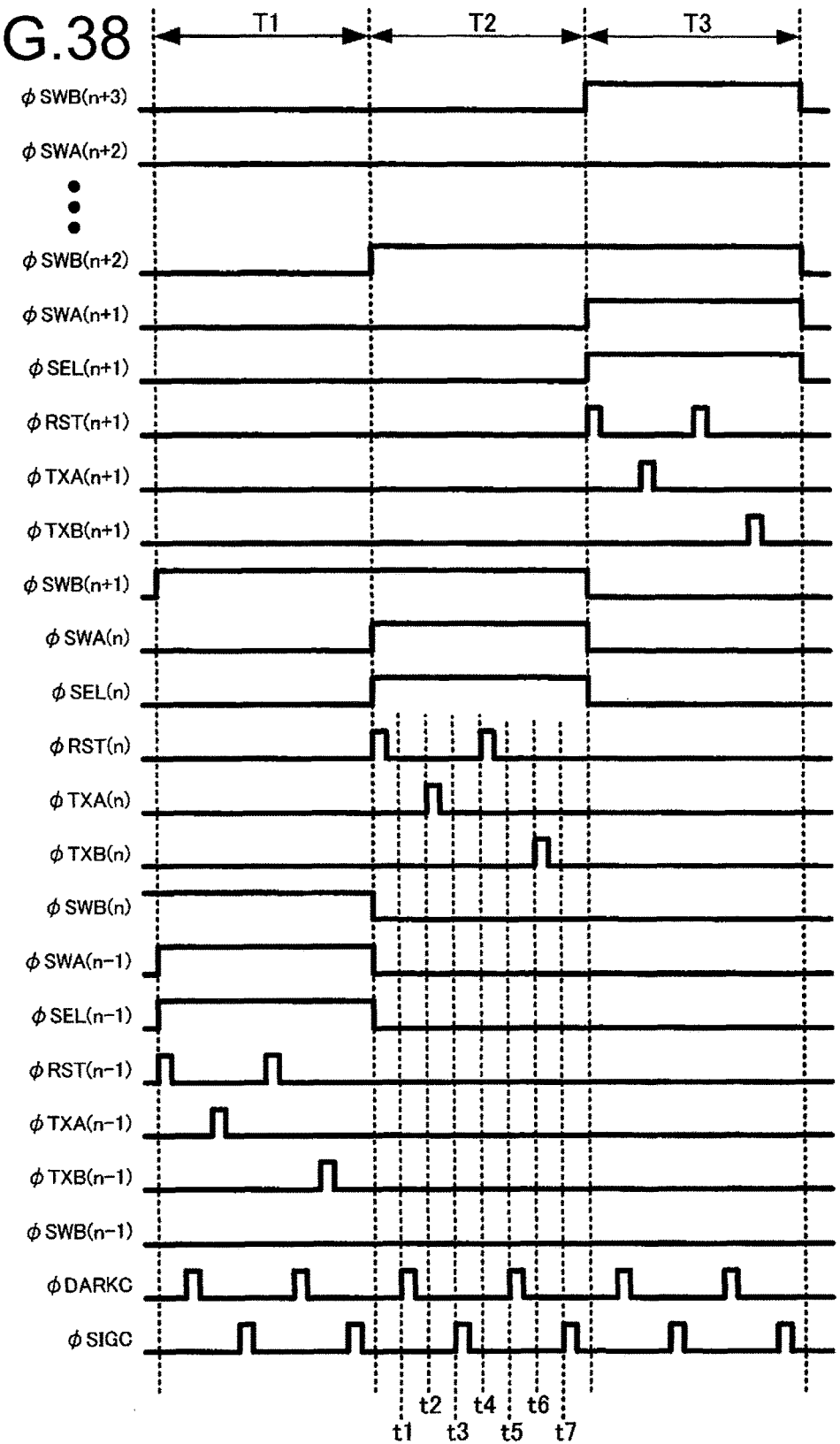
FIG. 38 A timing chart pertaining to still another operation mode that may be selected in the solid-state image sensor shown in FIG. 30

In addition, when the first transistor SWA(n) and the second transistors SWB(n+1) and SWB(n+2) are turned on in relation to the pixel block BL(n), the charge/voltage conversion capacitance at the first node Pa(n) equals a sum calculated by adding the capacitance CD(n), the capacitance CD(n+1), the capacitance CD(n+2) and the channel capacitances of the transistors SWA(n), SWB(n+1) and SWB(n+2) in the on state to the capacitance CC(n), unless a transistor in the on state other than the transistors SWA(n), SWB(n+1) and SWB(n+2), among the various first transistors SWA and second transistors SWB, enters a state of electrical connection to the first node Pa(n) (in more specific terms, if the transistors SWA(n+1), SWA(n+2), SWB(n) and SWB(n+3) are in the off state). Accordingly, the capacitance value of the charge/voltage conversion capacitance at the first node Pa(n) is expressed as; Cfd1+3×Cfd2+3×Csw2≈Cfd1+3×Cfd2. This state is equivalent to the state that occurs during the period T2 in FIG. 38 illustrating a third C operation mode, which will be described later.

Thus, as long as there is no transistor in the on state that is electrically connected to the first node Pa(n), among the various first transistors SWA and second transistors SWB, the capacitance value of the charge/voltage conversion capacitance Cfd1 at the first node Pa(n) takes the smallest capacitance value Cfd1 and thus, a greater value is taken for the charge/voltage conversion coefficient corresponding to the charge/voltage conversion capacitance, thereby enabling a read at the highest possible SN ratio.

In addition, the number of transistors in the on state that are electrically connected to the first node Pa(n), among the various first transistors SWA and second transistors SWB, may be increased to a desired value equal to or greater than 1 so as to raise the capacitance value of the charge/voltage conversion capacitance at the first node Pa(n) to a desired value and thus enable handling of a greater signal charge quantity, which, in turn, makes it possible to increase the number of saturation electrons. This ultimately makes it possible to increase the dynamic range.

While a description is given above in reference to the first node Pa(n) in the pixel block BL(n), the principle described above also applies to the first nodes Pa in other pixel blocks BL.

Figure 34:
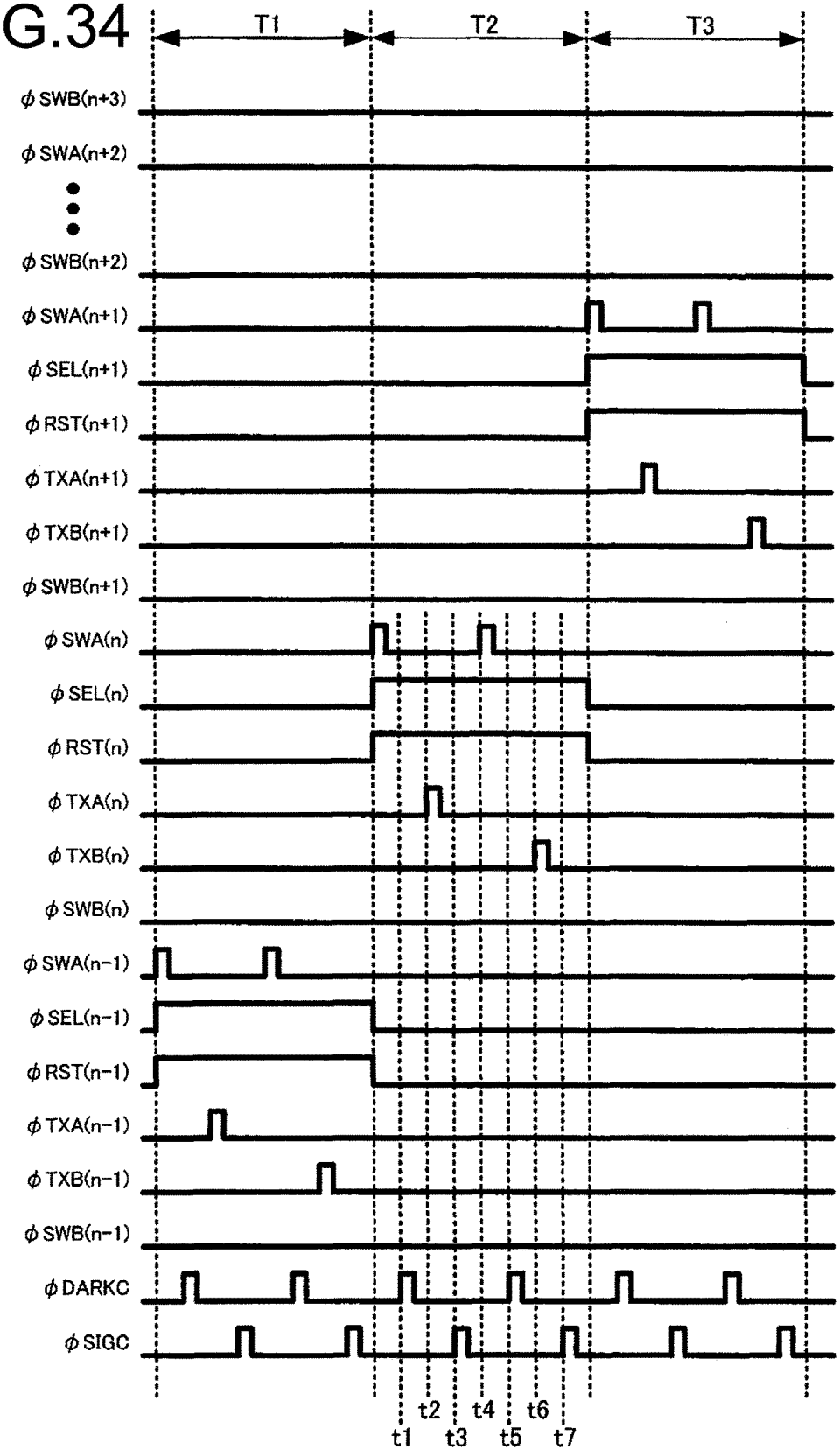
FIG. 34 A timing chart pertaining to a specific operation mode that may be selected in the solid-state image sensor shown in FIG. 30

FIG. 34 is a timing chart pertaining to the first operation mode that may be selected in the solid-state image sensor 804 shown in FIG. 30. In a typical example of an operation executed in the first operation mode, the pixel blocks BL are sequentially selected in units corresponding to the individual rows, the transfer transistors TXA and TXB in the selected pixel blocks BL are selectively turned on in sequence while there is no transistor in the on state that is electrically connected to the first node Pa in each selected pixel block BL (i.e., while the charge/voltage conversion capacitance at the first node Pa is at the lowest) among the various first transistors SWA and second transistors SWB, and signals from the photodiodes PDA and PDB in the selected pixel blocks BL are sequentially read out in correspondence to the individual rows. While signals are read out from all the pixels PXA and PXB in the example presented in FIG. 34, the present invention is not limited to this example and signals may be read through a culled read (a sub-sampling read) by skipping some pixel rows. Such a culled read may also be executed in the examples presented in FIG. 35 through FIG. 38.

FIG. 34 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. Since the operation executed when the pixel blocks BL in a given row are selected is identical to the operation executed when the pixel blocks BL in any other row are selected, the following explanation will focus on the operation executed when the pixel block BL(n) in the nth row are selected.

Exposure via the photodiodes PDA(n) and PDA(n) will have been completed through a predetermined exposure time preceding the start of the period T2. This exposure is executed via a mechanical shutter (not shown) following a global reset, whereby all the pixels are reset simultaneously in a regular main shooting operation (still image shooting operation) and the like, whereas it is executed through an operation commonly referred to as a rolling electronic shutter operation in the electronic viewfinder mode or in a video shooting operation. Immediately before the period T2 starts, all the transistors SEL, RST, TXA, TXB, SWA and SWB are in the off state.

At the start of the period T2, øSEL(n) for the nth row is set to H so as to turn on the selector transistors SEL(n) in the nth-row pixel blocks BL(n) and select the pixel blocks BL(n) in the nth row. In addition, during the period T2, øRST(n) for the nth row is set to H, thereby turning on the reset transistors RST(n). It is to be noted that the reset transistors RST(n) do not need to retain the on state through the entire period T2, and øRST(n) may be set to H only when the first nodes Pa(n) are reset (i.e., during the H phase of øSWA(n) in FIG. 34).

Over a predetermined length of time (when the first nodes Pa(n) are reset) following the start of the period T2, øSWA(n) is set to H, thereby turning on the first transistors SWA(n) in the nth row. Since øRST(n) is at H and the reset transistors RST(n) are in the on state at this time, the electric potential at the first nodes Pa(n) is reset to the source electric potential VDD via the reset transistors RST(n) in the on state and the first transistors SWA(n) in the on state.

Once the first transistors SWA(n) are subsequently turned off, there is no longer any transistor in the on state, among the various transistors SWA and SWB, that is electrically connected to the first node P(n) in each pixel block BL(n) in the selected row. Thus, the charge/voltage conversion capacitance at each first node Pa(n) takes on the smallest capacitance value Cfd1.

Over a predetermined length of time starting at a following time point t1 during the period T2, the dark signal sampling signal øDARKC is set to H and the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t2 during the period T2, øTXA(n) is set to H so as to turn on the nth row transfer transistors TXA(n). As a result, the signal charges having been accumulated in the photodiodes PDA(n) in the nth-row pixel blocks BL(n) are transferred to the charge/voltage conversion capacitances at the first nodes Pa(n). The electric potential at each first node Pa(n) minus the noise component takes on a value that is in proportion to both the quantity of the corresponding signal charge and the reciprocal of the capacitance value of the charge/voltage conversion capacitance at the particular first node Pa(n).

At a following time point t3 during the period T2, the light signal sampling signal øSIGC is set to H, and thus, the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a time point at which øSIGC is set to L, each CDS circuit 31 outputs a signal corresponding to the difference between the dark signal sampled over the predetermined length of time starting at the time point t1 and the light signal sampled over the predetermined length of time starting at the time point t3. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

Over a predetermined length of time (when the first nodes Pa (n) are reset) following a time point t4 during the period T2, øSWA(n) is set to H, thereby turning on the first transistors SWA(n) in the nth row. Since øSEL(n) is at H and the reset transistors RST(n) are in the on state at this time, the electric potential at the first nodes Pa(n) is reset to the source electric potential VDD via the reset transistors RST (n) in the on state and the first transistors SWA(n) in the on state.

Once the first transistors SWA(n) are subsequently turned off, there is no longer any transistor in the on state, among the various transistors SWA and SWB, that is electrically connected to the first node P(n) in each pixel block BL(n) in the selected row.

Thus, the charge/voltage conversion capacitance at each first node Pa(n) takes on the smallest capacitance value Cfd1.

Over a predetermined length of time starting at a following time point t1 during the period T2, the dark signal sampling signal øDARKC is set to H and thus, the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a dark signal by the corresponding CDS circuit 31.

Over a predetermined length of time starting at a following time point t6 during the period T2, øTXB(n) is set to H so as to turn on the nth row transfer transistors TXB(n). As a result, the signal charges having been accumulated in the photodiodes PDB(n) in the nth-row pixel blocks BL(n) are transferred to the charge/voltage conversion capacitances at the first nodes Pa(n). The electric potential at each first node Pa(n) minus the noise component takes on a value that is in proportion to both the quantity of the corresponding signal charge and the reciprocal of the capacitance value of the charge/voltage conversion capacitance at the particular first node Pa(n).

At a following time point t7 during the period T2, the light signal sampling signal øSIGC is set to H, and the electric potential at each first node Pa(n) is amplified via the corresponding nth-row amplifier transistor AMP(n), and then passes through the selector transistor SEL(n) and the vertical signal line 28 before it is further amplified at the corresponding column amplifier 30. The amplified signal is then sampled as a light signal by the corresponding CDS circuit 31.

Following a subsequent time point at which øSIGC is set to L, each CDS circuit 31 outputs a signal corresponding to the difference between the dark signal sampled over the predetermined length of time starting at the time point t5 and the light signal sampled over the predetermined length of time starting at the time point t7. The corresponding A/D converter 32 converts the signal corresponding to the difference to a digital signal and retains the digital signal. The digital image signals held at the individual A/D converters 32 are horizontally scanned via the horizontal read circuit 33, which then outputs them as digital image signals to an external recipient (i.e., the digital signal-processing unit 6 in FIG. 1).

In the first operation mode described above, there is no transistor in the on state that is electrically connected to the first node Pa in each selected pixel block BL, among the various transistors SWA and SWB, and thus, the charge/voltage conversion capacitance at the first node Pa in each selected pixel block BL takes on the smallest capacitance value, resulting in a greater charge/voltage conversion coefficient corresponding to the charge/voltage conversion capacitance, which, in turn, enables a read operation at the highest possible SN ratio. The image-capturing control unit 5 issues a command for the first operation mode when, for instance, the ISO sensitivity is set to the highest value.

FIG. 35 is a timing chart pertaining to the second operation mode that may be selected in the solid-state image sensor 804 shown in FIG. 30. The second operation mode is a type of second operation mode. In this second operation mode, the pixel blocks BL are sequentially selected in units of individual rows, and the transfer transistors TXA and TXB in each selected pixel block BL are selectively turned on in sequence while one transistor SWA in the on state, among the various first transistors SWA and second transistors SWB, is electrically connected to the first node Pa in the selected pixel block BL so as to sequentially read out signals output from the photodiodes PDA and PDB in the selected pixel blocks BL in units of the individual rows.

As does FIG. 34, FIG. 35 indicates that pixel blocks BL(n−1) in the (n−1)th row are selected during the period T1, and that pixel blocks BL(n) in the nth row are selected during the period T2 and the pixel blocks BL(n+1) in the (n+1)th row are selected during the period T3. The following is a description of the features of the second operation mode shown in FIG. 35 that distinguish it from the first operation mode shown in FIG. 34.

In the second operation mode shown in FIG. 35, during the period T2 through which the nth-row pixel blocks BL(n) are selected, øSWA(n) is set to H and øSWB(n) and SWB (n+1) are set to L, thereby turning on the first transistors SWA(n) and turning off the second transistors SWB(n−1) and øSWB(n+1). Thus, the selected pixel blocks BL(n) each assume a state that occurs during the period T2 in which one first transistor SW in an on state (the first transistor SWA(n) in this example), among the various transistors SWA and SWB is electrically connected to the first node Pa(n) therein. As a result, the charge/voltage conversion capacitance at the first node Pa(n) takes on a capacitance value expressed as; Cfd1+Cfd2+Csw≈Cfd1+Cfd2 as explained earlier, achieving an increase in the capacitance value by an extent equivalent to one stage over that achieved in the first operation mode shown in FIG. 34.

In addition, in the second operation mode shown in FIG. 35, through which øSWA(n) is sustained at H and the first transistors SWA(n) thus remain in the on state, øRST(n) is set to H and the reset transistors RST(n) are thus set to the on state only when the first nodes Pa(n) are reset (over a predetermined length of time immediately following the start of the period T2 and over a predetermined length of time following the time point t4 during the period T2). Through these measures, it is ensured that the electric potential at the first nodes Pa(n) is reset in an optimal manner.

While an explanation has been given in reference to the period T2 through which the nth-row pixel blocks BL(n) are selected, a similar operation is executed during periods through which other pixel blocks BL are selected.

In the second operation mode described above, one first transistor SWA in the on state among the various transistors SWA and SWB, is electrically connected to the first node Pa in each selected pixel block BL, thereby achieving an increase in the capacitance value of the charge/voltage conversion capacitance at the first node Pa in the selected pixel block BL by an extent equivalent to one stage, which allows the number of saturation electrons corresponding to the charge/voltage conversion capacitance at the first node Pa to be increased by an extent equivalent to one stage. As a result, the dynamic range can be expanded by an extent equivalent to one stage. The image-capturing control unit 5 issues a command for operation in the second operation mode when, for instance, a value smaller than the highest value by one step is set for the ISO sensitivity.

FIG. 36 is a timing chart pertaining to the third A operation mode that may be selected in the solid-state image sensor 804 shown in FIG. 30. The third A operation mode is a type of third operation mode. This third operation mode represents an example of an operation in which the pixel blocks BL are sequentially selected in units of individual rows and the signals from the various photodiodes PDA and PDB in the selected pixel blocks BL are sequentially read out in units of individual rows by selectively turning on the transfer transistors TXA and TXB in the selected pixel blocks BL in sequence as the first transistor SWA via which the first node Pa in each selected pixel block BL and the corresponding second node Pb are electrically connected with each other and disconnected from each other is set in the on state, the second transistor SWB electrically connected to the second node Pb corresponding to the first node Pa in the selected pixel block BL is set in the on state and the reset transistor RST that provides the source electric potential VDD to the second nodes Pb corresponding to the first node Pa in the selected pixel block BL is turned on only when the first node Pa in the selected pixel block BL is reset. The third A operation mode represents an example of an operation executed in the third operation mode, in which one first transistor SWA in the on state and one second transistor SWB in the on state are electrically connected to the first node Pa in the selected pixel block BL.

As does FIG. 34, FIG. 36 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the third A operation mode shown in FIG. 36 that distinguish it from the first operation mode shown in FIG. 36.

In the third A operation mode shown in FIG. 36, during the period T2 through which the nth-row pixel blocks BL(n) are selected, øSWA(n) and øSWB(n+1) are set to H and øSWA(n+1), øSWB(n) and øSWB(n+1) are set to L, thereby turning on the first transistor SWA(n) and the second transistor SWB(n+1), and turning off the first transistors SWA(n+1) and the second transistors SWB(n) and SWB(n+2). Thus, the selected pixel blocks BL(n) each assume a state that occurs during the period T2 in which one first transistor SWA in the on state (the first transistor SWA(n) in this example) and one second transistor SWB in the on state (the second transistor SWB(n+1) in this example), among the various transistors SWA and SWB are electrically connected to the first node Pa(n) therein. As a result, the charge/voltage conversion capacitance at the first node Pa(n) takes on a capacitance value expressed as; Cfd1+Cfd2+Csw≈Cfd1+Cfd2 as explained earlier, achieving an increase in the capacitance value by an extent equivalent to two stages over that achieved in the first operation mode shown in FIG. 34.

In addition, in the third A operation mode shown in FIG. 36, through which øSWA(n) is sustained at H and the first transistors SWA(n) thus remain in the on state, øRST(n) is set to H and the reset transistors RST(n) are thus set to the on state only when the first nodes Pa(n) are reset (over a predetermined length of time immediately following the start of the period T2 and over a predetermined length of time following the time point t4 during the period T2). Through these measures, it is ensured that the electric potential at the first nodes Pa(n) is reset in an optimal manner. A similar feature is adopted in a third B operation mode and a third C operation mode to be described later in reference to FIG. 37 and FIG. 38 respectively.

While an explanation has been given in reference to the period T2 through which the nth-row pixel blocks BL(n) are selected, a similar operation is executed during periods through which other pixel blocks BL are selected.

In the third operation mode described above, one first transistor SWA in the on state and one second transistor SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by an extent equivalent to two stages, which allows the number of saturation electrons corresponding to the charge/voltage conversion capacitance at the first node Pa to be increased by an extent equivalent to two stages. As a result, the dynamic range can be expanded by two stages. The image-capturing control unit 5 issues a command for operation in the third A operation mode when, for instance, a value smaller than the highest value by two steps is set for the ISO sensitivity.

FIG. 37 is a timing chart pertaining to the third B operation mode that may be selected in the solid-state image sensor 804 shown in FIG. 30. The third B operation mode represents an example of an operation executed in the third operation mode, in which two first transistors SWA in the on state and one second transistor SWB in the on state are electrically connected to the first node Pa in each selected pixel block BL.

As does FIG. 32, FIG. 37 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the third B operation mode shown in FIG. 37 that distinguish it from the first operation mode shown in FIG. 32.

In the third B operation mode shown in FIG. 37, during the period T2 through which the nth-row pixel blocks BL(n) are selected, øSWA(n), øSWA(n+1) and øSWB(n+1) are set to H and øSWB(n) and øSWB(n+2) are set to L, thereby turning on the first transistors SWA(n) and SWA(n+1) and the second transistors SWB(n+1), and turning off the second transistors SWB(n) and SWB(n+2). Thus, the selected pixel blocks BL(n) each assume a state that occurs during the period T2 in which two first transistors SWA in the on state (the first transistors SWA(n) and SWA(n+1) in this example) and one second transistor SWB in the on state (the second transistor SWB(n+1) in this example), among the various transistors SWA and SWB are electrically connected to the first node Pa(n) therein. As a result, the charge/voltage conversion capacitance at the first node Pa(n) takes on a capacitance value expressed as; 2×Cfd1+2×Cfd2+3×Csw≈2×Cfd1+2×Cfd as explained earlier, achieving an increase in the capacitance value by an extent equivalent to three stages over that achieved in the first operation mode shown in FIG. 34.

While an explanation has been given in reference to the period T2 through which the nth-row pixel blocks BL(n) are selected, a similar operation is executed during periods through which other pixel blocks BL are selected.

In the third B operation mode described above, two first transistors SWA in the on state and one second transistor SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by three stages, which allows the number of saturation electrons corresponding to the charge/voltage conversion capacitance at the first node Pa to be increased by an extent equivalent to three stages. As a result, the dynamic range can be expanded by three stages. The image-capturing control unit 5 issues a command for operation in the third B operation mode when, for instance, a value smaller than the highest value by three steps is set for the ISO sensitivity.

FIG. 38 is a timing chart pertaining to the third C operation mode that may be selected in the solid-state image sensor 804 shown in FIG. 30. In the third C operation mode, the pixel blocks BL are sequentially selected in units of individual rows, and the transfer transistors TXA and TXB in each selected pixel block BL are selectively turned on in sequence while one first transistor SWA in the on state and two second transistors SWB in the on state, among the various first transistors SWA and second transistors SWB, are electrically connected to the first node Pa in the selected pixel block BL so as to sequentially read out signals output from the photodiodes PDA and PDB in the selected pixel blocks BL in units of the individual rows.

As does FIG. 34, FIG. 38 indicates that pixel blocks BL(n−1) in the (n−1)th row are selected during the period T1, that pixel blocks BL(n) in the nth row are selected during the period T2 and that pixel blocks BL(n+1) in the (n+1)th row are selected during the period T3. The following is a description of the features of the third C operation mode shown in FIG. 38 that distinguish it from the first operation mode shown in FIG. 32.

In the third C operation mode shown in FIG. 38, during the period T2 through which the nth-row pixel blocks BL(n) are selected, øSWA(n), øSWB(n+1) and øSWB(n+2) are set to H and øSWA(n+1), øSWA(n+2), øSWB(n) and øSWB(n+3) are set to L, thereby turning on the first transistors SWA(n) and the second transistors SWB(n+1) and SWB(n+2), and turning off the first transistors SWA(n+1) and SWA(n+2) and the second transistors SWB(n) and SWB(n+3). Thus, the selected pixel blocks BL(n) each assume a state that occurs during the period T2 in which one first transistor SWA in the on state (the first transistor SWA(n) in this example) and two second transistors SWB in the on state (the second transistors SWB(n+1) and SWB(n+2) in this example), among the various transistors SWA and SWB are electrically connected to the first node Pa(n) therein. As a result, the charge/voltage conversion capacitance at the first node Pa(n) takes on a capacitance value expressed as; Cfd1+3×Cfd2+3×Csw≈Cfd1+3×Cfd2, as explained earlier, achieving an increase in the capacitance value by an extent equivalent to three stages over that achieved in the first operation mode shown in FIG. 32.

While an explanation has been given in reference to the period T2 through which the nth-row pixel blocks BL(n) are selected, a similar operation is executed during periods through which other pixel blocks BL are selected.

In the third C operation mode described above, one first transistor SWA in the on state and two second transistors SWB in the on state among the various transistors SWA and SWB, are electrically connected to the first node Pa in each selected pixel block BL, thereby achieving an increase in the capacitance value of the charge/voltage conversion capacitance at the first node Pa in the selected pixel block BL by three stages, which allows the number of saturation electrons corresponding to the charge/voltage conversion capacitance at the first node Pa to be increased by an extent equivalent to three stages. As a result, the dynamic range can be expanded by three stages. The image-capturing control unit 5 issues a command for operation in the second operation mode when, for instance, a value smaller than the highest value by three steps is set for the ISO sensitivity.

Figure 39:
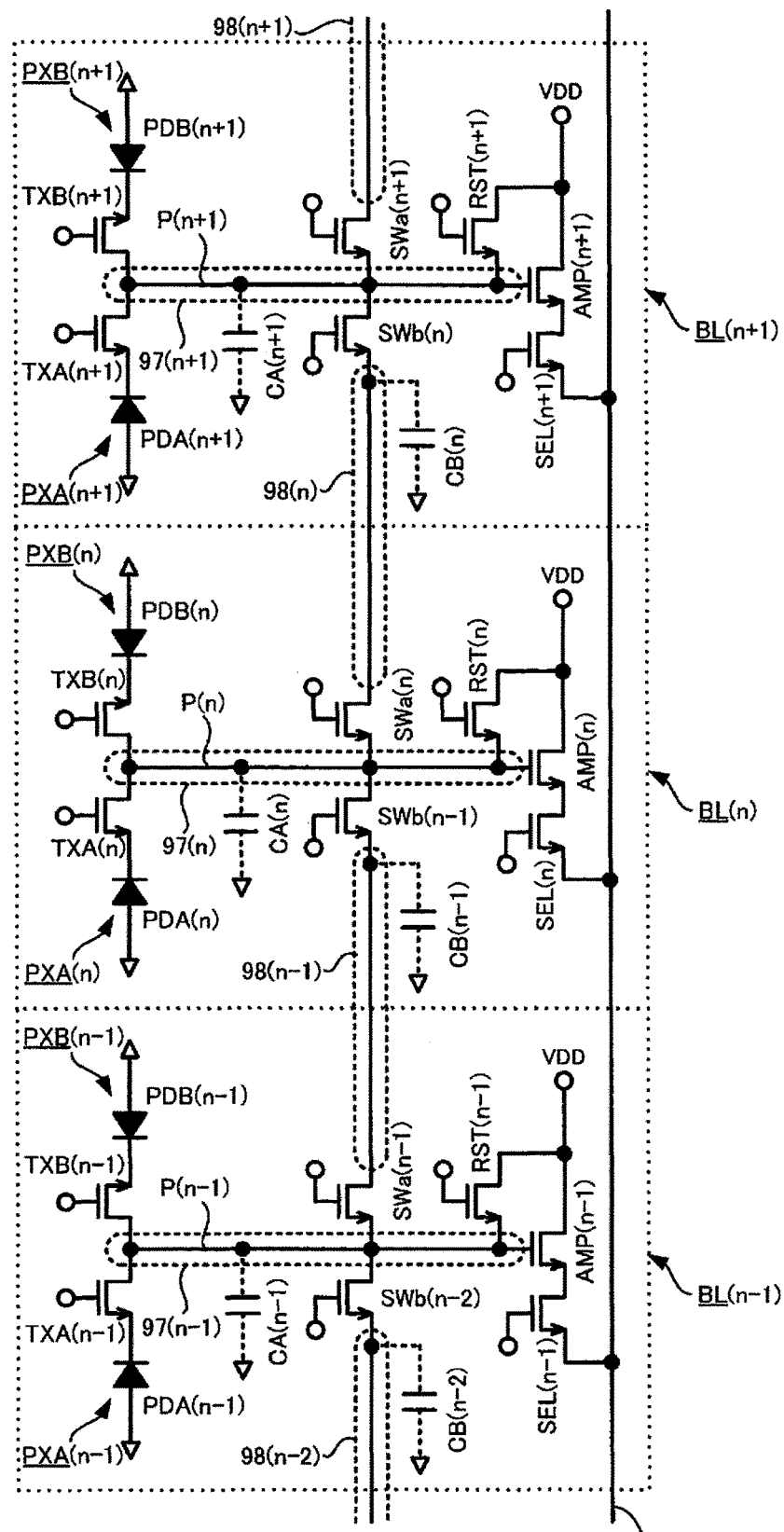
FIG. 39 A circuit diagram showing an area that includes three pixel blocks in a solid-state image sensor achieved in a comparison example FIG. 40 A schematic plan view of an area that includes the three pixel blocks in FIG. 37
Figure 40:
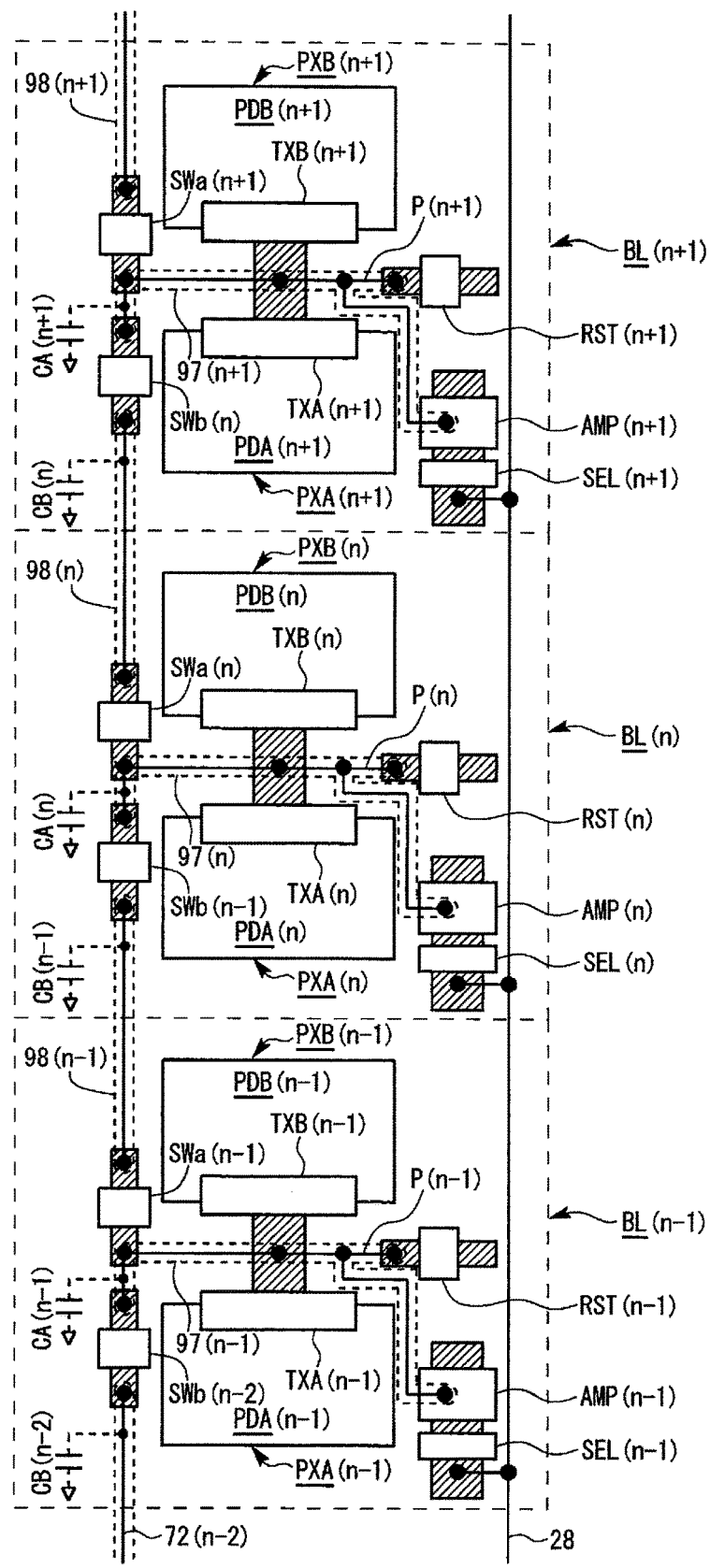

A solid-state image sensor in a comparison example, provided for purposes of comparison with the solid-state image sensor 804 in the embodiment, will be explained next. FIG. 39 is a circuit diagram corresponding to that in FIG. 31, showing an area that includes three pixel blocks BL in the solid-state image sensor in the comparison example. FIG. 40 is a schematic plan view corresponding to FIG. 32 and FIG. 33, which schematically illustrates an area that includes the three pixel blocks BL in FIG. 39. In FIG. 39 and FIG. 40, the same reference signs are assigned to elements identical to or corresponding to those in FIG. 31, FIG. 32 and FIG. 33 so as to preclude the necessity for a repeated explanation thereof. It is to be noted that while the diffusion areas and the gate electrodes in FIG. 40 do not bear any reference signs, they are assigned with the same reference signs as those in FIG. 33.

The following features differentiate the comparison example from the embodiment. In the comparison example, first linking transistors SWa, second linking transistors SWb and wirings 97 and 98 are disposed in place of the first and second transistors SWA and SWB and the wirings 71 and 72. In addition, while the comparison example includes nodes P, each equivalent to a first node Pa, it does not include nodes equivalent to the second nodes Pb. Furthermore, while the source of each reset transistor RST is connected to a second node Pb instead of a first node Pa in the embodiment, the source of each reset transistor RST in the comparison example is connected to the corresponding node P.

A first linking transistor SWa and a second linking transistor SWb are disposed in series over each two pixel blocks BL adjacent to each other along the columnar direction, among various pixel blocks BL, between the node P in one of the pixel blocks BL and the node P in the other pixel block BL. For instance, the first linking transistor SWa(n) and the second linking transistor SWb(n) are disposed in series between the node P(n) in an nth-row pixel block BL(n) and the node P(n+1) in the adjacent (n+1)th row pixel block BL.

In the comparison example, the gate electrode of the amplifier transistor AMP(n), the drain diffusion area shared by the transfer transistors TXA(n) and TXB(n), the source diffusion area of the first linking transistor SWa(n), the drain diffusion area of the second linking transistor SWb(n−1) and the source diffusion area of the reset transistor RST(n) in the pixel block BL(n) are electrically connected with one another via the wiring 97(n). The node P(n) is equivalent to the wiring 97(n) and the entire region where electrical continuity is achieved through the electrical connection via the wiring 97(n). This principle also applies to other pixel blocks BL.

In addition, each pair of linking transistors SWa and SWb disposed in series between two successive nodes P are connected via the wiring 98. For instance, the drain diffusion area of the first linking transistor SWa(n) and the source diffusion area of the second linking transistor SWb(n) are electrically connected via the wiring 98(n).

CA(n) in FIGS. 39 and 40 is a capacitance formed between the node P(n) and the reference electric potential when the linking transistors SWa(n) and SWb(n−1) are in the off state. Cfd1' indicates the capacitance value of the capacitance CA(n). CB(n) is a capacitance formed between the wiring 72(n) and the reference electric potential when the linking transistors SWa(n) and SWb(n) are in the off state. Similar notations are applicable in other rows of pixel blocks BL.

The capacitance CA(n) is made up with the capacitance in the drain diffusion area shared by the transfer transistors TXA(n) and TXB(n), the capacitance in the source diffusion area of the reset transistor RST(n), the capacitance in the source diffusion area of the first linking transistor SWa(n), the capacitance in the drain diffusion area of the second linking transistor SWb(n−1), the capacitance at the gate electrode of the amplifier transistor AMP(n) and the wiring capacitance at the wiring 97(n), and the capacitance value Cfd1' of the capacitance CA(n) equals the total sum of their capacitance values. This principle also applies to other rows of pixel blocks BL.

As explained earlier, the capacitance CC(n) in the embodiment is made up with the capacitance in the drain diffusion area 41 shared by the transfer transistors TXA(n) and TXB(n), the capacitance in the source diffusion area of the first transistor SWA(n), the capacitance at the gate electrode of the amplifier transistor AMP(n) and the wiring capacitance at the wiring 71(n), and the capacitance value Cfd1 of the capacitance CC(n) equals the total sum of their capacitance values.

This means that the capacitance value Cfd1 of the capacitance CC(n) in the embodiment is smaller than the capacitance value Cfd1' of the capacitance CA(n) in the comparison example by an extent corresponding to the capacitance of the drain diffusion area of the second linking transistor SWb(n−1) and the capacitance in the source diffusion area of the reset transistor RST(n) (i.e., by an extent corresponding to two transistor diffusion capacitances).

In the comparison example, when the linking transistors SWa(n) and SWb(n−1) in a pixel block BL(n) are both turned off, the capacitance (charge/voltage conversion capacitance) between the node P(n) and the reference electric potential is the capacitance CA(n). The capacitance value of the charge/voltage conversion capacitance at the node P(n) thus takes the smallest capacitance value Cfd1'. Since a greater charge/voltage conversion coefficient is assumed in correspondence to the charge/voltage conversion capacitance, a read at the highest possible SN ratio is enabled. In addition, in the comparison example, the number of linking transistors in the on state that are electrically connected to the node P(n), among the various linking transistors SWa and SWb, may be increased to a desired value equal to or greater than 1 so as to raise the capacitance value of the charge/voltage conversion capacitance at the node P(n) to a desired value and thus enable handling of a greater signal charge quantity, which, in turn, makes it possible to increase the number of saturation electrons. This ultimately makes it possible to increase the dynamic range.

As explained earlier, the smallest capacitance value Cfd1 of the charge/voltage conversion capacitance at the first node Pa(n) in the current embodiment is smaller than the smallest capacitance value Cfd1' assumed for the charge/voltage conversion capacitance at the node P(n) in the comparison example by an extent corresponding to two transistor diffusion capacitances. Thus, the embodiment, achieving an even greater charge/voltage conversion coefficient relative to the comparison example, enables a read at an even higher SN ratio.

While a second transistor SWB is disposed between each pair of second nodes Pb taking consecutive positions along the columnar direction in the embodiment, the present invention is not limited to this example. For instance, the area between an (r+1)th second node (r is an integer equal to or greater than 2), among second nodes Pb set side-by-side along the columnar direction, and a second node Pb located directly below the second node Pb in the figure may be held in an open state at all times without disposing a linking transistor SWb between them. In such a case, if r is smaller, the maximum value that may be taken for the predetermined number set in the second operation mode will be lowered and the extent to which the dynamic range is expanded will thus decrease. However, the SN ratio for high-sensitivity read can be improved over the comparison example described earlier. In addition, the area between an (s+1)th second node Pb (s is an integer equal to or greater than 1), among second nodes Pb set side-by-side along the columnar direction and a second node Pb located directly below the second node Pn in the figure may be electrically shorted without disposing a second transistor SWB between them. As a further alternative, a second transistor SWB may be disposed only between an (u+1)th second node Pb (u is an integer equal to or greater than 1), among second nodes Pb set side-by-side along the columnar direction and a second node Pb directly below the second node Pb in the figure with the region between each second node Pb other than the (u+1)th second node Pb among the second nodes Pb set along the columnar direction and a second node Pb directly below the particular second node Pb in the figure set in an electrically shorted state.

It is to be noted that the capacitance value for the capacitance CD may be set within a range of ±20% of the capacitance value of the capacitance CC or within a range off 10% of the capacitance value of the capacitance CC in this embodiment by, for instance, disposing an adjustment capacitance at the wiring 72. These allowances are also applicable to the ninth embodiment, to be described in detail later.

It is to be noted that in the various operational examples described in reference to FIGS. 34 through 38, the signal charge at a photodiode PD in each pixel PX is read out separately without combining it with the signal charge at a photodiode PD in another pixel PX. However, the present invention is not limited to these operational examples, and the signal charge at the photodiode PD in each pixel PX may be read out in combination with the signal charge at the photodiode PD in another pixel PX of the same color.

For instance, by turning on the first transistors SWA(n−1), SWA(n) and SWA(n+1) and the second transistors SWB(n) and SWB(n−1) so as to connect the first nodes Pa(n−1), Pa(n) and Pa(n+1) with one another and simultaneously turning on TXA(n−1), TXA(n) and TXA(n+1), the signal charges at the photodiodes PDA(n−1), PDA(n) and PDA(n−1) at the three pixels PXA(n−1), PXA(n) and PXA(n−1) assuming the same color in a Bayer array or the like will be averaged through the first nodes Pa(n−1), Pa(n) and Pa(n+1) linked with one another, thereby achieving a same-color, three pixel combined read function. In this situation, the number of first or second transistors in the on state that are electrically connected to the first nodes Pa(n−1), Pa(n) and Pa(n+1) may be minimized by turning off the second transistors SWB(n−2) and SWB(n+2) so as to minimize the charge/voltage conversion capacitance values at the linked first nodes Pa(n−1), Pa(n) and Pa(n+1) and thus enable a same-color, three pixel combined read operation at the highest possible SN ratio. In addition, by allowing at least one more transistors in the on state among the various first transistors SWA and second transistors SWB, to electrically connect to the first nodes Pa(n−1), Pa(n) and Pa(n+1), as well as the first transistors SWA(n−1), SWA(n) and SWA(n+1) and the second transistors, SWB(n) and SWB(n+1) an increase in the charge/voltage conversion capacitance values at the linked first nodes Pa(n−1), Pa(n) and Pa(n+1), corresponding to the number of additional transistors, is achieved and as a result, the dynamic range for the same-color, three pixel combined read can be expanded.

Ninth Embodiment

Figure 41:
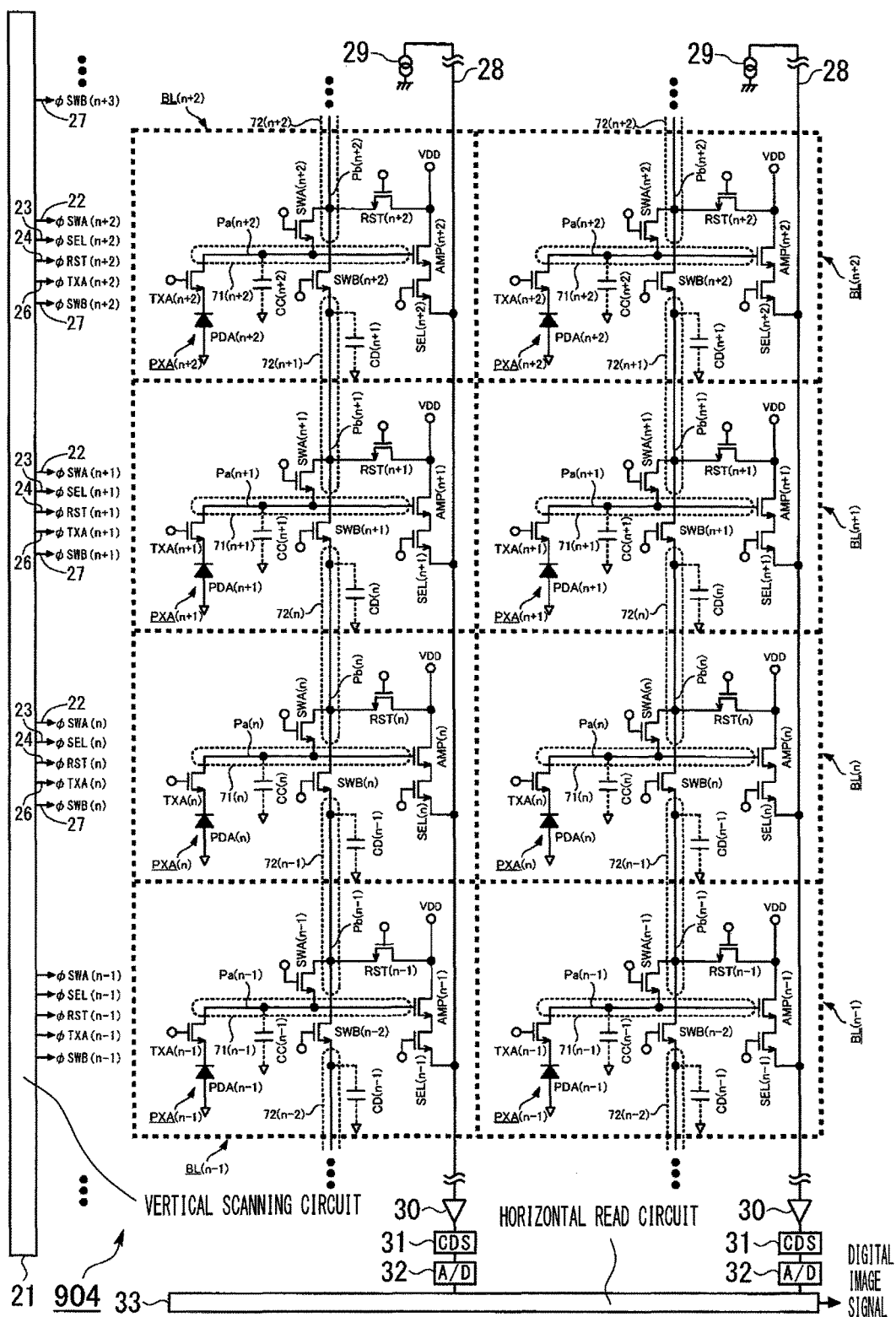
FIG. 41 A circuit diagram schematically illustrating the structure of a solid-state image sensor in the electronic camera achieved in a ninth embodiment of the present invention FIG. 42 A circuit diagram showing an area that includes three pixel blocks in a solid-state image sensor in the electronic camera achieved in a tenth embodiment of the present invention FIG. 43 A circuit diagram showing in an enlargement an area that includes the three pixel blocks in FIG. 42

FIG. 41 is a circuit diagram corresponding to that in FIG. 30, schematically illustrating a solid-state image sensor 904 in the electronic camera achieved in the ninth embodiment of the present invention. In FIG. 41, the same reference signs are assigned to elements identical to or corresponding to those in FIG. 30, so as to preclude the necessity for a repeated explanation thereof.

The current embodiment differs from the eighth embodiment in that the photodiode PDB and the transfer transistor TXB disposed in each pixel block BL in the eighth embodiment are not provided and that each pixel block BL is thus made up with a pixel PXA. However, the photodiodes PDA in the embodiment are disposed with a columnar-direction density that is twice the columnar-direction density with which the photodiodes PDA are disposed in the eighth embodiment. In other words, the photodiodes PDA are disposed with a columnar-direction density matching that with which the photodiodes PDA and PDB are disposed along the columnar direction in the eighth embodiment. Thus, n indicates a specific row of pixel blocks BL and also a specific row of pixels PXA in the embodiment.

Namely, while each pixel block BL in the eighth embodiment is made up with two pixels PX (PXA and PXB), pixel blocks BL in the embodiment are each made up with a single pixel (PXA). In addition, while the two pixels PX (PXA and PXB) in a pixel block BL share a set of elements, i.e., the first node Pa, the amplifier transistor AMP, the reset transistor RST and the selector transistor SEL, the set of elements, i.e., the first node Pa, the amplifier transistor AMP, the reset transistor RST and the selector transistor SEL, is provided for each pixel PX (PXA in the embodiment) in the current embodiment.

The description of the eighth embodiment also serves as a description of the current embodiment basically by referring to pixel blocks BL as pixels PXA instead. Accordingly, the current embodiment will not be explained in detail.

Through the current embodiment, too, advantages and operations similar to those of the eighth embodiment are achieved.

Tenth Embodiment

Figure 42:
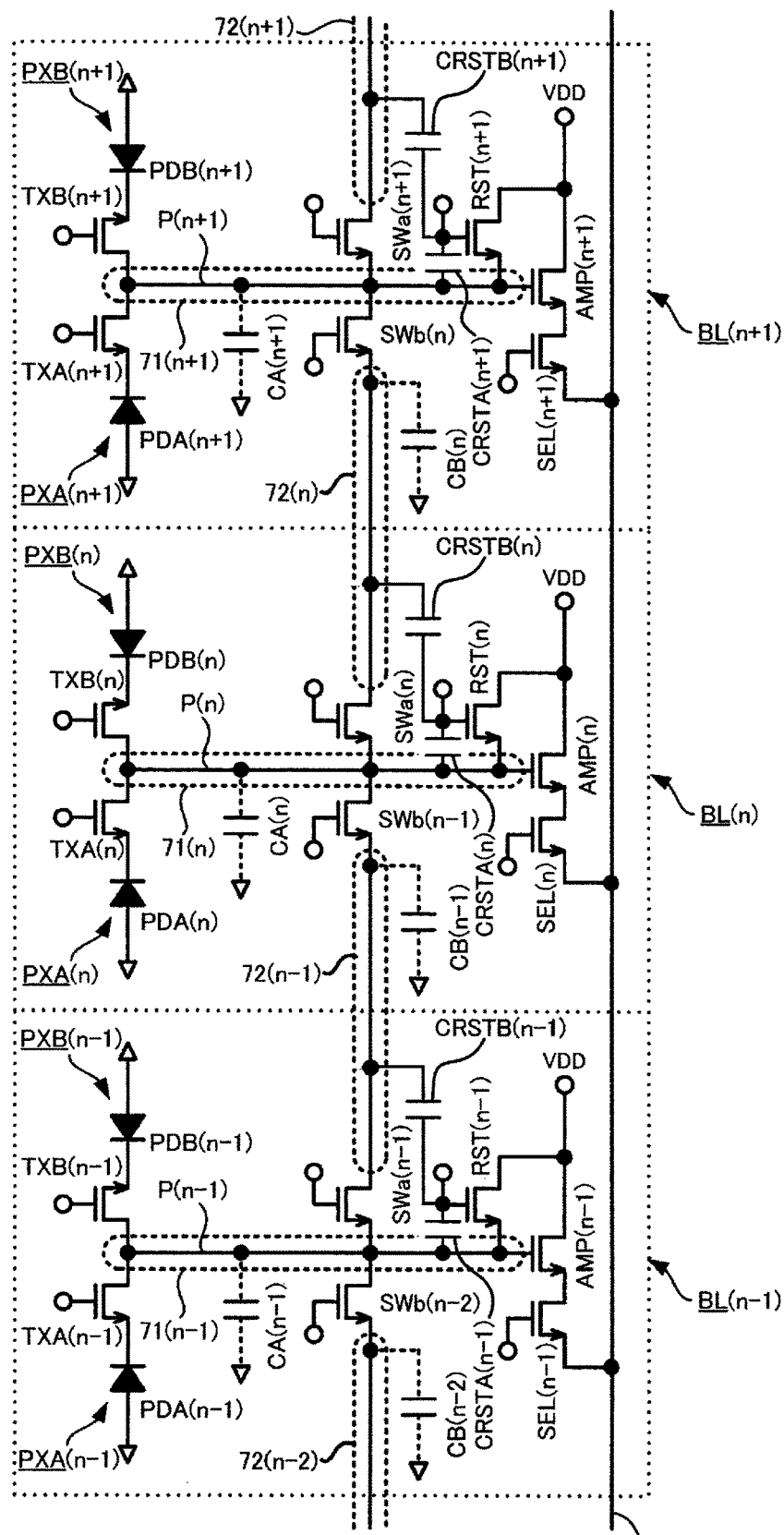
Figure 43:
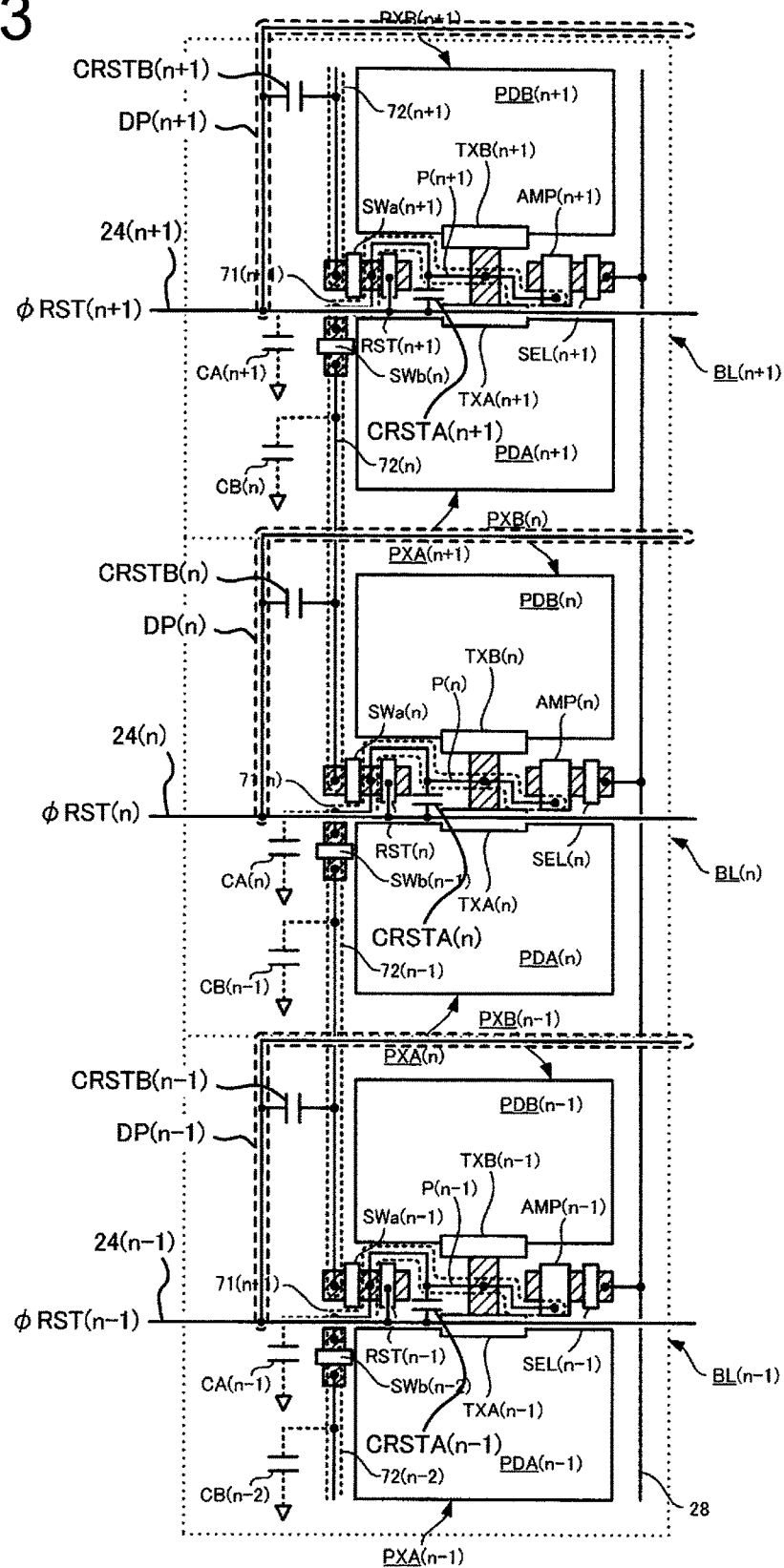

FIG. 42 is a circuit diagram corresponding to that in FIG. 3, showing an area that includes three pixel blocks BL in a solid-state image sensor in the electronic camera achieved in the tenth embodiment of the present invention. FIG. 43 is a schematic plan view corresponding to FIG. 4 and FIG. 5, which schematically illustrates an area that includes the three pixel blocks BL in FIG. 42. In FIG. 42 and FIG. 43, the same reference signs are assigned to elements identical to or corresponding to those in FIG. 3, FIG. 4 and FIG. 5 so as to preclude the necessity for a repeated explanation thereof.

It is to be noted that while FIG. 43 includes the control line 24(n) that is not shown in FIGS. 4 and 5, the control line 24(n) is not a new element unique to the embodiment. In other words, all the other embodiments include the control line 24(n) but it has not been shown in their illustrations.

As has been explained in reference to FIG. 3 illustrating the first embodiment, the control line 24(n) is a control line through which the control signal øRST(n) is transmitted. The gates of the reset transistors RST(n) in the particular row are commonly connected to the control line 24(n) to which the control signal øRST(n) is provided from the vertical scanning circuit 21. As FIG. 43 shows, the control line 24(n) is disposed so as to range substantially parallel to the node P(n), with a coupling capacitance CRSTA(n) formed between the control line 24(n) and the node P(n). In the following description, the capacitance value of the coupling capacitance CRSTA(n) will be referred to as Cra.

The following features differentiate the current embodiment from the first embodiment. A dummy wiring DP(n) is disposed so as to run substantially parallel to the wiring 72(n) in each pixel block BL(n) in the embodiment. The dummy wiring DP(n) is a wiring pattern formed by extending part of the control line 24(n). In other words, while one end of the dummy wiring DP(n) is connected to the control line 24(n), the other end thereof, located on the side extending to the area between pixel blocks BL remains unconnected. In this sense, it is considered to be a dummy wiring pattern bearing no relevance to circuit control. By disposing the dummy wiring DP(n) so that it runs substantially parallel to the wiring 72(n), a coupling capacitance CRSTB(n) is formed between the wiring 72(n) and the dummy wiring DP(n), as shown in FIG. 42 and FIG. 43. In the following description, the capacitance value of the coupling capacitance CRSTB(n) will be referred to as Crb. In the first embodiment, the control line 24(n) and the wiring 72(n) are barely coupled with each other and thus Crb would take an extremely small value. In the embodiment that includes the dummy wiring DP(n), Crb is bound to take a greater value compared to the first embodiment.

It is to be noted that the dummy wiring DP(n) may assume a layout different from that described above. For instance, it may be formed with a portion running parallel to the wiring 72(n) alone with no part thereof extending to the area between pixel blocks BL. In addition, it is desirable that the thickness of the dummy wiring DP(n) forming the wiring pattern be maximized so as to increase the coupling capacitance CRSTB(n). Furthermore, the coupling capacitance fainted between the control line 24(n) and the wiring 72(n) may be raised through another method without disposing a dummy wiring DP(n).

Figure 44:
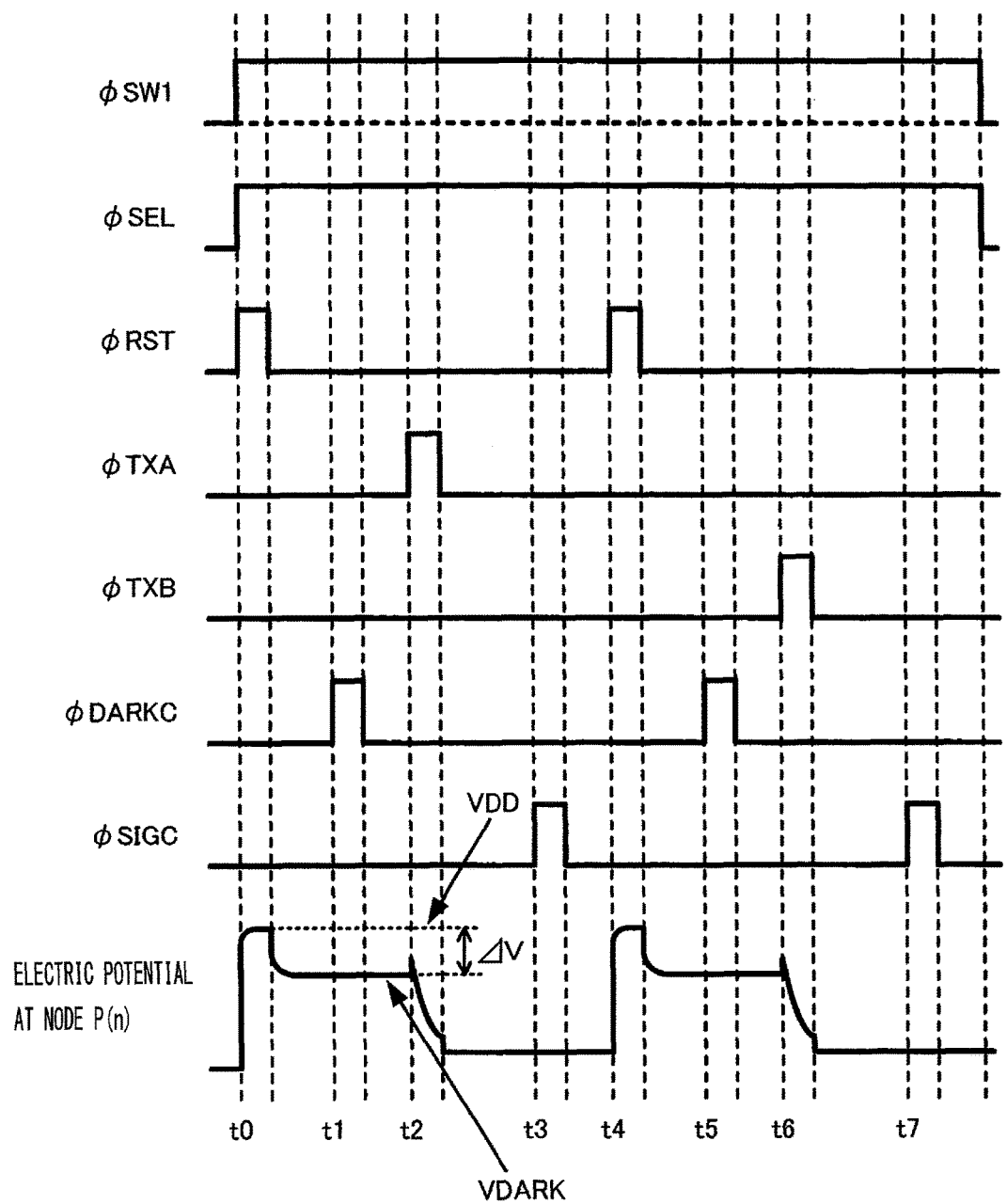
FIG. 44 A timing chart illustrating how the electric potential at a node P(n) may be reset FIG. 45 A circuit diagram showing an area that includes three pixel blocks in a solid-state image sensor in the electronic camera achieved in an eleventh embodiment of the present invention FIG. 46 A schematic plan view of an area that includes the three pixel blocks BL in FIG. 45

FIG. 44 is a timing chart illustrating how the electric potential at the node P(n) may be reset. At a time point t0, the control signal øRST(n) is set to II, thereby turning on each nth row reset transistor RST(n) and resetting the electric potential at the corresponding node P(n) to the source electric potential VDD. As the control signal øRST(n) is subsequently set to L, the reset transistor RST(n) is turned off. At this time, the electric potential at the node P(n) is lowered from the source electric potential VDD to an electric potential VDARK, which is lower than the source electric potential VDD by an extent corresponding to a feed through quantity ΔV.

When the linking transistors SWa(n), SWb(n) and SWb(n−1) are in the off state, the feed through quantity ΔV is (Cre/Cfd1)×Vrst. Vrst represents the amplitude of the control signal øRST(n). It is to be noted that Cfd1 represents the capacitance value of the capacitance CA(n) and Cra represents the capacitance value of the coupling capacitance CRSTA(n), as explained earlier.

When the linking transistor SWa(n) is in the on state, the feed through quantity ΔV is ((Cra+Crb)/(Cfd1+Cfd2))×Vrst. It is to be noted that Cfd2 represents the capacitance value of the capacitance CB(n) and Crb represents the capacitance value of the coupling capacitance CRSTB(n), as explained earlier.

Crb takes an extremely small value in the first embodiment. Provided that Crb is 0, the feed through quantity ΔV is calculated as (Cra/(Cfd1+Cfd2)) when the linking transistor SWa(n) is in the on state. The capacitance value Cra remains constant regardless of whether the linking transistor SWa(n) is in the on state or in the off state. Accordingly, the feed through quantity ΔV is reduced when the linking transistor SWa(n) is turned on in the first embodiment. The electric potential VDARK under such circumstances is higher than the electric potential when the linking transistor SW(n) is in the off state.

In the embodiment, Crb takes a greater value over the first embodiment. This means that an increase in the feed through quantity ΔV is achieved over the first embodiment, making it possible to lower the electric potential VDARK.

In order to sustain good linearity with regard to the output from the amplifier transistor AMP(n), the amplifier transistor AMP(n) needs to operate in a saturation range. In other words, a drain-source voltage Vds needs to be greater than a saturation voltage Vdsat. The drain-source voltage Vds, represented by the difference between a drain voltage Vd and the source voltage Vs, is expressed as Vd−Vs. As FIG. 42 indicates, the drain voltage Vd is the source voltage Vdd. In addition, the source voltage Vs is expressed as Vg−Vth−√(2×Id/β). It is to be noted that Vg represents the gate voltage, Vth represents a threshold value for the amplifier transistor AMP(n), Id represents the drain current and β represents an element parameter.

The expression above indicates that as the gate voltage Vg rises, the source voltage Vs also increases, i.e., the drain-source voltage Vds decreases. Under such circumstances, it may not be possible to engage the amplifier transistor AMP(n) in operation in the saturation range. Accordingly, it is necessary to sustain the electric potential VDARK at low level after the node P(n) is reset. In addition, while the technology for forming an embedded channel-type amplifier transistor AMP(n) for purposes of noise reduction is available, adoption of this technology is bound to lower the threshold value Vth, which, in turn, will further raise the source voltage Vs. Thus, it becomes even more crucial to sustain the electric potential VDARK at low level.

In the embodiment, a greater feed through quantity ΔV can be achieved and thus, the amplifier transistor AMP(n) can be engaged in operation in the saturation range with better reliability even when the linking transistor SWa(n) is in the on state. As a result, better linearity is assured with regard to the output of the amplifier transistor AMP(n) over the first embodiment.

In addition, since the capacitance values Cfd2 and Crb are adjustable by adjusting Cfd2 and Crb to optimal values, a substantially constant feed through quantity ΔV can be sustained regardless of whether the linking transistor SWa (n) is in the on state or in the off state. Through these measures, operation can be executed by sustaining the electric potential VDARK at a substantially constant level after the node P(n) is reset, regardless of whether the linking transistor SWa(n) is in the on state or in the off state.

Eleventh Embodiment

Figure 45:
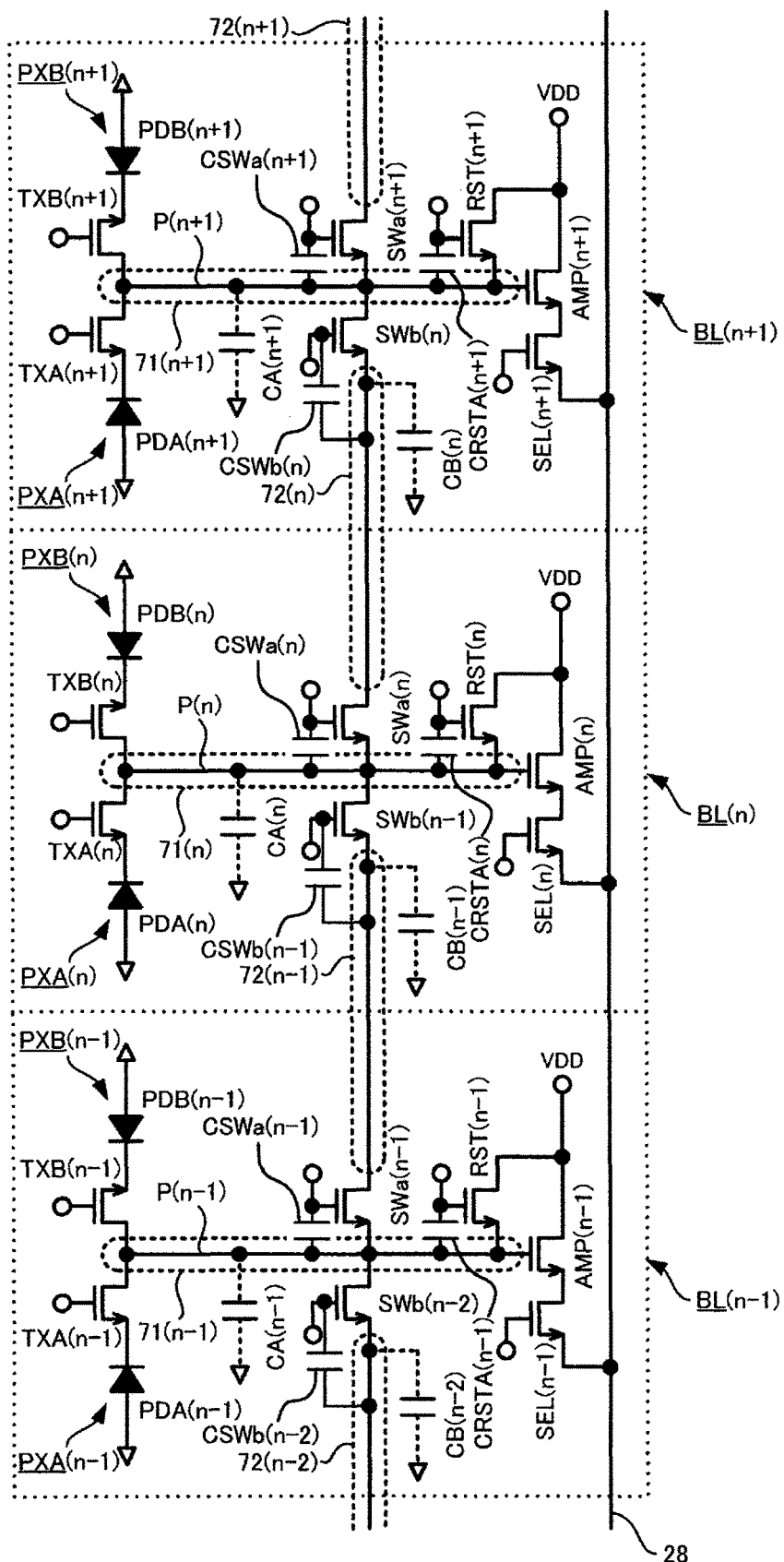
Figure 46:
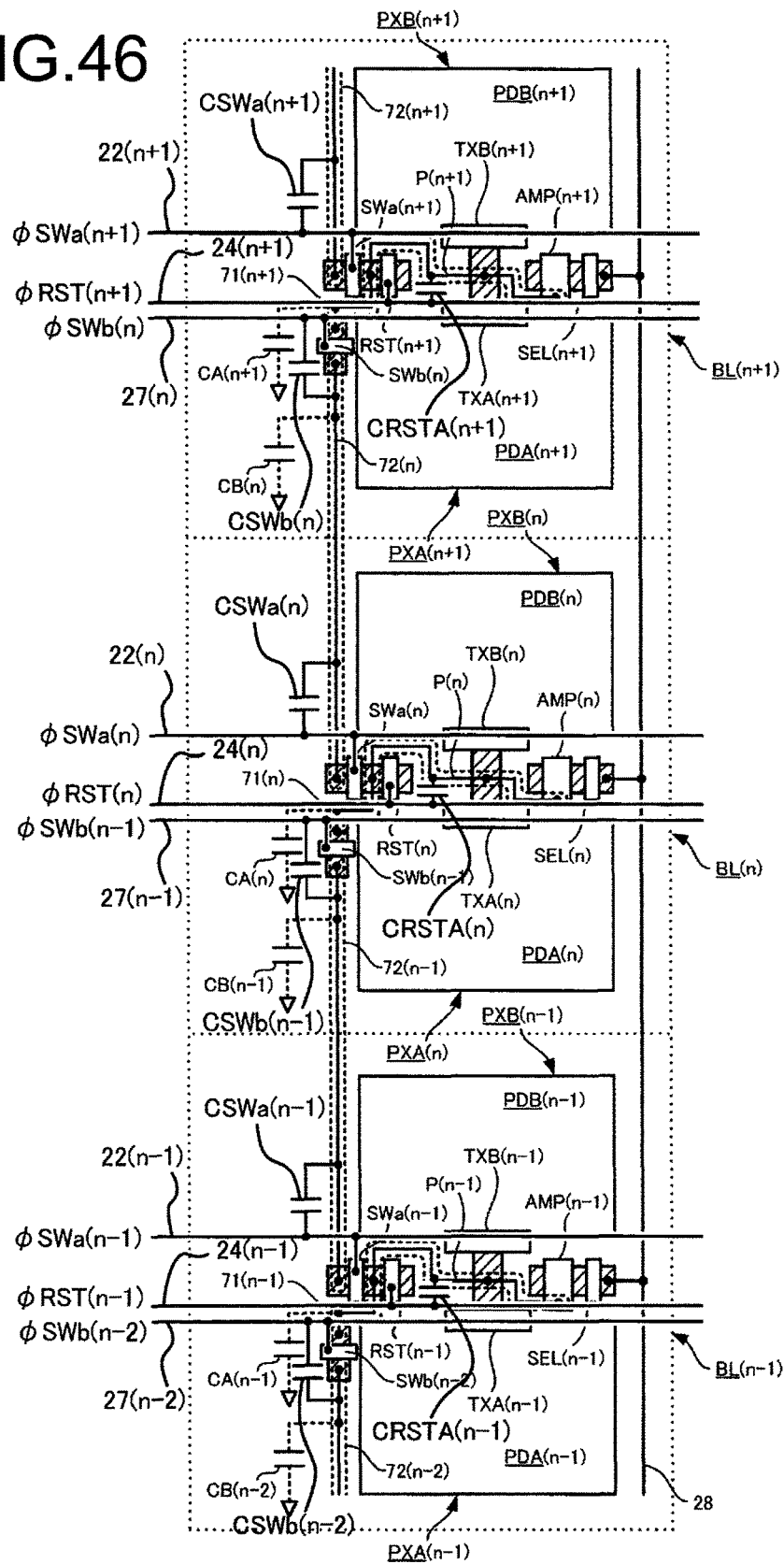

FIG. 45 is a circuit diagram corresponding to that in FIG. 3, showing an area that includes three pixel blocks BL in a solid-state image sensor in the electronic camera achieved in the eleventh embodiment of the present invention. FIG. 46 is a schematic plan view corresponding to FIG. 4 and FIG. 5, which schematically illustrates an area that includes the three pixel blocks BL in FIG. 42. In FIG. 45 and FIG. 46, the same reference signs are assigned to elements identical to or corresponding to those in FIG. 3, FIG. 4 and FIG. 5 so as to preclude the necessity for a repeated explanation thereof.

It is to be noted that while FIG. 46 includes the three control lines 22(n), 24(n) and 27(n) which are not shown in FIGS. 4 and 5, the three control lines 22(n), 24(n) and 27(n) are not new elements unique to the current embodiment. In other words, all the other embodiments include the three control lines 22(n), 24(n) and 27(n) but these control lines have not been shown in their illustrations.

As has been explained in reference to FIG. 3 illustrating the first embodiment, the control line 22(n) is a control line through which the control signal øSWA(n) is transmitted. The gates of the linking transistors SWa(n) in the particular row are commonly connected to the control line 22(n) to which the control signal øSWA(n) is provided from the vertical scanning circuit 21.

As has been explained in reference to FIG. 3 illustrating the first embodiment, the control line 24(n) is a control line through which the control signal øRST(n) is transmitted. The gates of the reset transistors RST(n) in the particular row are commonly connected to the control line 24(n) to which the control signal øRST(n) is provided from the vertical scanning circuit 21.

As has been explained in reference to FIG. 3 illustrating the first embodiment, the control line 27(n) is a control line through which the control signal øSWB(n) is transmitted. The gates of the linking transistors SWb(n) in the particular row are commonly connected to the control line 27(n) to which the control signal øSWB(n) is provided from the vertical scanning circuit 21.

As shown in FIG. 45 and FIG. 46, a coupling capacitance CRSTA(n) is formed between the node P(n) and the control line 24(n). Likewise, a coupling capacitance CSWa(n) is formed between the wiring 72(n) and the control line 22(n), and a coupling capacitance CSWb(n) is formed between the wiring 72(n) and the control line 27(n).

The following is a description of the features differentiating the current embodiment from the first embodiment. The solid-state image sensor in the embodiment assumes a circuit structure identical to that in the first embodiment. In the embodiment, the linking transistors SWa(n) and SWb(n) are engaged in operation in various operation modes differently from the first embodiment. The following is a description given in reference to a pixel block BL(n) of the operations of the linking transistors SWa(n) and SWb(n) in the various operation modes.

Figure 47:
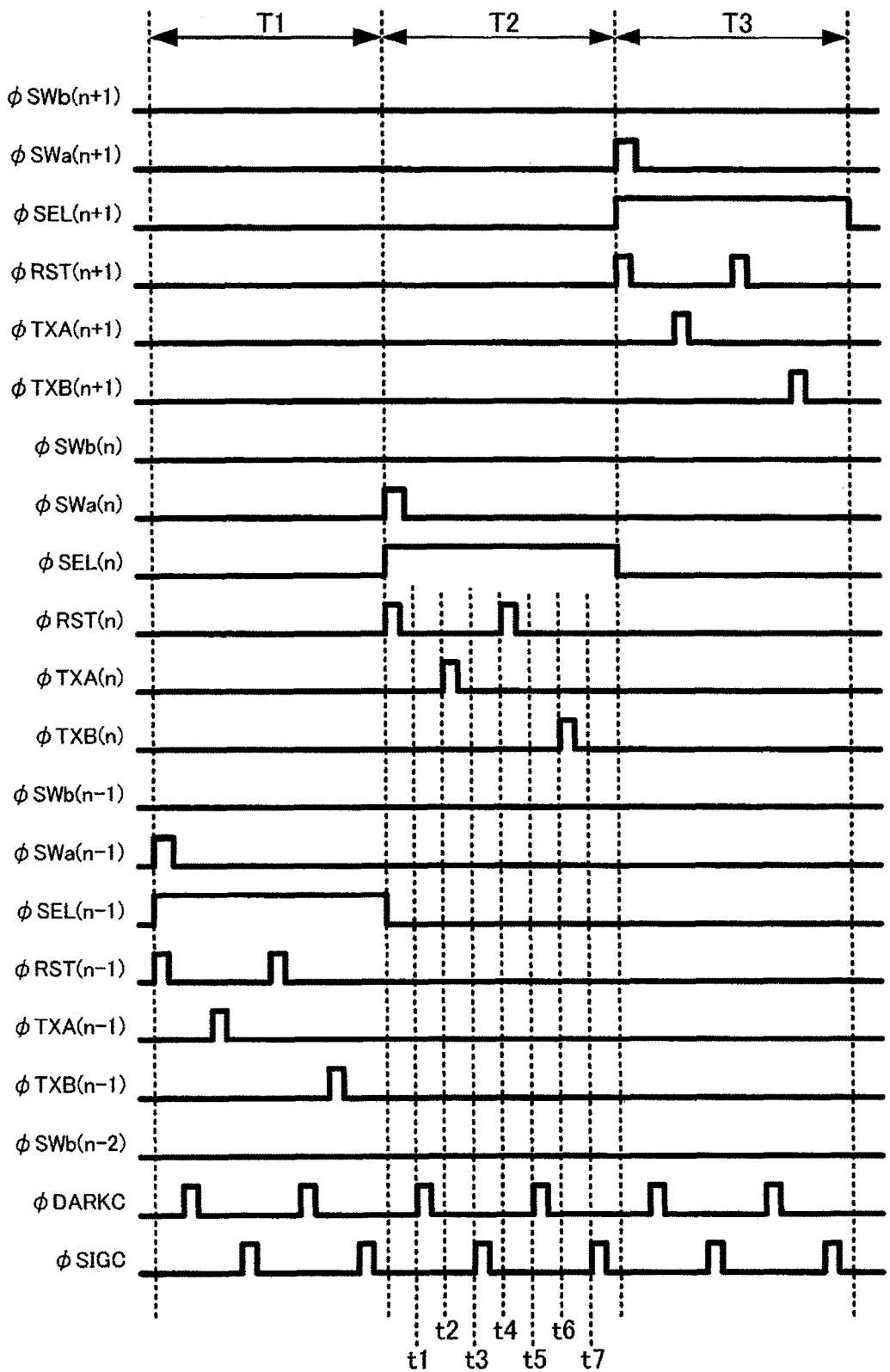
FIG. 47 A timing chart pertaining to a first operation mode that may be selected in the solid-state image sensor in the electronic camera achieved in the eleventh embodiment of the present invention FIG. 48 A timing chart pertaining to a second A operation mode that may be selected in the solid-state image sensor in the electronic camera achieved in the eleventh embodiment of the present invention FIG. 49 A timing chart pertaining to a second B operation mode that may be selected in the solid-state image sensor in the electronic camera achieved in the eleventh embodiment of the present invention FIG. 50 A timing chart illustrating how the electric potential at a node P(n) may be reset

FIG. 47 is a timing chart corresponding to FIG. 6, pertaining to a first operation mode that may be selected in the solid-state image sensor in the electronic camera achieved in the eleventh embodiment of the present invention. It differs from the first embodiment in that when turning on the reset transistor RST(n) by setting the control signal øRST(n) to H, the linking transistor SWa(n) is also turned on by substantially simultaneously setting the control signal øSWA(n) to H (immediately before a time point t1). Subsequently, the vertical scanning circuit 21 first sets the control signal øRST(n) to L, thereby turning off the reset transistor RST(n) and then sets the control signal øSWA(n) to L, thereby turning off the linking transistor SWa(n). Since other aspects of the current embodiment are identical to those of the first embodiment, a repeated explanation is not provided.

Figure 48:
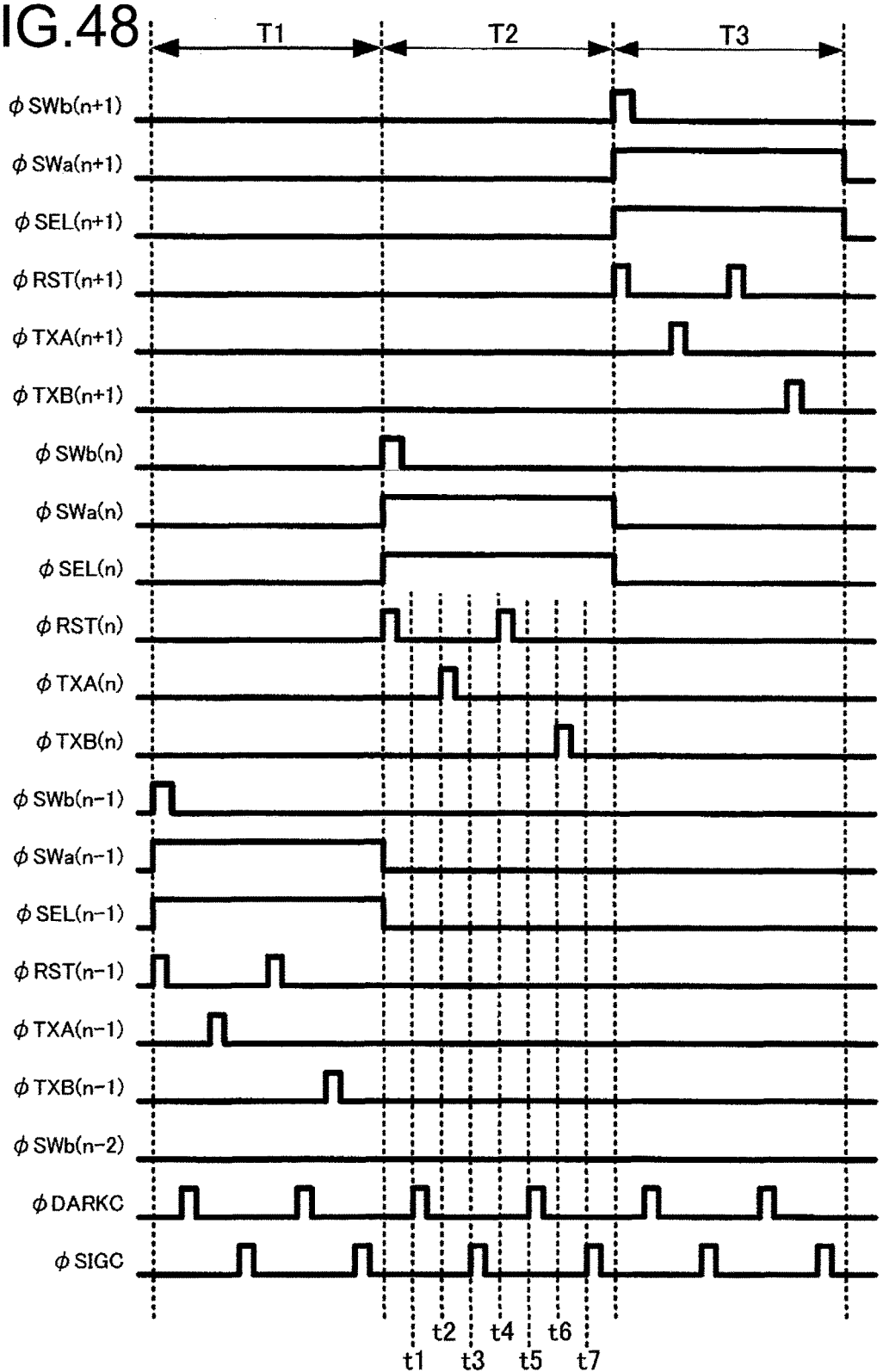

FIG. 48 is a timing chart corresponding to FIG. 7, pertaining to a second A operation mode that may be selected in the solid-state image sensor in the electronic camera achieved in the eleventh embodiment of the present invention. It differs from the first embodiment in that when turning on the reset transistor RST(n) by setting the control signal øRST(n) to H, the linking transistor SWb(n) is also turned on by substantially simultaneously setting the control signal øSWB(n) to H (immediately before the time point t1). Subsequently, the vertical scanning circuit 21 first sets the control signal øRST(n) to L, thereby turning off the reset transistor RST(n), and then sets the control signal øSWB(n) to L, thereby turning off the linking transistor SWb(n). Since other aspects of the current embodiment are identical to those of the first embodiment, a repeated explanation is not provided.

Figure 49:
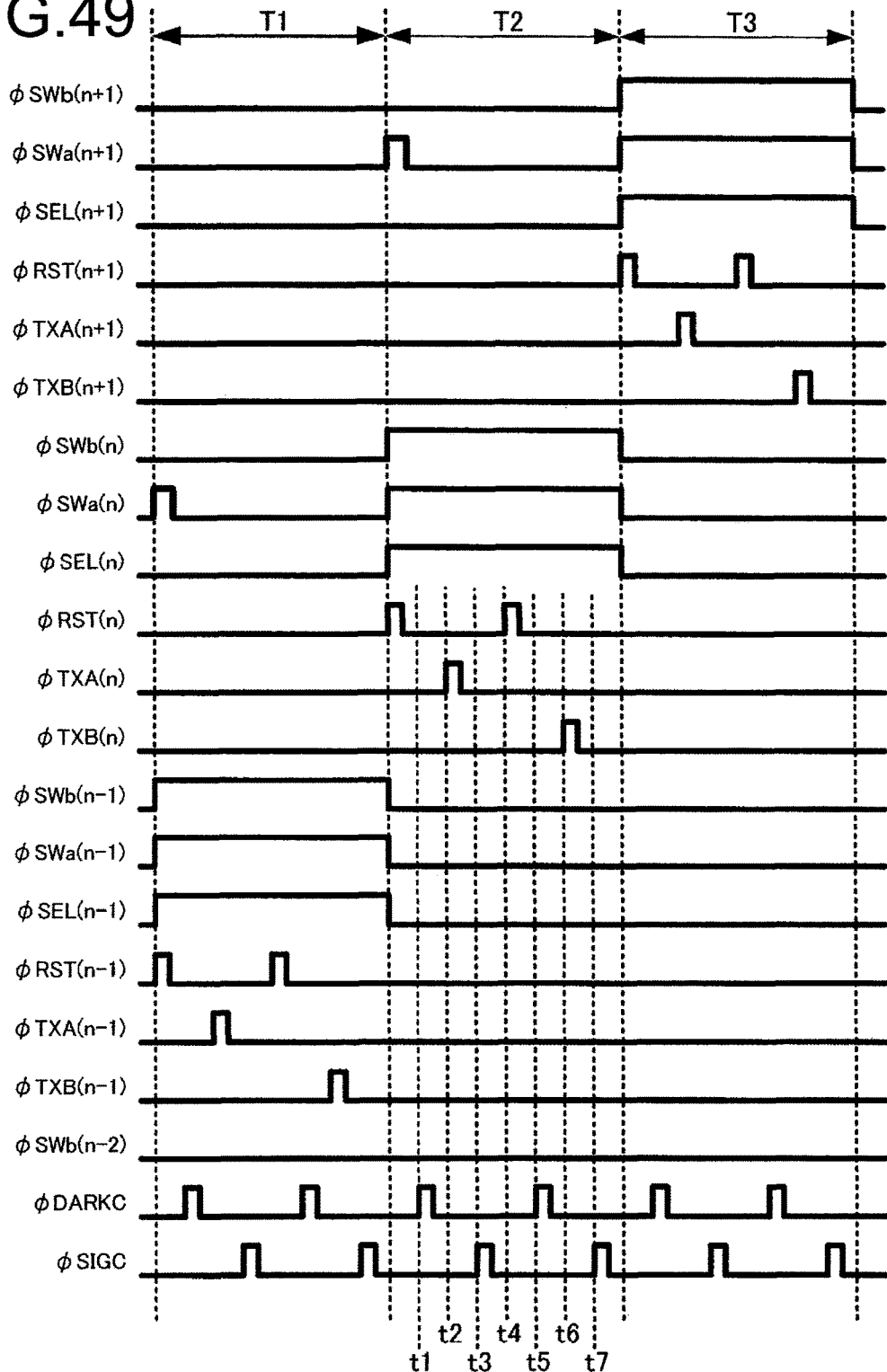

FIG. 49 is a timing chart corresponding to FIG. 8, pertaining to a second B operation mode that may be selected in the solid-state image sensor in the electronic camera achieved in the eleventh embodiment of the present invention. It differs from the first embodiment in that when turning on the reset transistor RST(n) by setting the control signal øRST(n) to H, the linking transistor SWa(n+1) is also turned on by substantially simultaneously setting the control signal øSWA(n+1) to H (immediately before the time point W. Subsequently, the vertical scanning circuit 21 first sets the control signal øRST(n) to L, thereby turning off the reset transistor RST(n) and then sets the control signal øSWA(n+1) to L, thereby turning off the linking transistor SWa(n+1). Since other aspects of the current embodiment are identical to those of the first embodiment, a repeated explanation is not provided.

In the embodiment described above, a linking transistor located at the outermost end is temporarily turned on substantially simultaneously as the node P(n) is reset. The "linking transistor located at the outermost end" in this context refers to a linking transistor taking the outermost position in relation to a pixel block BL that may or may not be connected with another pixel block. For instance, the linking transistor at the outermost end when the pixel block BL(n) remains unlinked, is either the linking transistor SWa(n) or the linking transistor SWb(n−1). In addition, when the pixel block BL(n) and the pixel block BL(n+1) are linked with each other, the linking transistor located at the outermost end is either the linking transistor SWa(n+1) or the linking transistor SWb(n−1).

Figure 50:
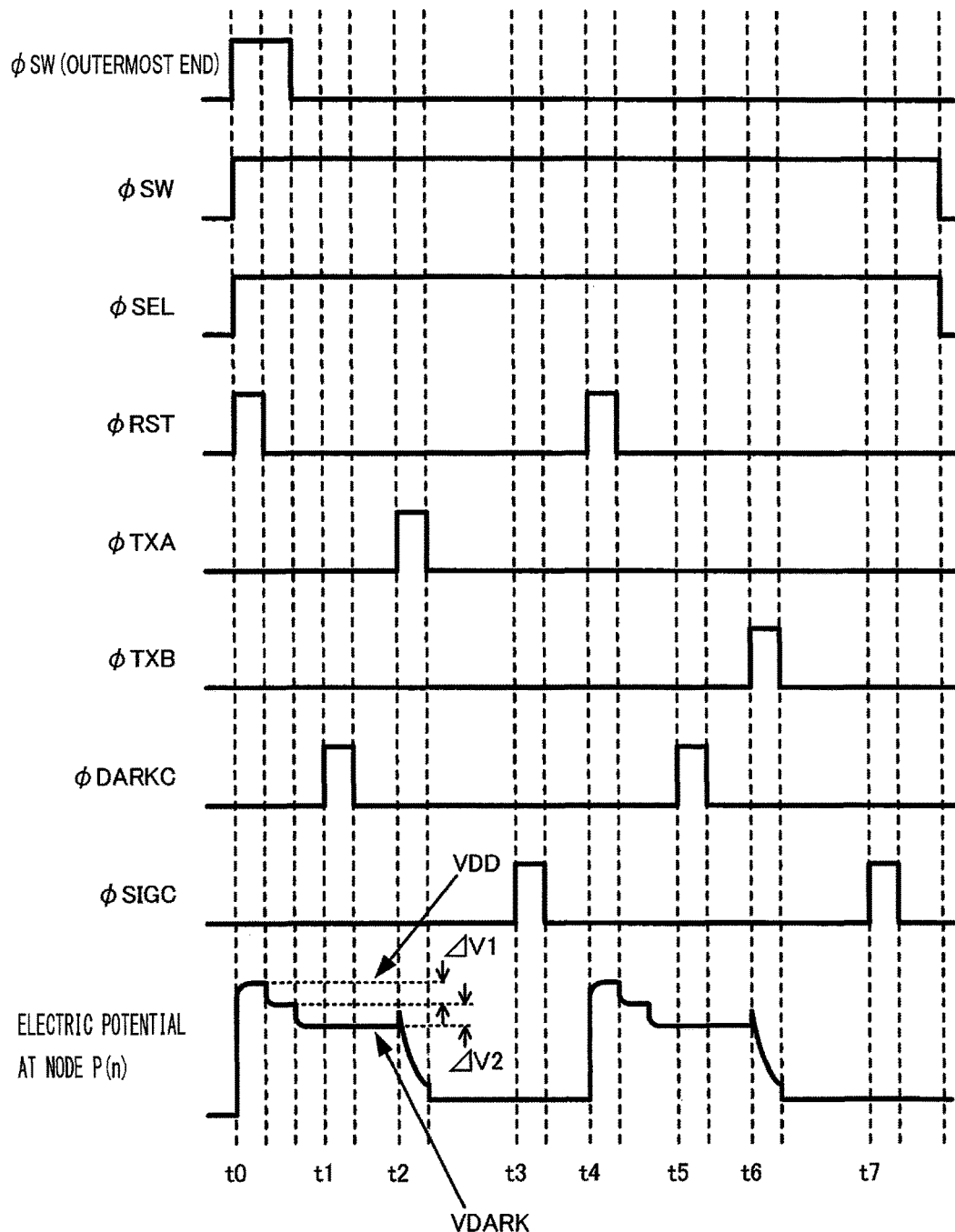

FIG. 50 is a timing chart illustrating how the electric potential at the node P(n) may be reset. It is to be noted that the control signal øSW in FIG. 50 is the control signal provided to the gate of outermost linking transistor. For instance, provided that the linking transistor located at the outermost end is the linking transistor SWb(n−1), the control signal øSW is the control signal øSWB(n−1).

At a time point t0, the control signal øSW provided to the gate of the outermost linking transistor and the control signal øRST(n) are substantially simultaneously set to H. In response, the nth row reset transistor RST(n) is turned on and the pixel blocks BL become linked with each other. At this time, the electric potential at the node P(n) is reset to the source electric potential VDD. As the control signal øRST(n) is subsequently set to L, the reset transistor RST(n) is turned off. In response, the electric potential at the node P(n) is lowered from the source electric potential VDD by an extent corresponding to a feed through quantity ΔV1 determined according to the coupling capacitance formed via the control line 24(n). As the control signal øSW is then set to L, the outermost linking transistor is turned off. At this time, the electric potential at the node P(n) is further lowered by an extent corresponding to a feed through quantity ΔV2 to the electric potential VDARK.

In the embodiment described above, a linking switch located at the outermost end is turned on/off when the electric potential at the node P(n) is reset so as to further lower the electric potential at the node P(n) by an extent corresponding to the feed through quantity ΔV2. Through these measures, the electric potential VDARK can be further lowered over the first embodiment. Advantages and operations similar to those described in reference to the tenth embodiment are thus achieved.

The present invention is in no way limited to the particulars of the embodiments described above and the variations thereof.

The disclosures of the following priority applications are herein incorporated by reference:
Japanese Patent Application No. 2013-238067 filed Nov. 18, 2013
Japanese Patent Application No. 2013-238439 filed Nov. 19, 2013
Japanese Patent Application No. 2013-238442 filed Nov. 19, 2013
Japanese Patent Application No. 2014-137755 filed Jul. 3, 2014

REFERENCE SIGNS LIST 4 solid-state image sensor
BL pixel block
PX pixel
PD photodiode
TXA, TXB transfer transistor
P node
AMP amplifier transistor
SWa, SWb linking transistor

The invention claimed is:
1. A solid-state image sensor, comprising:
  a plurality of pixels, each including (i) a photoelectric conversion unit that converts light to an electric charge, (ii) a charge accumulating unit that accumulates an electric charge, and (iii) a switch that transfers the electric charge resulting from the photoelectric conversion at the photoelectric conversion unit to the charge accumulating unit; and
  at least one connection unit that includes a plurality of linking units between two adjacent pixels among the plurality of pixels, each of the linking units electrically connecting the charge accumulating units of the two adjacent pixels.
2. An electronic camera equipped with the solid-state image sensor according to claim 1.
3. The solid-state image sensor according to claim 1, wherein
  the plurality of linking units are connected in series between the charge accumulating units of the two adjacent pixels.
4. The solid-state image sensor according to claim 1, wherein:
  the at least one connection unit includes a plurality of switches and a connection region; and
  the plurality of switches includes first switches via each of which the charge accumulating unit and the connection region are electrically connected with each other and disconnected from each other and a-second switches via each of which the connection region and another connection region are electrically connected with each other and disconnected from each other.

5. The solid-state image sensor according to claim 4, wherein:
the plurality of pixels each include a plurality of the photoelectric conversion units and a plurality of the switches that each transfer the electric charge resulting from the photoelectric conversion of one of the plurality of photoelectric conversion units to the charge accumulating unit.

6. The solid-state image sensor according to claim 1, wherein:
the connection unit includes a plurality of switches and a connection region; and
the plurality of pixels each include a dummy wiring that forms a parasitic capacitance between the connection region and the dummy wiring.

7. The solid-state image sensor according to claim 6, further comprising:
a reset switch that resets a voltage at the charge accumulating unit in each pixel to a reference voltage, wherein:
the dummy wiring is disposed so as to run substantially parallel to a wiring constituting the connection unit and one end of the dummy wiring is electrically connected to the reset switch.

8. The solid-state image sensor according to claim 1, wherein:
the at least one connection unit includes a plurality of switches and a connection region;
the plurality of pixels each include a reset switch that resets a voltage at the connection region to a reference voltage; and
the reset switch is connected with one switch among the plurality of switches via the connection region.

9. The solid-state image sensor according to claim 8, wherein:
the plurality of switches includes first switches via each of which the charge accumulating unit and the connection region are electrically connected with each other and disconnected from each other and second switches via each of which the connection region and another connection region are electrically connected with each other and disconnected from each other; and
the one switch is one of the first switches.

10. The solid-state image sensor according to claim 9, wherein:
the plurality of pixels each include a plurality of the photoelectric conversion units and a plurality of the switches that each transfer the electric charge resulting from the photoelectric conversion of one of the plurality of photoelectric conversion units to the charge accumulating unit.

11. The solid-state image sensor according to claim 9, further comprising:
a control unit that assumes a first operation mode for controlling one of the first switches, via which the charge accumulating unit of one pixel of the two adjacent pixels and the connection region corresponding to the charge accumulating unit are electrically connected with each other and disconnected from each other, and the reset switch, which resets the voltage at the connection region corresponding to the charge accumulating unit in the one pixel to the reference voltage, so that the one first switch is temporarily turned on only when an electric potential at the charge accumulating unit in the one pixel is reset and that the reset switch is turned on at least in case of the electric potential being reset.

12. The solid-state image sensor according to claim 11, wherein:
the control unit assumes a second operation mode for controlling the one first switch, one of the second switches, and the reset switch so that the one first switch, via which the charge accumulating unit in the one pixel and the corresponding connection region are electrically connected with each other and disconnected from each other is turned on, the one second switch is turned off and the reset switch that resets the voltage at the connection region corresponding to the charge accumulating unit in the one pixel to the reference voltage is turned on only when the electric potential at the charge accumulating unit in the one pixel is reset.

13. The solid-state image sensor according to claim 1, wherein:
the connection unit also includes a connection region; and
the plurality of linking units are each disposed between the charge accumulating unit of one of the two adjacent pixels and the connection region.

14. The solid-state image sensor according to claim 13, wherein:
the plurality of pixels each include a plurality of the photoelectric conversion units and a plurality of the switches that each transfer the electric charge resulting from the photoelectric conversion of one of the plurality of photoelectric conversion units to the charge accumulating unit.

15. The solid-state image sensor according to claim 14, wherein:
the plurality of switches includes a first transfer switch and a second transfer switch which are disposed in the plurality of pixels respectively;
the first transfer switch and the second transfer switch are each constituted by a transistor containing a source and a drain;
one of the source and the drain contained in the first transfer switch corresponds to one photoelectric conversion unit among the plurality of photoelectric conversion units and one of the source and the drain contained in the second transfer switch corresponds to another photoelectric conversion unit among the plurality of photoelectric conversion units; and
another one of the source and the drain contained in the first transfer switch and another one of the source and the drain contained in the second transfer switch are shared.

16. The solid-state image sensor according to claim 14, wherein:
two of the photoelectric conversion units and two of the switches are disposed as the plurality of photoelectric conversion units and the plurality of switches.

17. The solid-state image sensor according to claim 13, wherein:
the plurality of linking units are a plurality of switches, at least two of which are allocated to each connection unit.

18. The solid-state image sensor according to claim 17, further comprising:
a control unit that assumes (i) a first operation mode for controlling the plurality of switches so that no switch in an on state enters a state of electrical connection to the charge accumulating unit of one pixel of the two adjacent pixels, and (ii) a second operation mode for controlling the plurality of switches so that a predetermined number of at least one switch in the on state achieves a state of electrical connection to the charge accumulating unit of the one pixel.

19. The solid-state image sensor according to claim 17, wherein:
the charge accumulating units of three or more pixels among the plurality of pixels are disposed in a string via at least two sets of switches among the plurality of switches.

20. The solid-state image sensor according to claim 19, further comprising:
a control unit that assumes (i) a first operation mode for controlling the plurality of switches so that no switch in an on state enters a state of electrical connection to the charge accumulating unit of one pixel of the three or more pixels, and (ii) a second operation mode for controlling the plurality of switches so that a predetermined number of at least one switch in the on state achieves a state of electrical connection to the charge accumulating unit of the one pixel.

21. A solid-state image sensor, comprising:
a plurality of pixel blocks, each including (i) a plurality of photoelectric conversion units that convert light to an electric charge, (ii) a node, and (iii) a plurality of transfer switches which transfer the electric charges resulting from the photoelectric conversion at the plurality of photoelectric conversion units to the node; and
a plurality of linking switches each disposed between and connecting the nodes of two adjacent pixel blocks.

22. The solid-state image sensor according to claim 21, wherein
the plurality of linking switches are connected in series between the nodes of the two adjacent pixel blocks.

23. A solid-state image sensor, comprising:
a plurality of pixel blocks each including one photoelectric conversion unit, a node and one transfer switch to transfer an electric charge from the one photoelectric conversion unit to the node;
an electrical connection unit disposed between the node in one pixel block among the pixel blocks and the node in another pixel block; and
a plurality of linking switches allocated to each pixel block, which are disposed within the connection unit.

24. A solid-state image sensor, comprising:
a plurality of pixel blocks each including one photoelectric conversion unit, a first node and one transfer switch to transfer an electric charge from the one photoelectric conversion unit to the first node;
two second nodes, one corresponding to the first node in one pixel block among the pixel blocks and another corresponding to the first node in another pixel block;
two first switch units via each of which the first node in the one pixel block and one of the two second nodes are electrically connected with each other and disconnected from each other and the other pixel block and another one of the two second nodes are electrically connected with each other and disconnected from each other; and
a second switch unit via which the two second nodes are electrically connected with each other and disconnected from each other.

25. A solid-state image sensor, comprising:
a plurality of pixel blocks each including one photoelectric conversion unit, a first node and one transfer switch to transfer an electric charge from the one photoelectric conversion unit to the first node;
a second node disposed in correspondence to one pixel block among the pixel blocks;
a first switch via which the first node in the one pixel block and the second node disposed in correspondence to the one pixel block are electrically connected with each other and disconnected from each other;
a second switch unit via which the second node disposed in correspondence to the one pixel block and the second node disposed in correspondence to another pixel block among the pixel blocks are electrically connected with each other and disconnected from each other; and
a third switch from which a predetermined electric potential is provided to the second node.

26. A solid-state image sensor, comprising:
a plurality of pixels, each including a photoelectric conversion unit and a charge accumulating unit that accumulates an electric charge from the photoelectric conversion unit; and
a connection unit that electrically connects the charge accumulating units which are respectively included in the plurality of pixels and that includes a plurality of linking units, the plurality of linking units corresponding to one of the charge accumulating units.

27. A solid-state image sensor, comprising:
a plurality of pixels, each including a photoelectric conversion unit and a charge accumulating unit that accumulates an electric charge from the photoelectric conversion unit;
a connection unit that is disposed between the charge accumulating units which are respectively included in the plurality of pixels and raises capacitance value at the charge accumulating unit by electrically connecting to the charge accumulating unit;
a control unit that disconnects the charge accumulating unit and the connection unit from each other so that the capacitance value is lowered on condition that quantity of the electric charge generated at the photoelectric conversion unit is first electric charge quantity and connects the charge accumulating unit and the connection unit with each other so that the capacitance value is raised on condition that the quantity of the electric charge generated at the photoelectric conversion unit is second electric charge quantity greater than the first electric charge quantity.

* * * * *